(12) United States Patent
Shinokawa et al.

(10) Patent No.: US 12,041,842 B2
(45) Date of Patent: Jul. 16, 2024

(54) DISPLAY PANEL PATTERNING DEVICE

(71) Applicant: JDI Design and Development G.K., Tokyo (JP)

(72) Inventors: Yasuharu Shinokawa, Tokyo (JP); Kenichi Nendai, Tokyo (JP); Shuhei Yada, Tokyo (JP); Jun Yamaguchi, Kanagawa (JP)

(73) Assignee: JDI DESIGN AND DEVELOPMENT G.K., Tokyo (JP)

( * ) Notice: Subject to any disclaimer, the term of this patent is extended or adjusted under 35 U.S.C. 154(b) by 1421 days.

(21) Appl. No.: 16/452,530

(22) Filed: Jun. 26, 2019

(65) Prior Publication Data

US 2020/0006661 A1 Jan. 2, 2020

(30) Foreign Application Priority Data

Jul. 2, 2018 (JP) .................................. 2018-125778
Jul. 9, 2018 (JP) .................................. 2018-130221
(Continued)

(51) Int. Cl.
*B23K 26/36* (2014.01)
*B23K 26/00* (2014.01)
(Continued)

(52) U.S. Cl.
CPC ....... *H10K 71/421* (2023.02); *B23K 26/0006* (2013.01); *B23K 26/06* (2013.01);
(Continued)

(58) Field of Classification Search
CPC .... H10K 71/421; H10K 71/00; H10K 71/231; H10K 50/16; H10K 50/824;
(Continued)

(56) References Cited

U.S. PATENT DOCUMENTS 5,443,922 A 8/1995 Nishizaki et al.
5,879,943 A 3/1999 Ando et al.
(Continued)

FOREIGN PATENT DOCUMENTS

JP H290169 A 3/1990
JP H5-163488 A 6/1993
(Continued)

*Primary Examiner* — Kiet T Nguyen
(74) *Attorney, Agent, or Firm* — HAUPTMAN HAM, LLP

(57) ABSTRACT

A patterning device performs patterning in manufacture of a display panel in which thin films including an organic film are laminated above a substrate. The patterning device includes a chamber, light transmissive plates, and a laser emitter. The chamber has a light transmissive window including a first light transmissive plate through which a laser beam is transmitted and accommodates a thin film laminated substrate. A second light transmissive plate through which the laser beam is transmitted is in the chamber between the first light transmissive plate and the thin film laminated substrate at a position spaced away from the thin film laminated substrate. The laser emitter is outside the chamber and emits the laser beam towards the thin film laminated substrate, through the first light transmissive plate and the second light transmissive plate, to irradiate and remove a portion of the thin film.

30 Claims, 42 Drawing Sheets

| (30) | Foreign Application Priority Data | |
|---|---|---|
| Jul. 10, 2018 | (JP) | 2018-130936 |
| Sep. 7, 2018 | (JP) | 2018-168349 |
| Sep. 7, 2018 | (JP) | 2018-168350 |

(51) Int. Cl.
| | |
|---|---|
| *B23K 26/06* | (2014.01) |
| *B23K 26/08* | (2014.01) |
| *B23K 26/12* | (2014.01) |
| *B23K 26/362* | (2014.01) |
| *B23K 26/364* | (2014.01) |
| *H10K 71/00* | (2023.01) |
| *H10K 71/20* | (2023.01) |
| *H10K 71/40* | (2023.01) |
| *B23K 103/00* | (2006.01) |

(52) U.S. Cl.
CPC ...... *B23K 26/0876* (2013.01); *B23K 26/1224* (2015.10); *B23K 26/123* (2013.01); *B23K 26/127* (2013.01); *B23K 26/36* (2013.01); *B23K 26/362* (2013.01); *B23K 26/364* (2015.10); *H10K 71/00* (2023.02); *H10K 71/231* (2023.02); *B23K 2103/30* (2018.08)

(58) Field of Classification Search
CPC ............ H10K 59/122; H10K 59/35; H10K 2102/3026; B23K 26/0006; B23K 26/06; B23K 26/0876; B23K 26/1224; B23K 26/123; B23K 26/127; B23K 26/36; B23K 26/362; B23K 26/364; B23K 26/066; B23K 26/402; B23K 26/70; B23K 26/351; B23K 2103/30; B23K 2101/36
USPC .................................................... 425/174.4
See application file for complete search history.

(56) References Cited

U.S. PATENT DOCUMENTS

| | | | |
|---|---|---|---|
| 6,100,010 | A | 8/2000 | Ina |
| 6,136,622 | A | 10/2000 | Fukuzawa et al. |
| 6,989,300 | B1 | 1/2006 | Tanabe |
| 10,943,785 | B2 * | 3/2021 | Ito .................. H01L 27/1285 |
| 2002/0011783 | A1 | 1/2002 | Hosokawa |
| 2003/0024905 | A1 * | 2/2003 | Tanaka ............ H01L 21/02488 |
| | | | 219/121.6 |
| 2004/0048075 | A1 | 3/2004 | Tominaga et al. |
| 2004/0253756 | A1 | 12/2004 | Cok et al. |
| 2004/0259387 | A1 * | 12/2004 | Yamazaki ......... B23K 26/0643 |
| | | | 438/795 |
| 2007/0080356 | A1 | 4/2007 | Nakayama et al. |
| 2008/0070393 | A1 | 3/2008 | Miyairi et al. |
| 2008/0210675 | A1 | 9/2008 | Sasaki et al. |
| 2008/0287028 | A1 | 11/2008 | Ozawa |
| 2009/0117703 | A1 | 5/2009 | Yamazaki |
| 2009/0279179 | A1 * | 11/2009 | Tanaka ................ C23C 14/28 |
| | | | 427/595 |
| 2011/0031476 | A1 | 2/2011 | Oda et al. |
| 2013/0002793 | A1 | 1/2013 | Kim |
| 2015/0102294 | A1 | 4/2015 | Choi et al. |
| 2016/0190453 | A1 | 6/2016 | Nirengi et al. |
| 2016/0204389 | A1 | 7/2016 | Nirengi et al. |
| 2016/0211488 | A1 | 7/2016 | Nirengi et al. |
| 2017/0110530 | A1 | 4/2017 | Lee et al. |
| 2018/0166511 | A1 | 6/2018 | Niboshi et al. |
| 2020/0111846 | A1 | 4/2020 | Takahara et al. |

FOREIGN PATENT DOCUMENTS

| | | |
|---|---|---|
| JP | H8-86752 A | 4/1996 |
| JP | H9-40499 A | 2/1997 |
| JP | H11162639 A | 6/1999 |
| JP | H11-237745 A | 8/1999 |
| JP | 200128440 A | 1/2001 |
| JP | 2001-230086 A | 8/2001 |
| JP | 2001244073 A | 9/2001 |
| JP | 2002-124380 A | 4/2002 |
| JP | 2002-164167 A | 6/2002 |
| JP | 2003245791 A | 9/2003 |
| JP | 2004-20822 A | 1/2004 |
| JP | 200447128 A | 2/2004 |
| JP | 2005-11810 A | 1/2005 |
| JP | 2006-286493 A | 10/2006 |
| JP | 2007-52966 A | 3/2007 |
| JP | 2007-103098 A | 4/2007 |
| JP | 2007-252974 A | 10/2007 |
| JP | 200878634 A | 4/2008 |
| JP | 2008114252 A | 5/2008 |
| JP | 2008-288074 A | 11/2008 |
| JP | 2008288075 A | 11/2008 |
| JP | 2009135469 A | 6/2009 |
| JP | 2011-34917 A | 2/2011 |
| JP | 201190925 A | 5/2011 |
| JP | 201316480 A | 1/2013 |
| JP | 201546392 A | 3/2015 |
| JP | 201550051 A | 3/2015 |
| JP | 201565160 A | 4/2015 |
| JP | 201579746 A | 4/2015 |
| JP | 2017-123342 A | 7/2017 |
| KR | 101718716 B1 | 3/2017 |
| WO | 2017010488 A1 | 1/2017 |
| WO | 2018181049 A1 | 10/2018 |

* cited by examiner

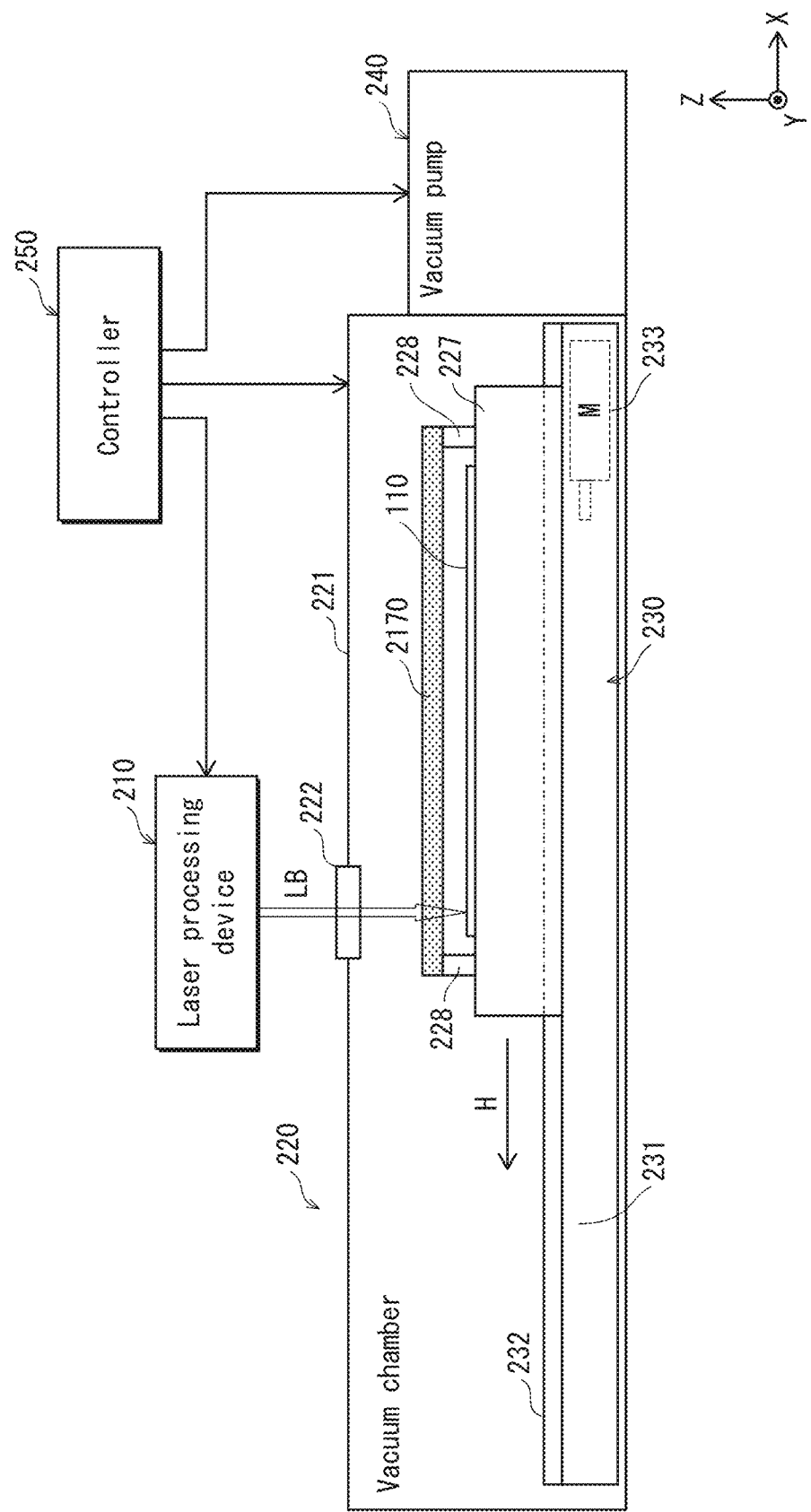

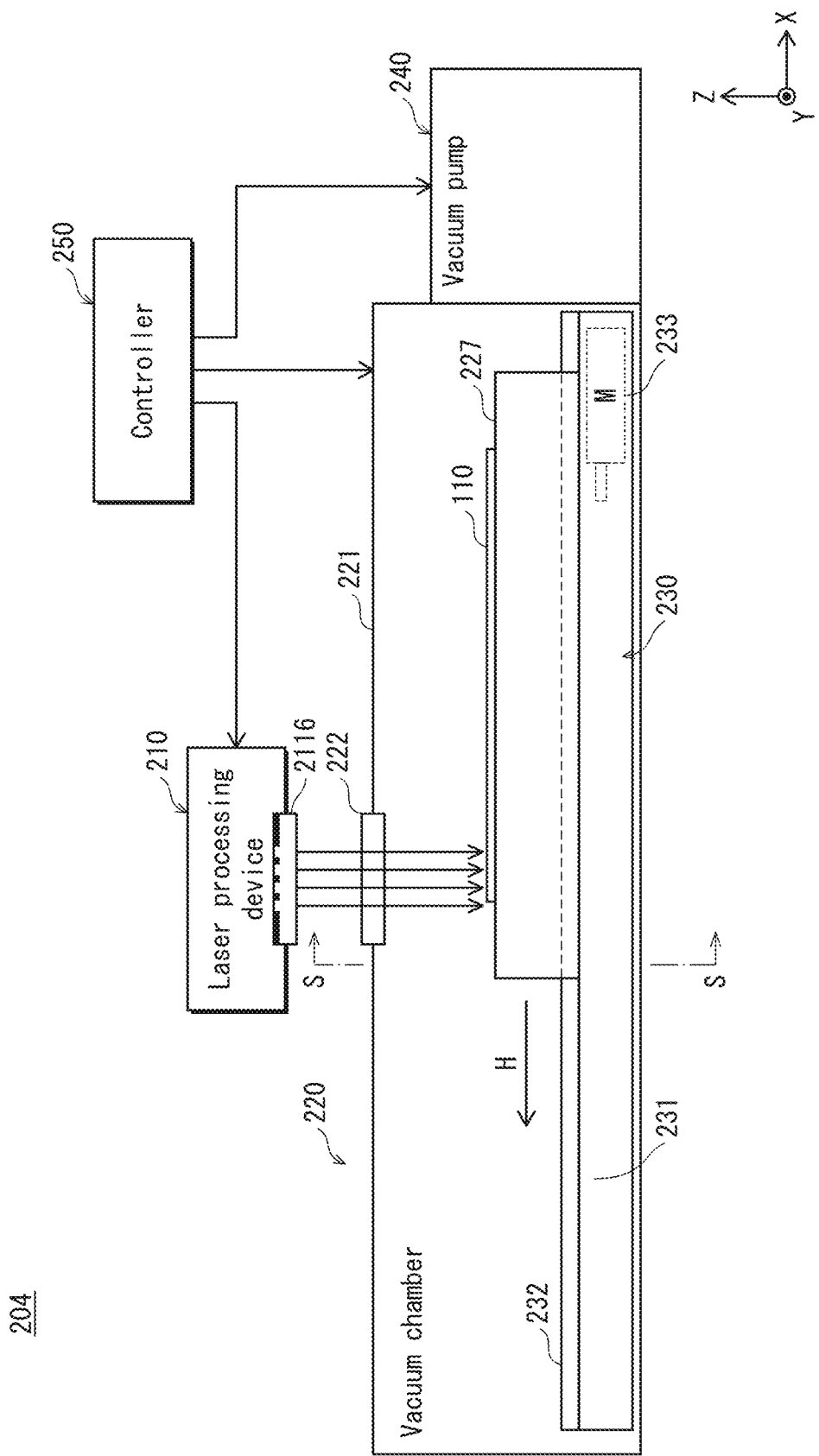

FIG. 41A
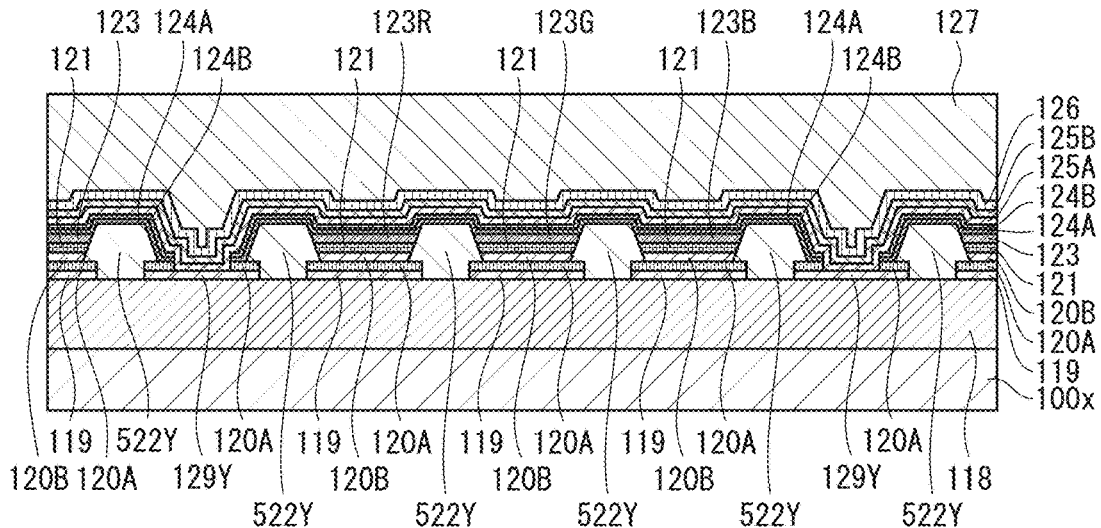
FIG. 41B
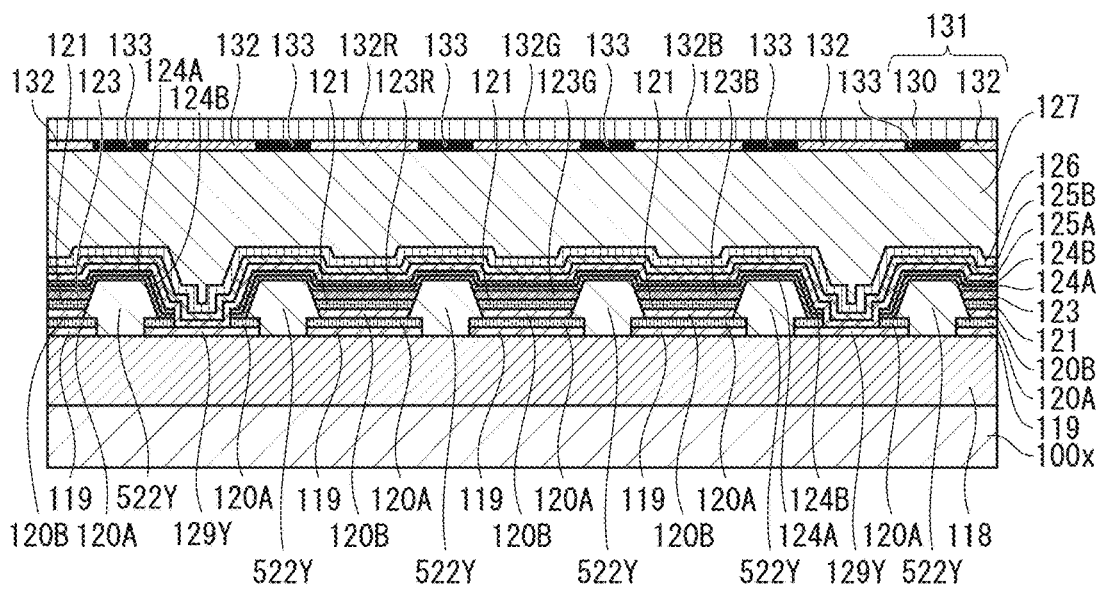
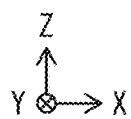

DISPLAY PANEL PATTERNING DEVICE

This application claims priority to Japanese Patent Application No. 2018-125778 filed Jul. 2, 2018, Japanese Patent Application No. 2018-130221 filed Jul. 9, 2018, Japanese Patent Application No. 2018-130936 filed Jul. 10, 2018, Japanese Patent Application No. 2018-168349 filed Sep. 7, 2018, and Japanese Patent Application No. 2018-168350 filed Sep. 7, 2018, the contents of which are hereby incorporated by reference in their entirety.

BACKGROUND

1) Technical Field

The present disclosure relates to devices for patterning in manufacturing a display panel in which a plurality of thin films, including an organic film, are laminated on a substrate, and in particular to thin film patterning technology.

2) Description of Related Art

In recent years, organic electroluminescence (EL) display panels in which organic EL elements are arranged in a matrix on a substrate have been put to practical use as display panels used in display devices such as televisions.

Typically, in an organic EL display panel, light emitting layers of adjacent organic EL elements are partitioned by a bank made of an insulating material, and in a color display organic EL display panel, each sub pixel is formed from an organic EL element that emits red (R), green (G), or blue (B) light, and a set of adjacent RGB sub pixels form a unit pixel in the color display.

Each organic EL element is formed by laminating a plurality of thin films, including an organic light emitting layer, between a pair of electrodes, and when driven, a voltage is applied across the pair of electrodes, and holes and electrons injected to the light emitting layer recombine so as to cause light emission.

Usually, a process of patterning a specified thin film is included in a process of manufacturing such an organic EL display panel. According to a conventional method of patterning a thin film, patterning is performed by removing an unnecessary portion of the thin film, for example by a photolithography method in which etching is performed after forming a patterned resist mask on the thin film.

However, according to conventional patterning methods, many steps are necessary such as forming a resist film, exposing the resist film to light with use of a photomask, developing the exposed resist film, removing the unnecessary portion of the thin film through etching, removing the resist film after etching, washing after removal, and the like, which makes it very difficult to shorten the takt time and reduce manufacturing costs. Such a technical problem is not limited to organic EL display panels, but also exists in manufacture of other display panels in which a plurality of thin films including an organic film are laminated.

As another patterning method, scanning a laser beam to remove an unnecessary portion of a thin film through sublimation has been proposed. According to such a method, it is possible to eliminate photolithography steps such as mask formation and cleaning.

SUMMARY

The present disclosure aims to provide description of manufacturing of a high quality display panel for which patterning or trimming of a thin film using a laser beam is performed, while simplifying the manufacturing process.

A patterning device pertaining to at least one embodiment of the present disclosure is a patterning device performing patterning in manufacture of a display panel in which thin films including an organic film are laminated above a substrate. The patterning device comprises a chamber, first and second light transmissive plates, and a laser emitter. The chamber has a light transmissive window including the first light transmissive plate through which a laser beam is transmitted, the chamber accommodating a thin film laminated substrate on which a thin film is laminated. The second light transmissive plate through which the laser beam is transmitted is disposed in the chamber between the first light transmissive plate and the thin film laminated substrate at a position spaced away from the thin film laminated substrate. The laser emitter is disposed outside the chamber and emits the laser beam towards the thin film laminated substrate, through the first light transmissive plate and the second light transmissive plate, to irradiate and remove a portion of the thin film.

A patterning device pertaining to at least one embodiment of the present disclosure is a patterning device performing patterning in manufacture of a display panel in which thin films including an organic film are laminated above a substrate. The patterning device comprises a chamber, a laser emitter, and a substrate mover. The chamber has a light transmissive window including a light transmissive plate through which a laser beam is transmitted, the chamber accommodating a thin film laminated substrate such that a main surface of the thin film laminated substrate on which a thin film is laminated faces the light transmissive plate. The laser emitter is disposed outside the chamber and emits the laser beam towards the thin film laminated substrate, through the light transmissive plate, to irradiate and remove a portion of the thin film. The substrate mover moves the thin film laminated substrate in the chamber. An area of the light transmissive window is smaller than a processing target range of the thin film laminated substrate that undergoes removal processing by the laser beam irradiation. The substrate mover moves the thin film laminated substrate such that the processing target range can be irradiated by the laser beam via the light transmissive window.

A patterning device pertaining to at least one embodiment of the present disclosure is a patterning device performing patterning in manufacture of a display panel in which thin films including an organic film are laminated above a substrate. The patterning device comprises a chamber, an environment adjuster, a patterning mask, and a laser emitter. The chamber has a light transmissive window including a light transmissive plate through which a laser beam is transmitted, the chamber accommodating a thin film laminated substrate on which a thin film is laminated. The environment adjuster adjusts an environment in the chamber to a vacuum or inert gas environment. The patterning mask is disposed in the chamber between the light transmissive plate and the thin film laminated substrate. The laser emitter is disposed outside the chamber and emits the laser beam towards the thin film laminated substrate, through the light transmissive plate and the patterning mask, to irradiate and remove a portion of the thin film.

A patterning device pertaining to at least one embodiment of the present disclosure is a patterning device performing patterning in manufacture of a display panel in which thin films including an organic film are laminated above a substrate. The patterning device comprises a chamber, an environment adjuster, and a laser emitter. The chamber has a light transmissive window including a light transmissive plate through which a plurality of laser beams are transmitted, the chamber accommodating a thin film laminated substrate such that a main surface of the thin film laminated substrate on which a thin film is laminated faces the light transmissive plate. The environment adjuster adjusts an environment in the chamber to a vacuum or inert gas environment. The laser emitter is disposed outside the chamber and emits the plurality of laser beams towards the thin film laminated substrate, through the light transmissive plate, to irradiate and remove a portion of the thin film. The laser emitter comprises a laser beam source that generates an excimer laser beam, and a mask disposed in a path of the excimer laser beam emitted from the laser beam source, the mask having a plurality of light transmissive portions. Transmittance of the excimer laser beam through the plurality of light transmissive portions of the mask results in the plurality of laser beams being emitted from the mask.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 27 is a schematic side-view diagram illustrating an example of a thin film patterning device pertaining to Embodiment 3.

FIG. 29 is a schematic side-view diagram illustrating structure of a thin film patterning device pertaining to Embodiment 4, which is an embodiment of the present disclosure.

FIG. 41A and FIG. 41B are schematic cross-section diagrams illustrating the organic EL display panel manufacturing process continuing from FIG. 39C.

DETAILED DESCRIPTION

(I) Embodiment 1

Background to Embodiment 1 of Present Disclosure

An organic EL display panel has a laminated structure in which a pixel electrode, an organic layer (including a light emitting layer), and a common electrode are laminated in this order on a substrate. In many cases, the common electrode is formed over an entirety of an image display region on the substrate.

In particular, in a top emission type of organic EL display panel, a light transmissive material is used for the common electrode, and therefore electrical resistance is high, voltage drop varies depending on distance of each organic EL element from a power supply portion (not illustrated) disposed at a peripheral portion of the substrate, and as a result, there is a risk that variation in luminescence may occur in the display.

In order to avoid such variance in luminescence, auxiliary electrodes made of an electrically conductive material such as a metal are disposed on the substrate, and by electrically connecting the auxiliary electrodes and the common electrode, voltage drop in the common electrode is suppressed.

FIG. 1A to FIG. 1D are schematic cross-section diagrams schematically illustrating a portion of an example organic EL display panel manufacturing process in which auxiliary electrodes are formed in the same layer as pixel electrodes.

Figure 1A:
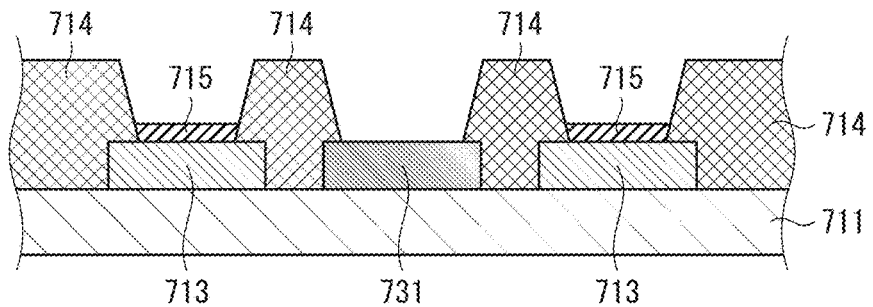
FIG. 1A to FIG. 1D are partial cross-section diagrams schematically illustrating a portion of an organic EL element manufacturing process, for the purpose of explaining a background of Embodiment 1, which is an embodiment of the present disclosure.

As illustrated in FIG. 1A, a pixel electrode 713 is formed for each sub pixel of an organic EL element on a substrate 711, an auxiliary electrode 731 is formed that extends in a Y-axis direction, and a light emitting layer 715 partitioned by banks 714 is disposed above the pixel electrode 713.

Figure 1B:
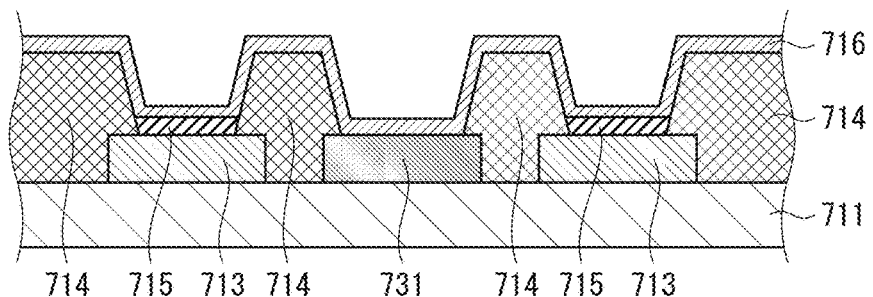
Figure 1C:
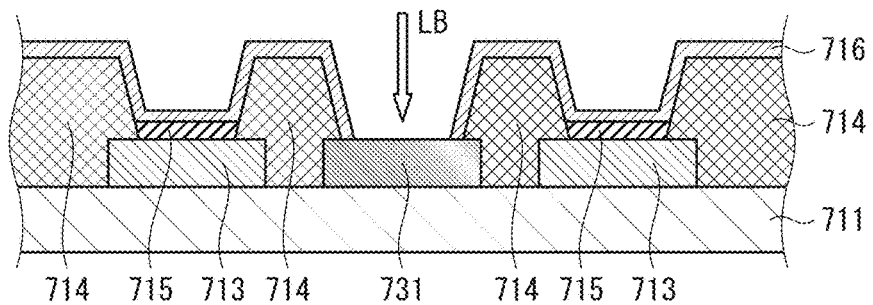

Subsequently, an electron transport layer 716 is formed to be continuous across the banks 714, the light emitting layers 715, and the auxiliary electrodes 731 (FIG. 1B). Subsequently, a process is performed of removing the electron transport layer 716 on the auxiliary electrode 731 to form a contact opening for connection to a common electrode, but as described above, a patterning method combining photolithography and etching inevitably increases takt time and manufacturing costs, and therefore the inventors of the present application considered adopting a method of scanning a laser beam to sublimate and remove the electron transport layer 716 on the auxiliary electrode 731 (also referred to as "laser patterning method") (see FIG. 1C).

Figure 1D:
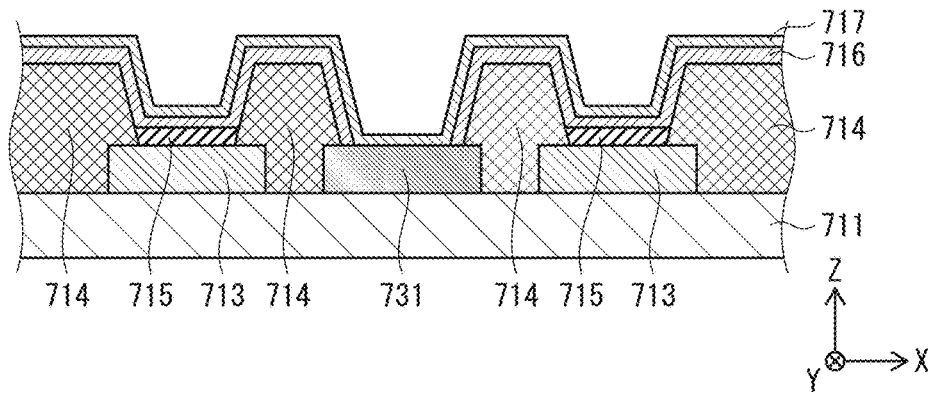

When the common electrode 717 is laminated after the contact opening is formed, the common electrode 717 and the auxiliary electrode 731 are in direct contact with each other, and therefore voltage drop in the common electrode 717 is greatly suppressed, and occurrence of luminance unevenness and the like can be prevented (FIG. 1D).

It is known that properties of various organic materials forming an organic EL display panel deteriorate due to the influence of oxygen and moisture in air, and therefore the laser patterning method described above is beneficially performed in a vacuum.

Figure 2:
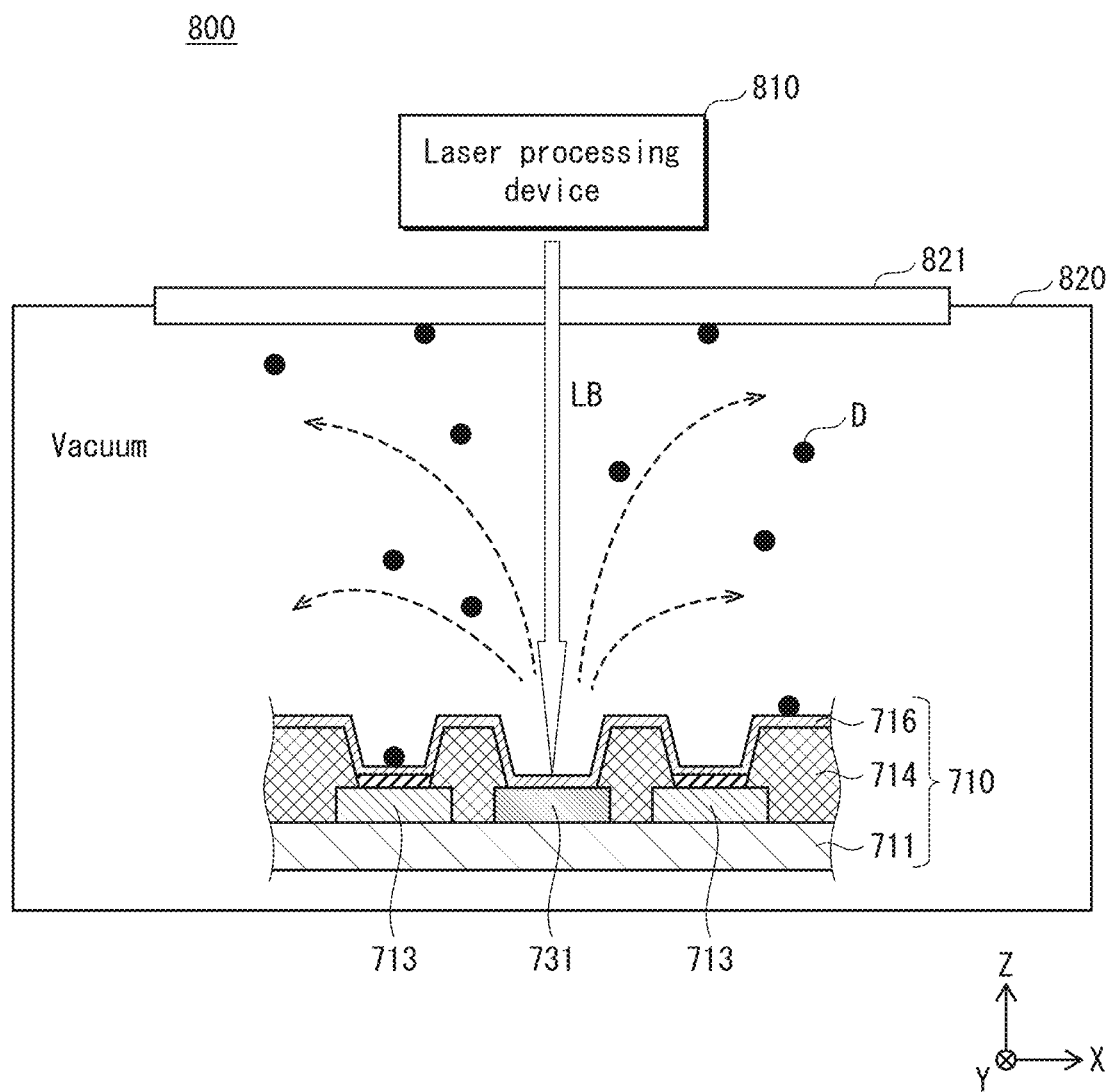
FIG. 2 is a schematic diagram of a thin film patterning device assumed to be used when implementing the manufacturing process illustrated in FIG. 1A to FIG. 1D.

FIG. 2 is a schematic diagram illustrating a structure of a patterning device 800 that can be posited as an example for such a case.

As illustrated in FIG. 2, the patterning device 800 includes a laser processing device 810 and a vacuum chamber 820 including window glass 821 positioned facing the laser processing device 810. The laser processing device 810 includes a laser head (not illustrated) that emits a laser beam and can scan the laser beam by moving the laser head in the X axis direction and the Y axis direction of FIG. 2.

An intermediate product 710 of the organic EL display panel formed as far as the electron transport layer 716 on the substrate 711 is conveyed into the vacuum chamber 820, which is depressurized by a vacuum pump (not illustrated) to create a vacuum. A laser beam LB is emitted by the laser processing device 810, transmitted through the window glass 821, and sublimates/removes the electron transport layer 716 on the auxiliary electrode 731.

However, with an apparatus such as the patterning device 800, it was found that processing accuracy deteriorates and a completed organic EL display panel may have variations in durability and variations in light emission efficiency for each organic EL element.

That is, a resin material constituting the election transport layer 716 is sublimated by the laser beam and scatters in the vacuum chamber 820, but scattered material (debris) D contacts and solidifies on the window glass 821, adhering to the window glass 821, lowering transmittance of the laser beam LB through the window glass 821, deteriorating processing precision, and in a worst case making processing impossible.

Further, debris that does not reach the window glass 821 eventually falls down and adheres to a surface of the electron transport layer 716. When such foreign matter remains on the electron transport layer 716, there is a risk of defects being generated in the common electrode 717 and sealing layer subsequently laminated, allowing moisture or the like to intrude from outside, which may result in deterioration of light emission properties of an organic EL element and dark spot occurrence.

In order to solve such a technical problem, the following patterning method is described in Japanese Patent Application Publication No. 2008-288074 (hereinafter referred to as "Patent Document 1").

Figure 3A:
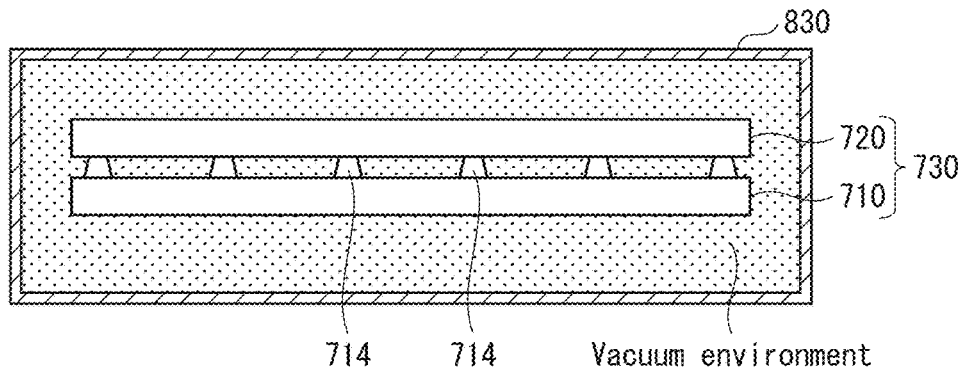
FIG. 3A and FIG. 3B are diagrams for explaining a thin film patterning method pertaining to conventional technology.
Figure 3B:
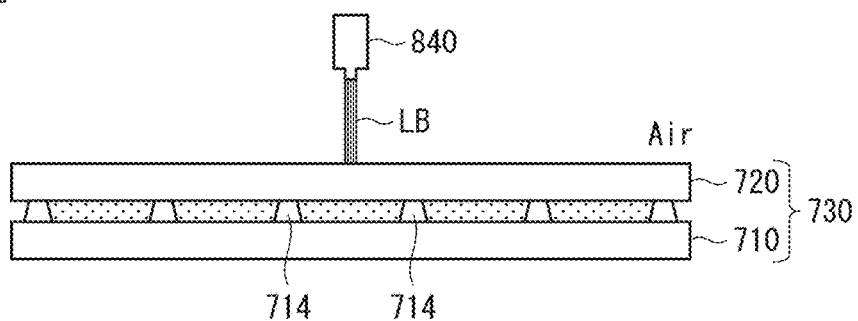

FIG. 3A and FIG. 3B are diagrams schematically illustrating a patterning method described in Patent Document 1.

First, as illustrated in FIG. 3A, a light transmissive substrate 720 made of glass or the like is brought into close contact with the intermediate product 710 of an organic EL display panel in a vacuum in the vacuum chamber 830, forming a combined substrate 730. After removing the combined substrate 730 from the vacuum chamber 830, patterning is performed by irradiation of the laser beam LB by a laser head 840 of the laser processing device 810 in air, as illustrated in FIG. 3B.

Figure 4:
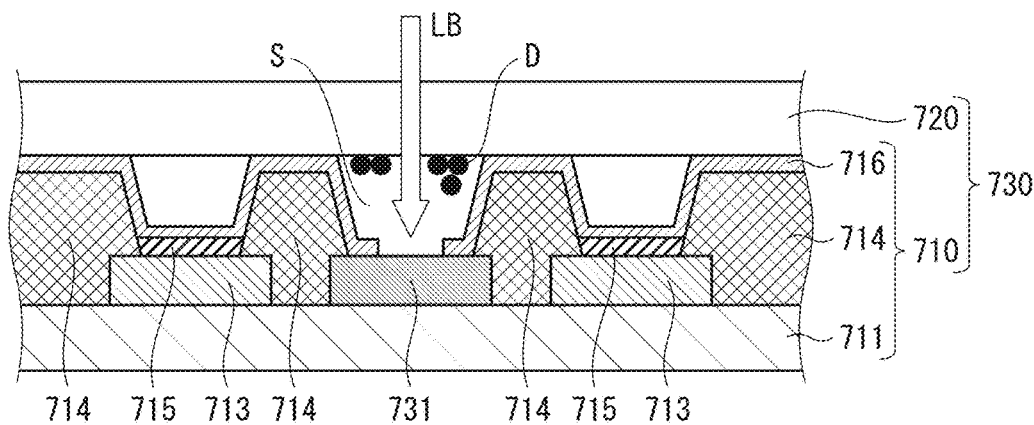
FIG. 4 is a schematic cross-section diagram illustrating an enlargement from FIG. 3B.

FIG. 4 is an enlarged cross section diagram of the intermediate product 710 of the organic EL display panel illustrating how the electron transport layer 716 on the auxiliary electrode 731 is removed by the laser beam LB. According to Patent Document 1, debris D sublimed by the laser beam LB is supposed to all adhere to the light transmissive substrate 720 and not to other organic EL elements or the auxiliary electrode 731.

However, according to the method described in Patent Document 1, extra steps are required of forming the combined substrate 730 in the vacuum chamber 830, unloading the combined substrate 730 from the vacuum chamber 830, and after patterning, peeling the light transmissive substrate 720 from the intermediate product 710. In particular, in peeling off the light transmissive substrate 720, there is a risk of damaging the bank 714, causing quality deterioration.

Further, a cross-section of a space S surrounded by the auxiliary electrode 731, the banks 714, and the light transmissive substrate 720 is actually a minute space having a width of about 40 µm and height of about 1 µm, and therefore sublimated debris instantly fills the minute space S and there is a possibility that the debris re-adheres to the auxiliary electrode 731 without completely adhering to the light transmissive substrate 720.

Japanese Patent Application Publication No. 2017-123342 describes a patterning method having substantially the same content as Patent Document 1 and suffering from the same problem.

The inventors of the present application conducted extensive research into a laser patterning method for thin film patterning that reduces manufacturing time and cost while mitigating adverse effects of debris generated at the time of patterning and making manufacture of a high quality organic EL display possible, and arrived at Embodiment 1 of the present disclosure.

Embodiment 1

Hereinafter, an organic EL display panel patterning device and patterning method pertaining to Embodiment 1, which is an embodiment of the present disclosure, are described with reference to the drawings. For convenience of explanation, drawings may be schematic, and are not necessarily to scale.

1. Structure of Thin Film Patterning Device 200

Figure 5:
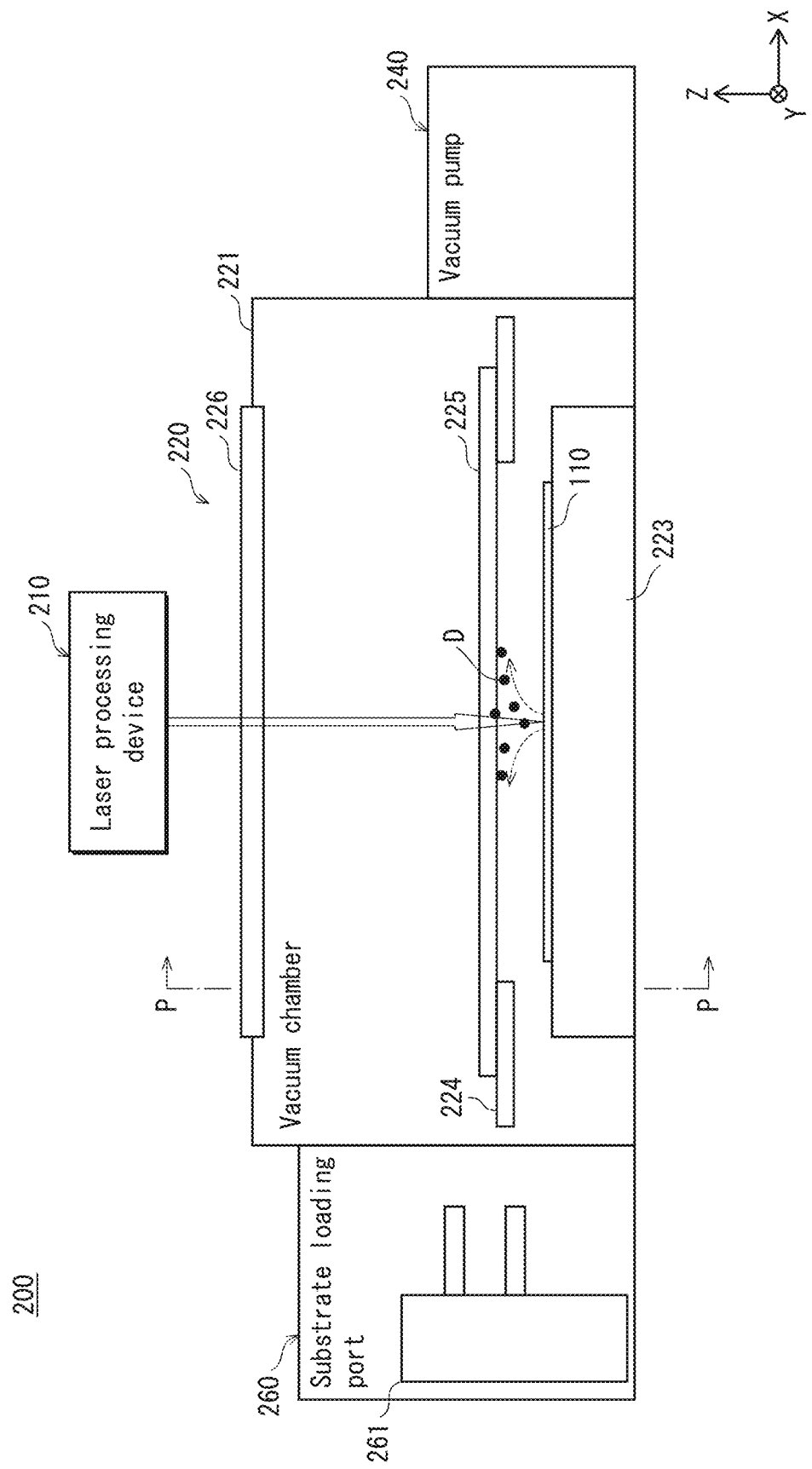
FIG. 5 is a schematic diagram illustrating structure of a thin film patterning device pertaining to Embodiment 1, which is an embodiment of the present disclosure.
Figure 6:
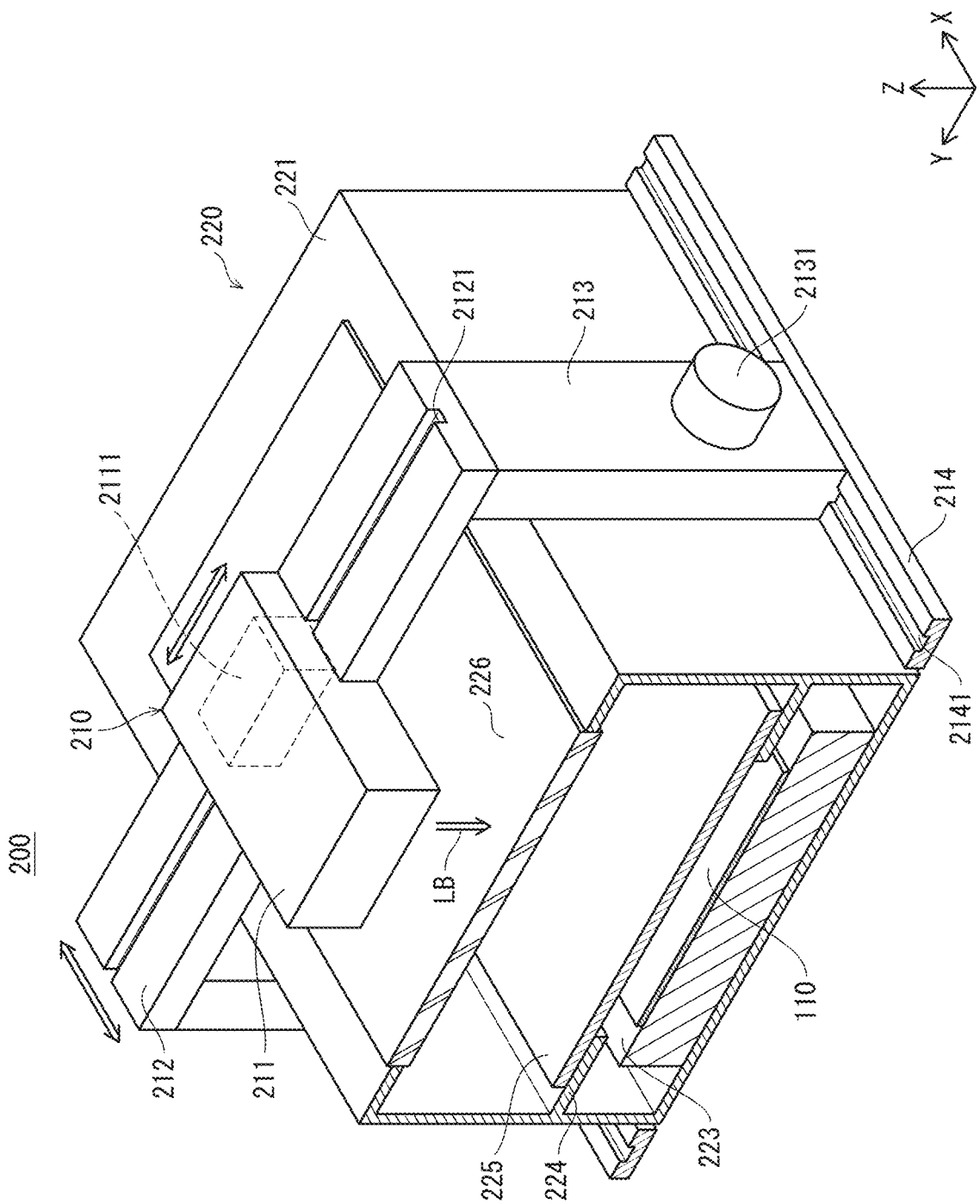
FIG. 6 is a perspective diagram of the thin film patterning device of FIG. 5, cut along a plane passing through a line P-P in FIG. 5.

FIG. 5 is a schematic diagram illustrating structure of a thin film patterning device 200 pertaining to Embodiment 1. FIG. 6 is a perspective diagram of the thin film patterning device 200, cut along a plane passing through a line P-P in FIG. 5.

As illustrated in FIG. 5, the thin film patterning device 200 includes a laser processing device 210 (laser emitter) that scans a laser beam to remove an unnecessary portion of a thin film formed on a substrate, a chamber unit 220 that houses the substrate on which the thin film to be processed is formed (intermediate product of organic EL panel 10; also referred to as "thin film laminated substrate 110"), a vacuum pump 240 that evacuates an interior of the chamber unit 220 to a vacuum state, and a substrate loading port 260 for loading the thin film laminated substrate 110 into the chamber unit 220.

As illustrated in the perspective diagram of FIG. 6, the laser processing device 210 includes a laser head 211 incorporating a laser beam source and an optical system for convergence of a laser beam, a horizontal gantry 212 that holds the laser head 211 while allowing sliding in a direction parallel to the Y axis, a pair of legs 213 that hold the horizontal gantry 212 at both end portions thereof in a longitudinal direction thereof, and a pair of guide rails 214 that extend in the X axis direction and are disposed under the legs 213.

An example of the laser beam source in the laser head 211 is a yttrium aluminum garnet (YAG) laser, but the laser beam source is not limited to this and may be any laser beam source that can generate a laser beam in a wavelength absorbed by a thin film to be processed.

Further, inside the casing of the laser head 211 is a drive source, for example a linear motor 2111, and through control of the drive source, the laser head 211 moves along a guide groove 2121 of the horizontal gantry 212 in the Y axis direction.

A drive source is provided in each of the legs 213, for example a servomotor 2131, and the legs 213 are synchronously driven through a known drive mechanism such as a screw feed mechanism or wire drive mechanism to move in the X axis direction along guide grooves 2141 of the guide rails 214.

A controller (not illustrated) controls output of the laser beam source of the laser head 211 and controls drive of the linear motor 2111 and the servomotors 2131 so that a laser beam emitted from the laser head 211 scans a position to be processed of the thin film laminated substrate 110 to perform laser processing.

Returning to FIG. 5, a vacuum chamber 221 of the chamber unit 220 has an opening on a top surface thereof and a plate-like window glass 226 (first light-transmissive plate) is airtightly mounted in the opening by a sealing member (not illustrated).

A table 223 that has a top surface parallel to a main face of the window glass 226 is installed at a lower portion of the vacuum chamber 221, and the thin film laminated substrate 110 is placed on the table 223 with a surface to be processed facing upward, thereby keeping the window glass 226 and the thin film laminated substrate 110 parallel to each other.

A plate-shaped cover glass 225 (second light-transmissive plate) is disposed between the window glass 226 and the table 223 on which the thin film laminated substrate 110 is placed, at a position a defined distance apart from the thin film laminated substrate 110. The cover glass 225 is placed on supporting plates 224 provided at four positions inside the vacuum chamber 221 such that a main surface of the cover glass 225 is parallel to the main surface of the window glass 226.

As a result, the window glass 226, the cover glass 225, and the thin film laminated substrate 110 are all parallel to each other, and therefore the laser beam LB emitted from the laser head 211 perpendicular to the main surface of the window glass 226 can accurately irradiate a target position of the thin film to be processed without risk of shifting of an optical axis of the laser beam LB due to refraction in transmission through the window glass 226 and the cover glass 225.

As material of the window glass 226 and the cover glass 225, it is beneficial to use quartz glass having a wide wavelength range of transmitted laser light and excellent durability. It is beneficial that the window glass 226 and the cover glass 225 have sufficient thickness (rigidity) that central portions thereof do not bend under their own weight. In particular, the window glass 226 is subjected to atmospheric pressure from outside due to decompression inside the vacuum chamber 221, and therefore it is beneficial that the window glass 226 be thicker than the cover glass 225 in order to maintain flatness.

Further, size, shape and relative positions in a horizontal plane (X-Y plane) of the window glass 226 and the cover glass 225 are set such that when viewed from above (that is, when viewed from a direction of laser beam emission (negative direction along the Z axis)), positions to be laser processed of the thin film laminated substrate 110 are all in a range coinciding with light transmissive regions of the window glass 226 and the cover glass 225 (that is, portions thereof excluding peripheral portions where the glass is held).

The thin film laminated substrate 110 on which the thin film to be processed is formed in a device (for example, a vacuum deposition device) at a stage prior to the thin film patterning device 200 is placed on a predetermined position on the table 223 in the vacuum chamber 221 by a substrate transport robot 261 in a substrate loading port 260 (illustrated at reduced scale in FIG. 5).

Then the interior of the vacuum chamber 221 is depressurized to a vacuum by the vacuum pump 240. According to the present embodiment, a high vacuum at $10^{-3}$ Pa to $10^{-5}$ Pa, for example, is beneficial in order to prevent degradation of properties of the organic EL panel 10.

A controller (not illustrated) of the laser processing device 210 causes the laser head 211 to be moved to a reference position (home position) and subsequently causes patterning of the thin film laminated substrate 110 through laser beam emission, based on a program (pattern data) stored in advance in internal storage memory, at a laser output and scanning speed that selectively removes only the thin film to be processed.

A component of the thin film is sublimed by laser beam irradiation and debris D is scattered, but the debris D contacts, is cooled by, and solidifies on the cover glass 225 that is spaced away from the thin film, and most of the debris D adheres to a bottom surface of the cover glass 225.

Effect (a): the cover glass 225 is spaced apart from a top surface of the thin film laminated substrate 110, and therefore scattered debris scatters out from a space between the banks 14 of the thin film laminated substrate 110, and the situation illustrated in FIG. 4 does not occur, in which the debris D fills a tiny space S and reattaches to the auxiliary electrode 731, which is a lowest layer in the space S.

Effect (b): the cover glass 225 is installed at a position closer to the thin film laminated substrate 110 than the window glass 226, and therefore the situation illustrated in FIG. 2 can be prevented, in which a portion of the debris D does not reach the window glass 821, falls down, and reattaches to the substrate.

In order to fully exhibit the effects (a) and (b), it is beneficial that a distance between the cover glass 225 and the thin film laminated substrate is from 1 mm to 500 mm.

If the distance is less than 1 mm, space for scattering is limited and there is a risk of debris not scattering from a space between the banks 14 of the thin film laminated substrate 110, and if the distance is greater than 500 mm, it is possible that some debris does not reach the cover glass 225, falls down, and reattaches to the thin film laminated substrate 110.

In order to more effectively prevent the debris D from leaking into a space above the cover glass 225 and adhering to the window glass 226, it is beneficial that a surface area of the cover glass 225 be larger than a surface area of the window glass 226, and further that spaces above and below the cover glass 225 are almost completely separated by the cover glass 225 and the supporting plates 224.

After patterning processing is complete, the thin film laminated substrate 110 and the cover glass 225 are removed from the vacuum chamber 221 by the substrate transport robot 231, and while the thin film laminated substrate 110 is transported to a next processing device, the cover glass 225 is transported to a collection location, then washed for reuse or disposed of. When a next thin film laminated substrate 110 is transported into the vacuum chamber 221, a new cover glass 225 is also installed.

The cover glass 225 may be exchanged each time the thin film laminated substrate 110 is patterned, or may be periodically exchanged after patterning processing of N (where N is an integer and two or more) thin film laminated substrates 110. In the latter case, the value of N is an appropriate value such that exchanging occurs before debris adhesion to the cover glass 225 causes transmittance of laser light to deteriorate beyond an allowable range, and the value may be determined in advance by experiment or the like.

2. Overall Structure of Organic EL Display Device 100

Figure 7:
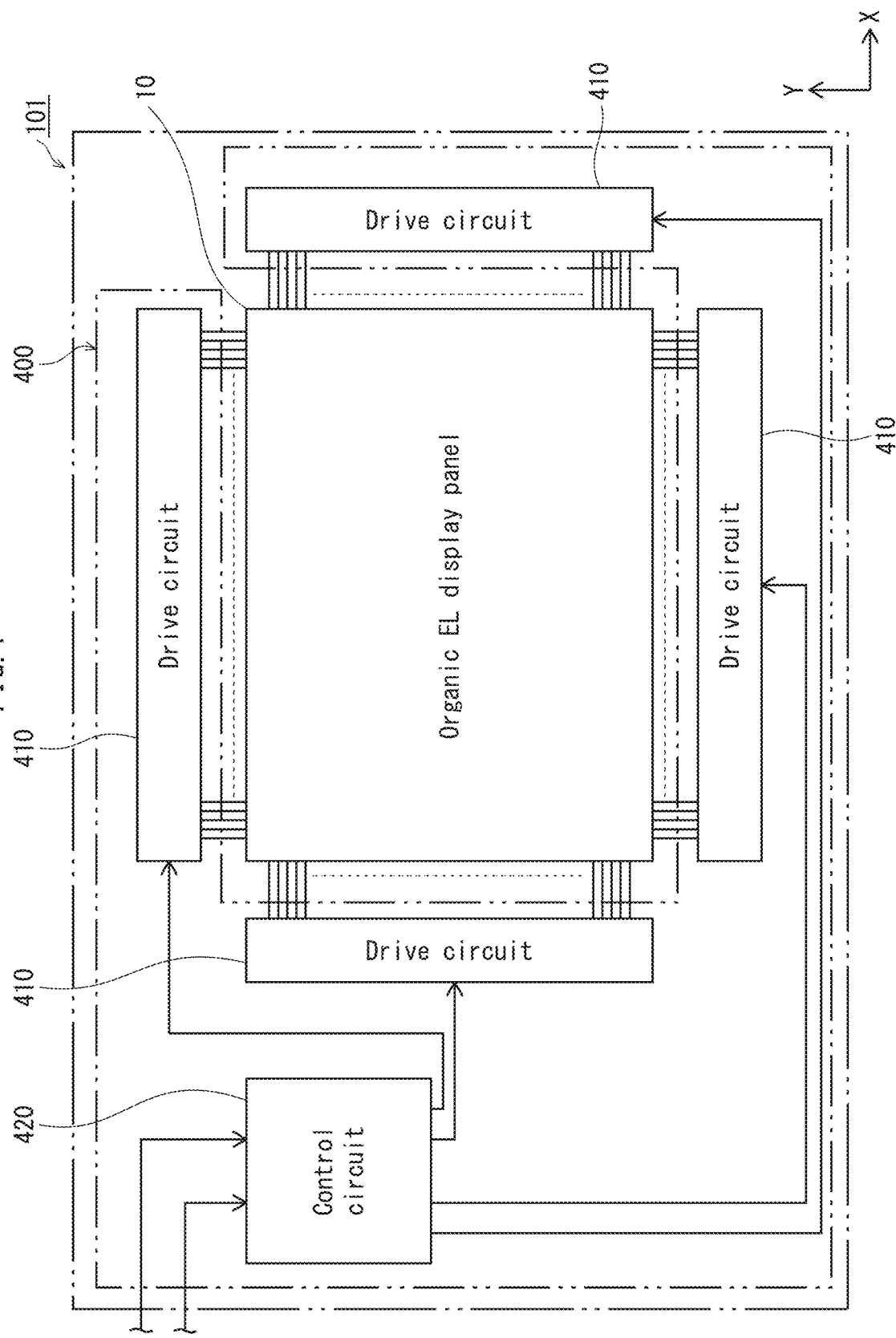
FIG. 7 is a block diagram illustrating an overall structure of an organic EL display device.

FIG. 7 is a block diagram illustrating an overall structure of an organic EL display device 100 including the organic EL panel 10 formed by an organic EL display panel manufacturing device that includes the thin film patterning device 200.

The organic EL display device 100 is a display device used for, for example, a television, a personal computer, a mobile terminal, a commercial display (electronic signboard, large screen for a commercial facility), or the like.

The organic EL display device 100 includes the organic EL panel 10 and a drive controller 400 electrically connected thereto.

According to the present embodiment, the organic EL panel 10 is a top emission type display panel, a top surface of which is a rectangular image display surface. In the organic EL panel 10, a plurality of organic EL elements (not illustrated) are arranged along the image display surface, and an image is displayed by combining light emission of the organic EL elements. As an example, the organic EL panel 10 employs an active matrix system.

The drive controller 400 includes drive circuits 410 connected to the organic EL panel 10 and a control circuit 420 connected to an external device such as a computer or a signal receiver such as an antenna. The drive circuits 410 include a power supply circuit supplying electric power to each organic EL element, a signal circuit for applying a voltage signal for controlling the electric power supplied to each organic EL element, a scanning circuit for switching a position to which the voltage signal is applied at regular intervals, and the like.

The control circuit 420 controls operations of the drive circuits 410 according to data including image information input from the external device or the signal receiver.

In FIG. 7, as an example, four of the drive circuits 410 are disposed around the organic EL panel 10, but structure of the drive controller 400 is not limited to this example, and the number and position of the drive circuits 410 may be modified as appropriate. For the sake of explanation, as illustrated in FIG. 7, a direction along a long edge of a top surface of the organic EL panel 10 is referred to as an X direction and a direction along a short edge of the top surface of the organic EL panel 10 is referred to as a Y direction.

3. Structure of Organic EL Panel 10

(A) Plan View Structure

Figure 8:
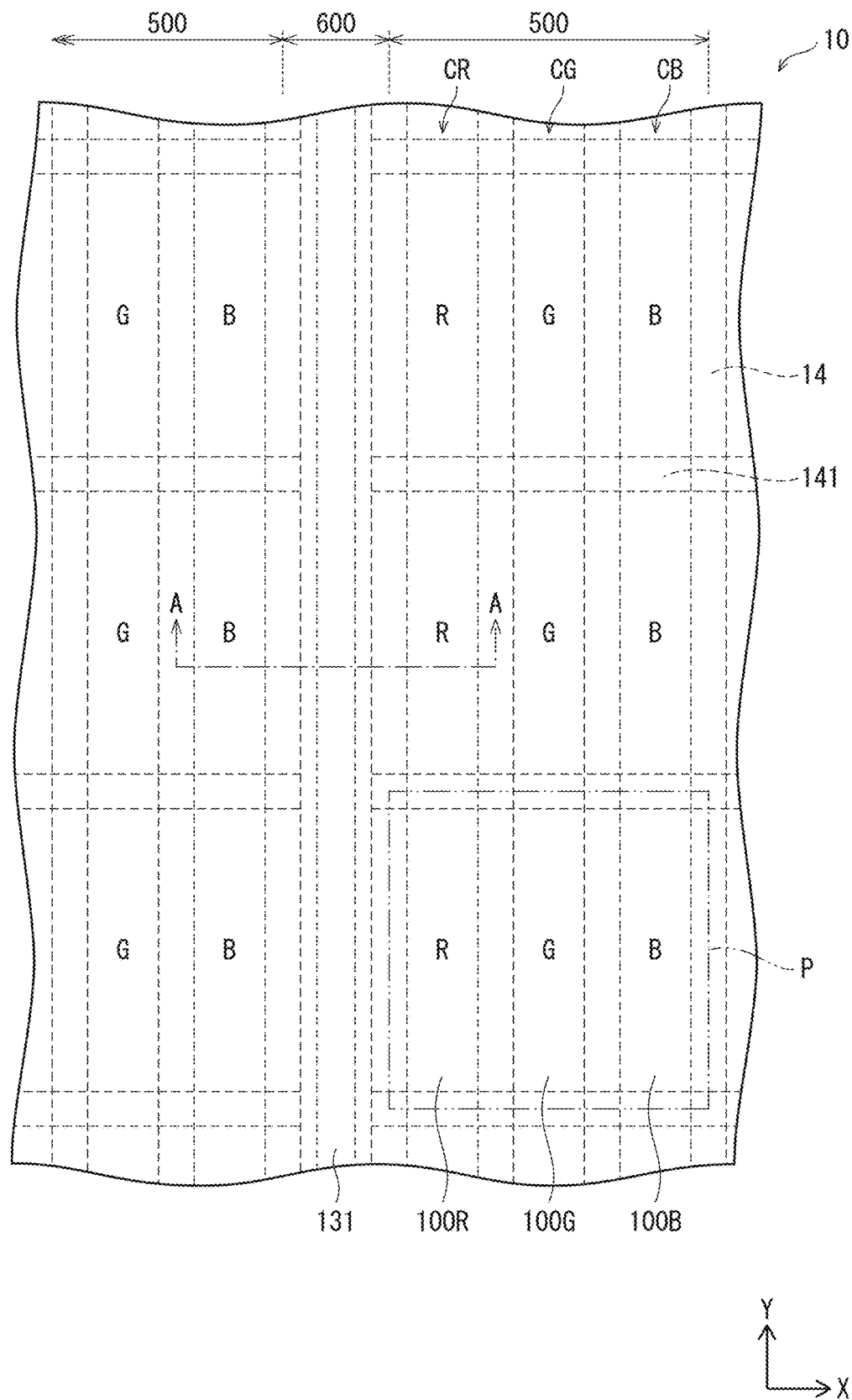
FIG. 8 is a schematic plan view diagram enlargement of a portion of an image display surface of an organic EL display panel of the organic EL display device of FIG. 7.

FIG. 8 is a schematic plan view enlargement of a portion of an image display face of the organic EL panel 10.

According to the organic EL panel 10, as an example, sub pixels 100R, 100G, 100B are arranged in a matrix and emit R, G, B colors of light, respectively. The sub pixels 100R, 100G, 100B are lined up alternating in the X direction, and a set of the sub pixels 100R, 100E, 100B in the X direction constitute one pixel P.

Organic EL elements 2 (see FIG. 9) that emit R, G, B colors of light are arranged in the sub pixels 100R, 100G, 100B, and through combining gradation control of luminance of the sub pixels 100R, 100G, 100B, full color image display is possible.

In addition, in the Y direction, the sub pixels 100R, the sub pixels 100G, and the sub pixels 100B are arranged to form sub pixel columns CR, sub pixel columns CG, and sub pixel columns CB, respectively, in which only the corresponding color of sub pixel is present. As a result, across the organic EL panel 10, the pixels P are arranged in a matrix along the X direction and the Y direction, and an image is displayed on the image display face through a combination of colors of light emitted by the pixels P.

The organic EL panel 10 pertaining to the present embodiment employs a line bank structure. That is, the sub pixel columns CR, CG, CB are partitioned by banks 14 at intervals in the X direction, and in each of the sub pixel columns CR, CG, CB, the sub pixels 100R, 100G, or 100B therein share a continuous organic light emitting layer.

However, in each of the sub pixel columns CR, CG, CB, sub pixel restriction layers 141 are disposed at intervals in the Y direction to insulate the sub pixels 100R, 100G, 100B from each other, such that each of the sub pixels 100R, 100G, 100B can emit light independently.

Height of the pixel restriction layers 141 is higher than height of a surface of a light emitting layer (from a surface of the pixel electrode 13, 200 nm or less to the surface of the light emitting layer, and about 500 nm for the pixel restriction layers 141; surface height of ink of the light emitting layer after printing but before drying is higher than that of the pixel restriction layers 141 so as to improve flow, but finished height after drying/baking is lower than that of the pixel restriction layers 141).

In FIG. 8, the banks 14 and the pixel restriction layers 141 are indicated by dotted lines, and this is because the pixel restriction layers 141 and the banks 14 are not exposed on the surface of the image display face and are disposed inside the image display face.

Here, when one set of the sub pixel columns CR, CG, CB is defined as one light emission region 500 (light emitting portion), between pairs of light emission regions are auxiliary electrode formation regions 600 (non light emitting columns) extending in a direction parallel to the sub pixel columns CR, CG, CB.

Organic EL elements are not formed in the auxiliary electrode formation regions 600, but an auxiliary electrode 131 extending in the Y direction is formed in each of the auxiliary electrode formation regions 600 substantially centrally in the X direction.

(B) Organic EL Display Panel Cross Section Structure

As described above, in the organic EL panel 10, three sub pixels emitting R, G, and B light, respectively, constitute a pixel. Each sub pixel is composed of an organic EL element 2 that emits a corresponding color of light.

Figure 9:
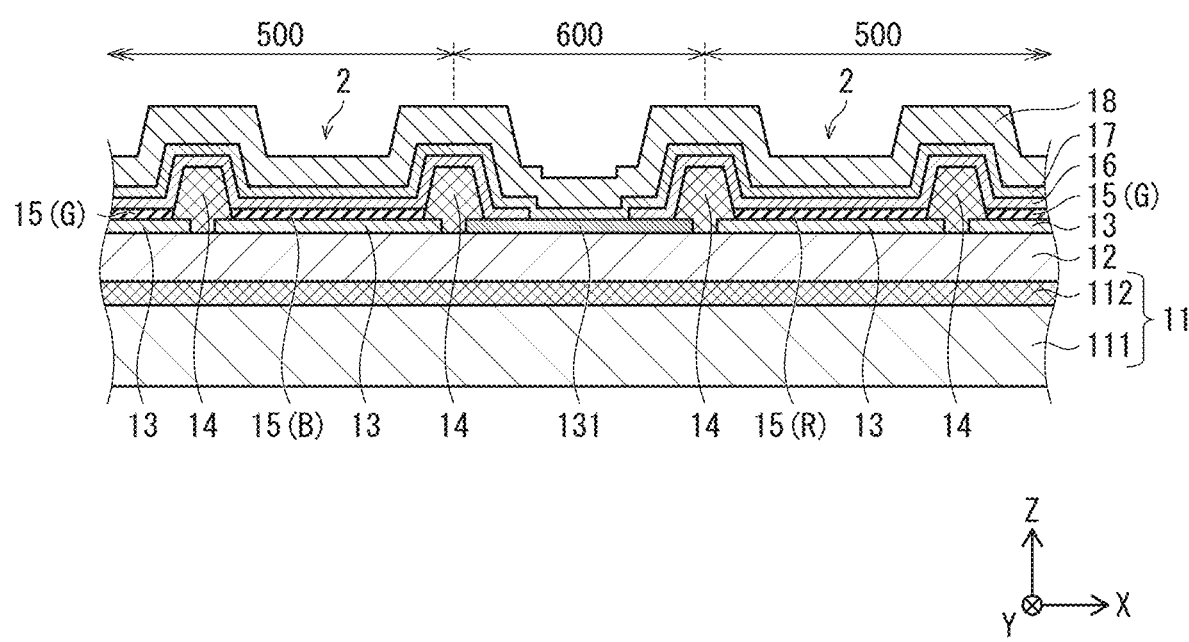
FIG. 9 is a schematic cross-section diagram of the organic display panel of FIG. 8, taken along a line A-A in FIG. 8.

FIG. 9 is a cross section diagram of the organic EL panel 10 taken along line A-A in FIG. 8.

As illustrated, according to the present embodiment, the organic EL panel 10 includes a substrate 11, an interlayer insulating layer 12, pixel electrodes 13, the banks 14, light emitting layers 15, an electron transport layer 16, a common electrode 17, a sealing layer 18, and the auxiliary electrodes 131.

The substrate 11, the interlayer insulating layer 12, the electron transport layer 16, the common electrode 17, and the sealing layer 18 are not formed individually for each pixel but are common to a plurality of the organic EL elements 2 included in the organic EL panel 10.

(1) Substrate

The substrate 11 includes a base 111 that is an insulative material, and a thin film transistor (TFT) layer 112. A drive circuit for each sub pixel is formed in the TFT layer 112. For example, the base 111 may be a glass substrate, a quartz substrate, a silicon substrate, a metal substrate where the metal may be molybdenum sulfide, copper, zinc, aluminum, stainless steel, magnesium, iron, nickel, gold, silver, or the like, a semiconductor substrate where the semiconductor is gallium arsenide or the like, a plastic substrate, or the like.

(2) Interlayer Insulating Layer

The interlayer insulating layer 12 is formed on the substrate 11. The interlayer insulating layer 12 is made of a resin material, and planarizes unevenness of an upper surface of the TFT layer 112. An example of a resin material is a positive type photosensitive material. Examples of such photosensitive material include acrylic resin, polyimide resin, siloxane resin, and phenolic resin. Although not illustrated in the cross section diagram of FIG. 7, for each sub pixel a contact hole is formed in the interlayer insulating layer 12.

(3) Pixel Electrodes

The pixel electrodes 13 correspond one-to-one with the sub pixels, and are electrically connected to the TFT layer 112 via the contact holes (not illustrated).

According to the present embodiment, the pixel electrodes 13 function as anodes.

According to the present embodiment, the organic EL panel 10 is a top emission type, and therefore the pixel electrodes 13 are made of a light reflective metal material in order to improve light emission efficiency.

Examples of such metal material include silver (Ag), aluminum (Al), aluminum alloy, molybdenum (Mo), silver palladium copper alloy (APC), silver rubidium gold alloy (ARA), molybdenum chromium alloy (MoCr), molybdenum tungsten alloy (MoW), nickel chromium alloy (NiCr), and the like.

(4) Auxiliary Electrodes (Bus Bar)

The auxiliary electrodes 131 are formed in the same "layer" as the pixel electrodes 13, on the interlayer insulating layer 12. As described later, from the viewpoint of simplifying manufacture, it is beneficial that the auxiliary electrodes 131 be formed in the same step as the pixel electrodes 13, and from the same material as the pixel electrodes 13.

(5) Banks and Pixel Restriction Layers

The banks 14 partition the pixel electrodes 13 corresponding to the sub pixels on the substrate 11 into columns in the X direction (see FIG. 8), and each has a line bank shape extending in the Y direction between the sub pixel columns CR, CG, CB in the X direction.

An electrically insulative material is used for the banks 14. As an example of an electrically insulative material, insulative organic material is used (for example, acrylic resin, polyimide resin, novolac resin, phenolic resin, or the like).

The banks 14 function as structures for preventing ink of each color from overflowing and color mixing when forming the light emitting layers 15 by an application method.

As a material of the banks 14, when using a resin material, it is beneficial to use a photosensitive material from the viewpoint of workability. Photosensitivity may be positive type or negative type, but it is beneficial to have resistance to organic solvents and heat. In order to suppress overflow of ink, surfaces of the banks 14 beneficially have a defined liquid repellency.

Where the pixel electrodes 13 are not formed, a bottom surface of the banks 14 is in contact with the top surface of the interlayer insulating layer 12.

The pixel restriction layers 141 are made of an electrically insulating material and cover end portions in the Y direction of the pixel electrodes 13 in each sub pixel column, partitioning the pixel electrodes 13 in the Y direction.

Film thickness of the pixel restriction layers 141 is set to be slightly greater than film thickness of the pixel electrodes 13 but less than height of the light emitting layers in an ink state immediately after printing, as described above. Thus, flow of ink when forming the light emitting layers 15 is not prevented by the pixel restriction layers 141 in each of the sub pixel columns CR, CG, CB. Thus, it is easy for thickness of any one of the light emitting layers 15 to be uniform within the corresponding sub pixel column.

According to the structure described above, the pixel restriction layers 141 improve electrical insulation between Y direction adjacent pixel electrodes 13 while suppressing discontinuity of the light emitting layers 15 within any given one of the sub pixel columns CR, CG, CB, and improve electrical insulation between the pixel electrodes 13 and the common electrode 17.

A specific example of an electrically insulating material used for the pixel restriction layers 141 is the organic material or inorganic material exemplified as the material of the banks 14. When forming the light emitting layers 15, it is beneficial that surfaces of the pixel restriction layers 141 are lyophilic with respect to the ink in order that the ink easily spreads.

In the auxiliary electrode formation regions 600, the pixel restriction layers 141 are not formed.

(6) Light Emitting Layers

The light emitting layers 15 are formed between the banks 14 in the light emission regions 500, and have a function of emitting light in RGB colors through recombination of holes and electrons. Where a distinction is made between light emission colors, the light emitting layers 15 may be referred to as light emitting layers 15(R), 15(G), 15(B).

As a material of the light emitting layers 15, a known material can be used. In particular, for example, the light emitting layers 15 are beneficially formed by using a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth metal complex, or the like.

(7) Electron Transport Layer

The electron transport layer 16 has a function of transporting electrons from the common electrode 17 to the light emitting layers 15. The electron transport layer 16 is made of an organic material having a high electron transport property and does not contain an alkali metal or an alkaline earth metal.

An example of an organic material that may be used in the electron transport layer 16 is a π electron low molecular weight organic material such as an oxadiazole derivative (OXD), a triazole derivative (TAZ), a phenanthroline derivative (BCP, Bphen), or the like.

Figure 12A:
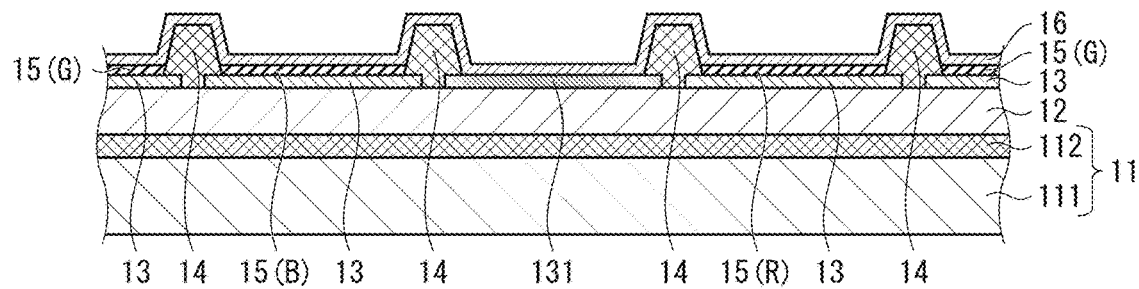
FIG. 12A to FIG. 12C are cross-section diagrams schematically illustrating a portion of the organic EL element manufacturing process continuing from FIG. 11C.
Figure 12B:
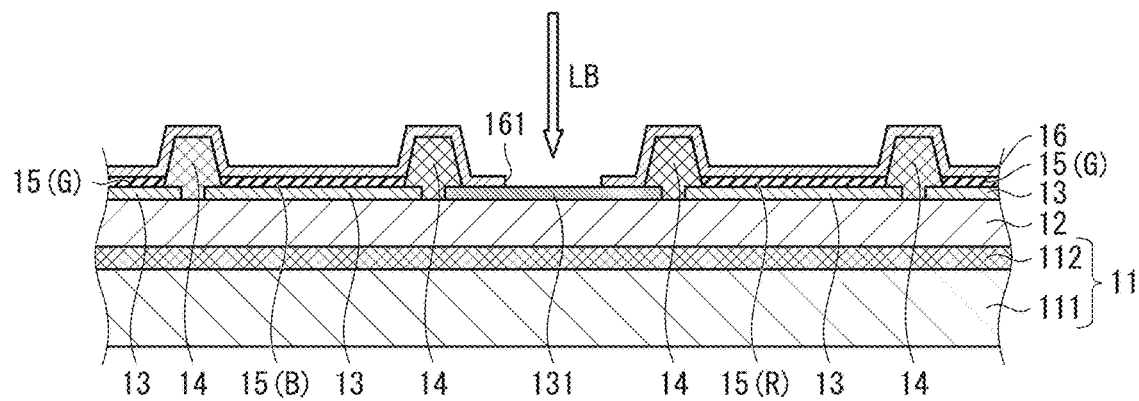

Contact openings 161 are formed in the electron transport layer 16 in the auxiliary electrode formation regions 600 (see FIG. 12B).

(8) Common Electrode

The common electrode 17 is made of a light transmissive electrically conductive material and is formed on the electron transport layer 16. The common electrode 17 functions as an anode.

As a material of the common electrode 17, a metal is beneficial such as indium tin oxide (ITO), indium zinc oxide (IZO), silver, silver alloy, aluminum, aluminum alloy, or the like. When the common electrode 17 is formed from a metal, film thickness of the common electrode 17 is approximately 20 nm or less, because the common electrode 17 needs to be light transmissive.

Further, in the auxiliary electrode formation regions 600, the common electrode 17 is directly formed on the auxiliary electrodes 131 via the contact openings 161.

(9) Sealing Layer

The sealing layer 18 is provided to prevent deterioration of constituent elements of the organic EL elements, in particular deterioration of organic layers such as the light emitting layers 15 and the electron transport layer 16, due to exposure to moisture, other liquids, and/or air.

According to the present embodiment, the sealing layer 18 is a thin film of silicon nitride (SiN) and covers a top surface of the common electrode 17. Aside from silicon nitride (SiN), another appropriate inorganic material may be used (for example, silicon oxynitride (SiON), silicon carbide (SiC), or the like).

(10) Other

Although not illustrated in FIG. 9, an antiglare polarizing plate or upper substrate may be bonded to the sealing layer 18 via an adhesive. Through such bonding, constituent elements of the organic EL elements 2, in particular organic layers thereof, are further protected from moisture, air, and the like.

4. Method of Manufacturing Organic EL Panel 10

A method of manufacturing the organic EL panel 10 is described with reference to the drawings.

Figure 11A:
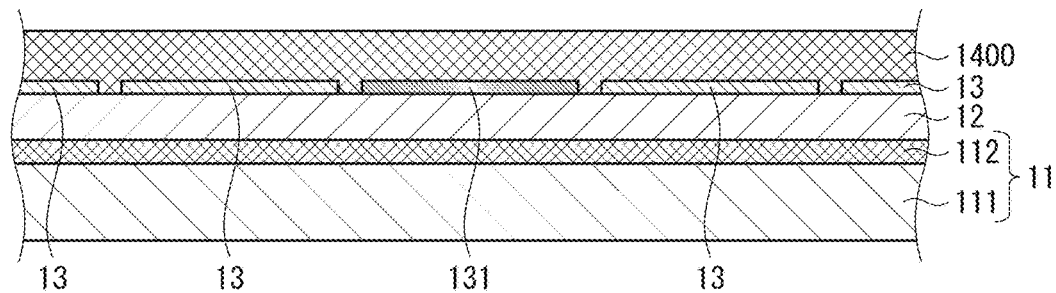
FIG. 11A to FIG. 11C are cross-section diagrams schematically illustrating a portion of the organic EL element manufacturing process continuing from FIG. 10D.
Figure 11B:
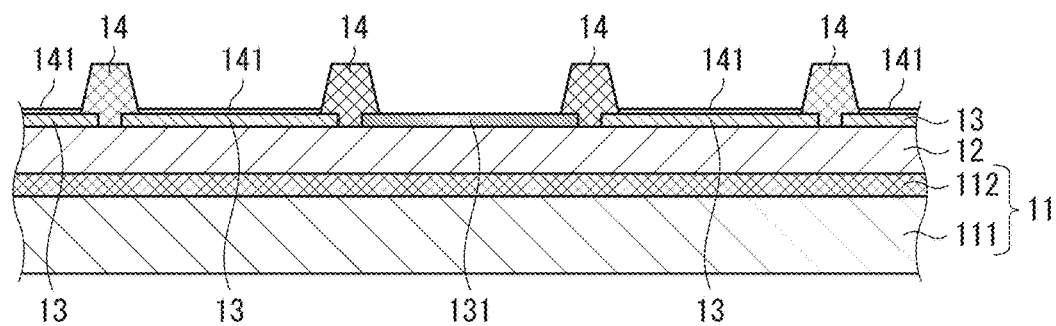
Figure 11C:
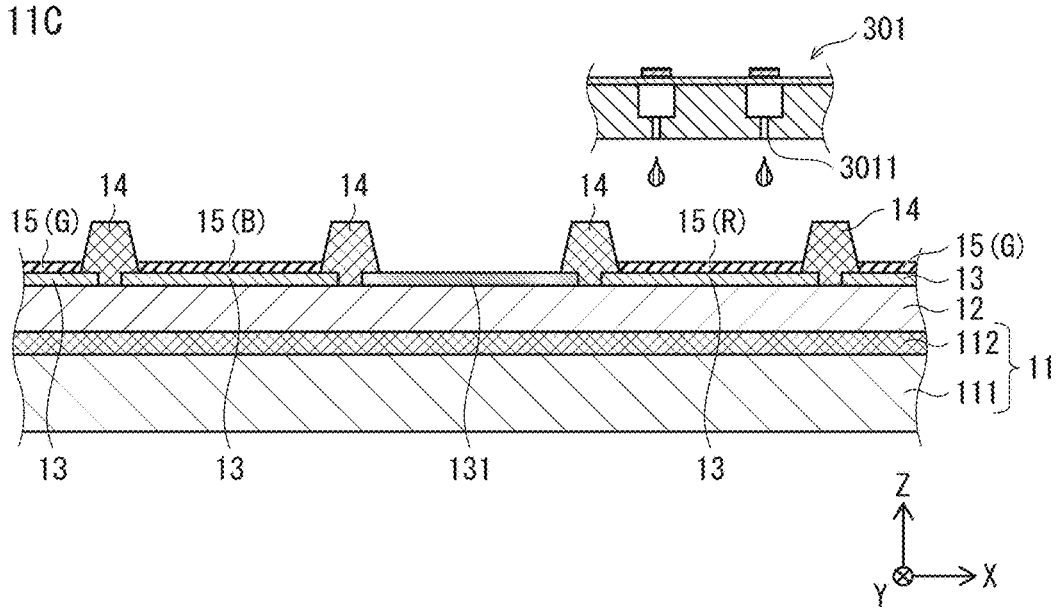
Figure 12C:
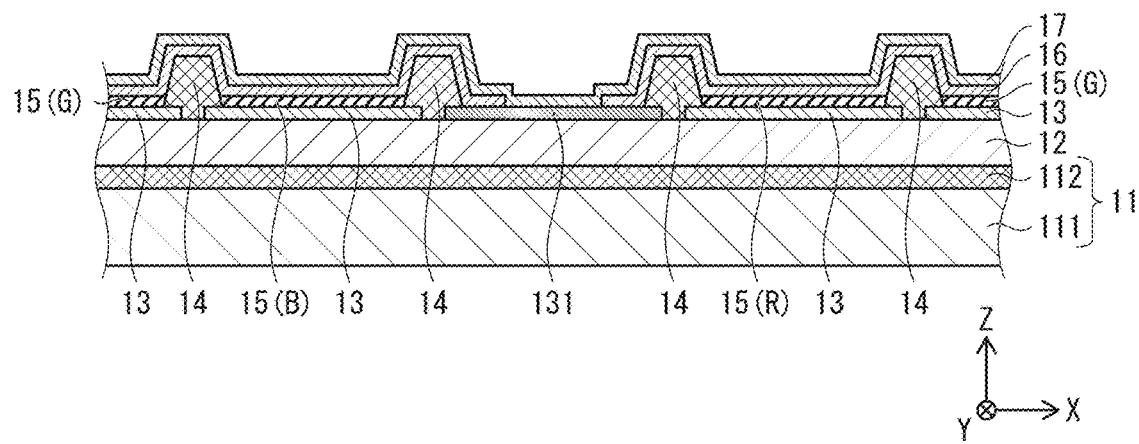
Figure 13:
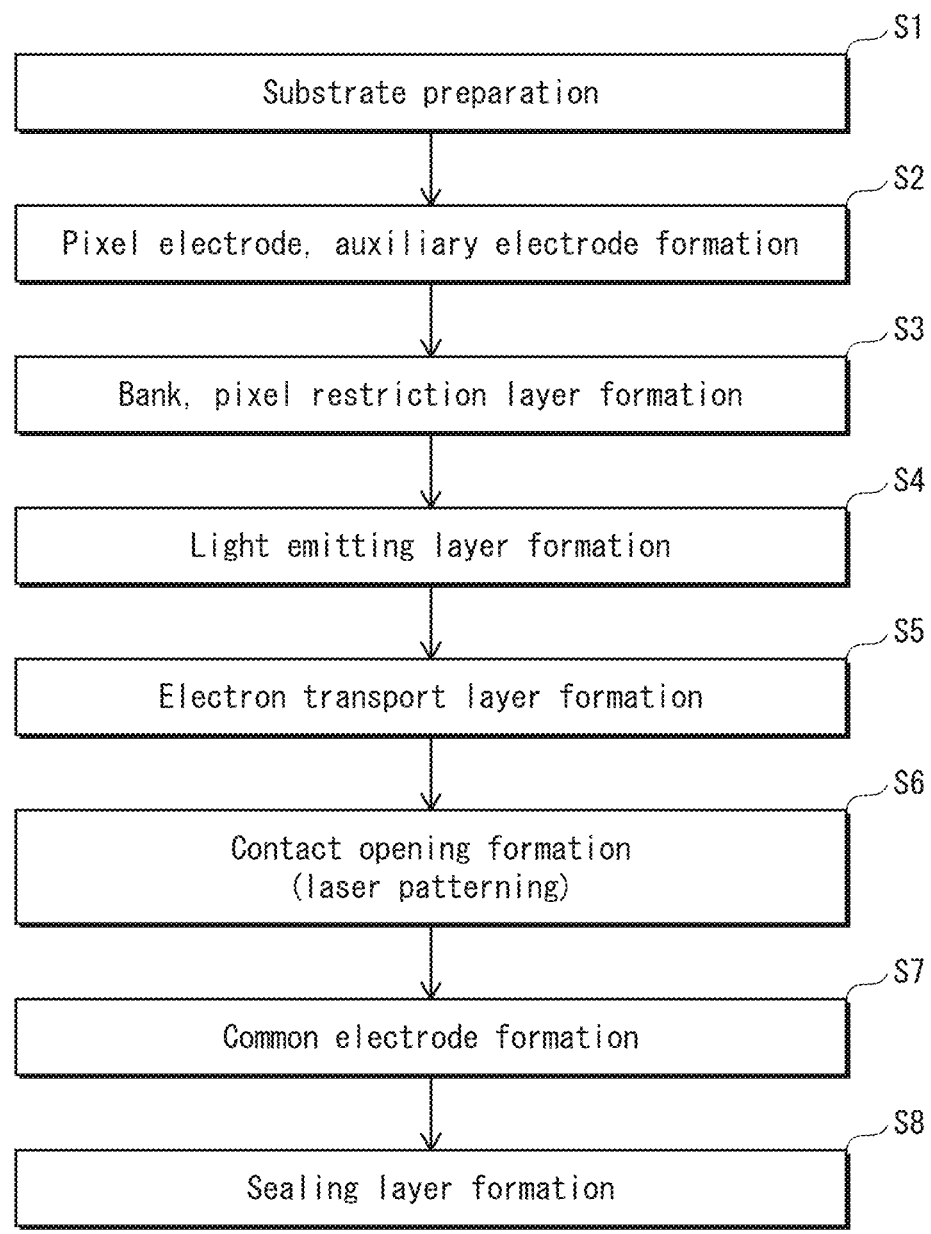
FIG. 13 is a flowchart illustrating an organic EL display panel manufacturing process pertaining to at least one embodiment.

FIG. 10A to 10D, FIG. 11A to 11C, and FIG. 12A to 12C are schematic cross section diagrams illustrating processes in manufacture of the organic EL panel 10, and FIG. 13 is a flowchart illustrating processes in manufacture of the organic EL panel 10.

(1) Preparing Substrate

Figure 10A:
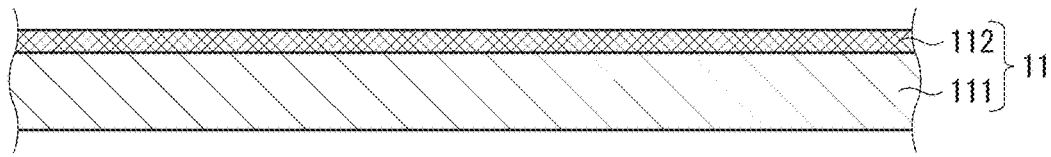
FIG. 10A to FIG. 10D are cross-section diagrams schematically illustrating a portion of an organic EL element manufacturing process pertaining to at least one embodiment.

First, the substrate 11 is prepared by forming the TFT layer 112 on the base 111 (FIG. 10A; step S1 in FIG. 13). The TFT layer 112 can be formed by a known TFT manufacturing method.

Figure 10B:
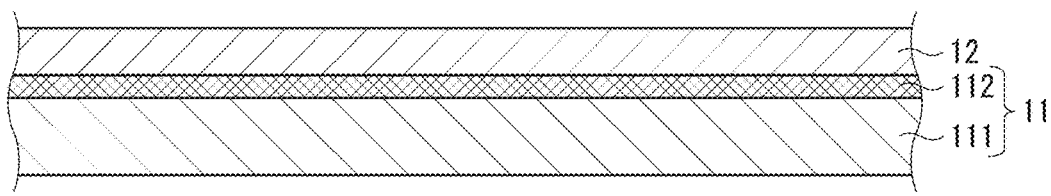

The interlayer insulating layer 12 is formed on the TFT layer 112 (FIG. 10B). Specifically, photosensitive resin material having a defined fluidity is applied across the top surface of the substrate 11 by, for example, a die coating method, so as to fill irregularities in the top surface of the substrate 11 due to the TFT layer 112. Thus, the top surface of the interlayer insulating layer 12 has a flattened shape conforming to the top surface of the base 111.

Further, a dry etching method is applied to a portion of the interlayer insulating layer 12 above TFT elements, for example source electrodes, to form contact holes (not illustrated). The contact holes are formed by patterning or the like such that surfaces of the source electrodes of the TFT elements are exposed at bottoms of the contact holes.

Next, a connecting electrode layer is formed along inner walls of the contact holes. Top portions of the connecting electrode layer are disposed on the interlayer insulating layer 12. The connecting electrode layer may be formed by, for example, a sputtering method, and after forming a metal film, patterning may be performed by using a photolithography method or wet etching method.

(2) Pixel Electrodes and Auxiliary Electrodes Formation

Next, the pixel electrodes 13 and the auxiliary electrodes 131 are formed on the interlayer insulating layer 12 (step S2 in FIG. 13).

Figure 10C:
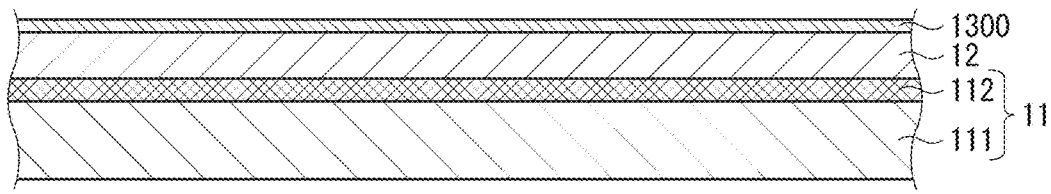
Figure 10D:
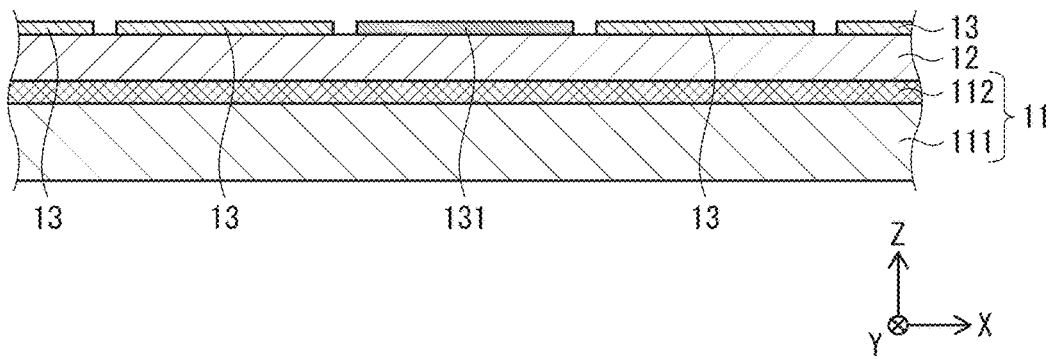

First, a pixel electrode material layer 1300 is formed on the interlayer insulating layer 12 by, for example, a vacuum deposition method, a sputtering method, or the like (FIG. 10C). Next, patterning is performed by an etching method to form the pixel electrodes 13 partitioned for each subpixel and the auxiliary electrodes 131 extending in the Y direction (FIG. 10D). Thus, the pixel electrodes 13 and the auxiliary electrodes 131 are made of the same material, but in FIG. 10D, in order to distinguish between the pixel electrodes 13 and the auxiliary electrodes 131, they are differentiated by different hatching (the same applies to other drawings).

The pixel electrodes 13 and the auxiliary electrodes 131 are not necessarily made of the same material. For example, in order to reduce contact resistance between the auxiliary electrodes 131 and the common electrode 17, a material that is not easily oxidized (for example, Ti) may be laminated on portions of the auxiliary electrodes 131 that are the same material as the pixel electrodes 13.

(3) Banks and Pixel Restriction Layers Formation

Next, the banks 14 and the pixel restrictions layers 141 are formed (step S3 in FIG. 13).

According to the present embodiment, the banks 14 and the pixel restriction layers 141 are formed at the same time by using a halftone mask, as described below.

First, on the interlayer insulating layer 12 on which the pixel electrodes 13 are formed, a resin material is applied to form a bank material layer 1400 to a thickness necessary to form the banks 14 (FIG. 11A). As a specific example of an application method, a wet method such as a die coating method, a slit coating method, a spin coating method, or the like can be used.

After application, unnecessary solvent is removed by, for example, vacuum drying and low temperature heat drying (prebaking) at about 60° C. to 120° C., and the bank material layer 1400 is exposed to light via a photomask (not illustrated).

For example, in a case where the bank material layer 1400 has a positive type photosensitivity, portions of the bank material layer 1400 to remain are shielded and portions to be removed are exposed.

According to the present example, film thickness of the pixel restriction layers 141 is smaller than film thickness of the banks 14, and therefore it is necessary to partially expose portions of the bank material layer 1400 for the pixel restriction layers 141.

Thus, the photomask used in this exposure includes a light shielding portion that completely blocks light corresponding to positions of the banks 14, a partially light transmissive portion that corresponds to positions of the pixel restriction layers 141, and a light transmissive portion that corresponds to positions of exposed portions of the pixel electrodes 13 and the auxiliary electrodes 131.

Light transmission of the partially light transmissive portion is determined such that, when light exposure is performed for a defined time, the bank material layer 1400 on the pixel electrodes 13 and the auxiliary electrodes 131 is completely exposed and a portion of the bank material layer 1400 corresponding to and having the same height as the pixel restriction layers 141 is not exposed in order that the portion remains.

Next, developing is performed, and by removing exposed portions of the bank material layer 1400, the banks 14 and the pixel restriction layers 141 that have a smaller film thickness than the banks 14 can be formed. As a specific developing method, an example is to immerse the substrate 11 in a developing solution such as an organic solvent or alkaline solution that dissolves portions of the bank material layer 1400 that have been exposed to light, then immerse the substrate 11 in a rinsing liquid such as pure water to wash the substrate 11.

Thus, the banks 14 extending in the Y direction and the pixel restriction layers 141 extending in the X direction can be formed on the interlayer insulating layer 12 (FIG. 11B).

(4) Light Emitting Layers Formation

Next, the light emitting layers 15 are formed on the pixel electrodes 13 (step S4 in FIG. 13).

Specifically, ink containing a light emitting material of a corresponding light emission color is sequentially ejected from nozzles 3011 of an application head 301 of a printing device into openings defined by pairs of the banks 14 onto the pixel electrodes 13 in the openings. At this time, the ink is applied to be continuous across the pixel restriction layers 141. As a result, the ink can flow along the Y direction, reducing uneven application of the ink, such that film thickness of the light emitting layers 15 can be made uniform within the same sub pixel column.

Then, the substrate 11 after ink application is transported into a vacuum drying chamber and heated in a vacuum, thereby evaporating organic solvent in the ink. Thus, the light emitting layers 15 can be formed (FIG. 11C).

(5) Electron Transport Layer Formation

Next, the electron transport layer 16 is formed across the light emitting layers 15, the banks 14, the pixel restriction layers 141, and the auxiliary electrodes 131 (FIG. 12A; step S5 in FIG. 13). The electron transport layer 16 is formed, for example, by forming a film of an electron transporting organic material across the light emission region 500 and the auxiliary electrode formation region 600.

(6) Contact Opening Formation (Laser Patterning)

Next, the thin film patterning device 200 (FIG. 5) removes the electron transport layer 16 on the auxiliary electrodes 131 to form the contact openings 161 (step S6 in FIG. 13).

The thin film laminated substrate 110, which is an intermediate product of the organic EL panel 10 in which the electron transport layer 16 is formed above the substrate 11, is transferred by the substrate transport robot 231 in the substrate loading port 260 to be placed at a defined position on the table 223 in the vacuum chamber 221 of the thin film patterning device 200, and the vacuum pump 240 is operated to depressurize the vacuum chamber 221 to achieve the high vacuum state described above.

Then, the laser processing device 210 is operated to scan the laser beam LB to remove the electron transport layer 16 on all of the auxiliary electrodes 131 above the substrate 11, forming the contact openings 161 (FIG. 12B).

(7) Common Electrode Formation

Next, the common electrode 17 is formed on the electrode transport layer 16 (FIG. 12C; step S7 in FIG. 13). According to the present embodiment, the common electrode 17 is formed by forming a thin film by a sputtering method or vacuum deposition method.

At this time, the contact openings 161 are formed on the auxiliary electrodes 131, and therefore the common electrode 17 is formed directly on the auxiliary electrodes 131, such that electrical connections therebetween are improved. The auxiliary electrodes 131 are made of metal, and therefore have excellent electrical conductivity, such that there is almost no potential difference and luminance unevenness and the like does not occur between peripheral and central portions of the common electrode 17.

(8) Sealing Layer Formation

Next, the sealing layer 18 is formed on the common electrode 17 (step S8 in FIG. 13).

The sealing layer made of SiN is a thin film that may be made by a plasma chemical vapor deposition (CVD) method, for example. Thus, the organic EL panel 10 having a layered structure as illustrated in FIG. 9 can be obtained.

4. Summary of Effects of Embodiment 1

According to Embodiment 1, the following effects can be achieved.

(1) In a display panel including an organic thin film, in particular an organic EL panel, an organic thin film reacts with oxygen and moisture and therefore laser processing is also necessarily performed in a chamber under a sealed vacuum environment. Laser processing devices are relatively large in size, and therefore a configuration is used in which the laser processing device is outside the chamber and a thin film formed on a substrate inside the chamber is irradiated and processed via window glass through which a laser beam is transmitted. However, debris that is melted and sublimed by a laser beam scatters inside the chamber, comes into contact with the window glass, and solidifies and adheres, and therefore the laser beam becomes unable to sufficiently pass through the window glass, making processing impossible. For this reason, it becomes necessary to frequently clean or replace the window glass, but in order to withstand low pressure it is necessary to use solid and thick glass for the window glass, and in order to maintain sealing of the chamber, the window glass is relatively strongly mounted via a sealing member, and therefore time and costs required for maintenance cannot be discounted.

However, according to at least one embodiment of the present disclosure, the cover glass is positioned closer to the substrate than the window glass and therefore most of the debris scattered upwards adheres to the cover glass and the possibility of debris being redeposited on a thin film on the substrate is drastically reduced, which can prevent deterioration in quality of the organic EL display panel.

The cover glass is entirely within the vacuum chamber and does not receive the pressing force of atmospheric pressure, unlike the window glass, and therefore a rigidity as great as that of the window glass is not required and a relatively cheap glass plate can be used as the cover glass when compared to that of the window glass. Further, the cover glass is simply placed on supporting plates in the vacuum chamber so can be exchanged freely. By transporting the substrate and the cover glass 225 together using the substrate transport robot 261 illustrated in FIG. 5, there is no need to interrupt a manufacturing line for a long period for maintenance of the thin film patterning device 200, leading to excellent productivity.

Further, if the cover glass 225 is removed from the vacuum chamber for cleaning after each thin film processing, or after several such processes, for example if a dedicated washing machine is prepared to clean the cover glass for reuse, processing becomes more economical.

Thus, according to at least one embodiment of the present disclosure, through use of laser processing for thin film patterning it is possible to greatly reduce the amount of processing when compared with a patterning method using a conventional photolithography or etching method, while also reducing adverse effects of debris, making maintenance easier, and making it possible to manufacture a high quality organic EL display panel.

Further, merely by changing a program (pattern data) installed in a controller of the laser processing device 210, varied pattern forming can quickly be executed, and therefore there is no need for the labor and expense required to recreate masks for each design change as in conventional etching methods, thereby providing excellent on-demand flexibility.

Modifications of Embodiment 1

Embodiments of a patterning device and a patterning method have been described as aspects of the present disclosure, but the present disclosure is not limited to the description above beyond essential characteristic elements thereof. The following describes modifications of Embodiment 1 as other embodiments.

(1) Wavelength Range of Laser Beam Source in Thin Film Patterning Device

According to at least one embodiment, the electron transport layer 16 made of resin on the auxiliary electrodes 131 is patterned. However, even in a case in which a plurality of thin films are formed on the auxiliary electrodes 131, such as an electron injection layer, a hole injection layer, a hole transport layer, or the like in addition to an electron transport layer, a laser processing device that emits a laser beam in a wavelength range absorbed by materials of these thin films may be used to form the contact openings 161 in one pass, exposing the auxiliary electrodes 131.

According to at least one embodiment, a YAG laser, which is a fixed laser, is used as the laser beam source. A YAG laser is capable of stable microprocessing, and etching depth can be finely adjusted through controlling laser output and scanning speed, and therefore the auxiliary electrodes 131 can be made to remain while removing the thin film thereon (halfcut processing).

However, in order to more stably and reliably leave only the auxiliary electrodes 131 while removing a thin film thereon, it is beneficial to select material and specific laser beam wavelength range such that absorption of the laser beam by the thin film is as great as possible when contrasted with absorption of the laser beam by metal of the auxiliary electrodes 131.

(2) Thin Film to be Patterned

According to at least one embodiment, the contact openings 161 are described as being formed in the electron transport layer 16 on the auxiliary electrodes 131, but thin film patterning by the thin film patterning device 200 is also possible in other cases.

For example, not only where the auxiliary electrodes 131 are formed in the auxiliary electrode formation regions 600 between the light emission regions 500, but also in patterning above the banks 14. In such a case, contact openings are formed by the thin film patterning device 200 removing a portion of an organic layer, sealing layer, or the like on the common electrode layer 17 above the banks 14. A metal film may be formed thereon by vapor deposition or the like, then etched to remain only in the contact openings for use as auxiliary electrodes.

Further, the thin film patterning device pertaining to at least one embodiment is effective in any case where a thin film requires patterning, and in particular where a removal area is not large and the amount of debris is small.

(3) Window Glass Material

According to at least one embodiment, quartz glass is described as being used as a material of the window glass 226 and the cover glass 225 as quartz glass has good light transmission in a wide wavelength range and excellent durability, but depending on a wavelength range of a laser beam used, soda glass or a light transmissive resin such as acrylic may be used. Particularly in a case where used cover glass is not reused and is disposed of, there is merit in using soda glass or light transmissive resin, which are cheaper than quartz glass.

(4) According to Embodiment 1, in order to avoid deterioration of the organic EL panel 10, and in particular deterioration of an organic functional film such as a light emitting layer, air in the vacuum chamber 221 is withdrawn by the vacuum pump 240 to depressurize the vacuum chamber 221, and patterning of an intermediate product (thin film laminated substrate) of an organic EL display panel is performed in a vacuum. However, after depressurization with the vacuum pump 240, an inert gas such as nitrogen gas or argon that does not contain moisture (from a cost perspective nitrogen gas is beneficial) may be caused to flow in from a gas cylinder, or without use of the vacuum pump 240, the inert gas may be caused to flow in to replace air in the vacuum chamber 221 to form an inert gas environment.

As an aspect of the present disclosure, as an umbrella term, the process of setting a vacuum environment or an inert gas environment in the vacuum chamber 221 is referred to as an environment adjustment step. Further, a device that executes this process can be referred to as an environment adjuster.

Although exceptional, in a case of a display panel made of a thin film that is not influenced by (or resistant to) oxygen or moisture, it may not be necessary to adjust the environment as described above. However, in a case where generated debris is likely to harm the environment, it is necessary to perform patterning in a closed space such as a chamber, and a configuration in which a cover glass is placed in the chamber is useful, such as in the embodiments.

(5) According to Embodiment 1, the cover glass 225 is held by the supporting plates 224 provided on the inside of the vacuum chamber 221, but the cover glass 225 may be mounted on the table 223 via spacers.

Further, the thin film laminated substrate 110 may be transported into the vacuum chamber 221 with the table 223.

(6) According to at least one embodiment, in order to form the full-color organic EL panel 10, the light emitting layers 15(R), 15(G), 15(B) including light emitting material emitting light of a color corresponding to R, G, B sub pixels are formed, but all light emitting layers may be made to emit white light and a known color filter substrate including R, G, B filters may be attached above the sealing layer 18 via a light transmissive adhesive or the like.

(7) According to at least one embodiment, a wet process is described as a method of forming a light emitting layer, but the present disclosure is not limited to this example. For example, a dry process such as a vacuum deposition method, an electron beam deposition method, a sputtering method, a reactive sputtering method, an ion plating method, a vapor growth method, or the like can be used.

(8) According to at least one embodiment, each organic EL element includes a pixel electrode, a light emitting layer, an electron transport layer, and a common electrode, but, for example, each organic EL element may have a structure including a hole injection layer and/or a hole transport layer between the pixel electrode and the light emitting layer, and may have a structure including an electron injection layer between the electron transport layer and the common electrode. As an umbrella term, an organic thin film having a function such as a hole injection layer, hole transport layer, electron transport layer, electron injection layer, or the like may be referred to as an organic functional layer.

(9) According to at least one embodiment, the banks 14 and the pixel restriction layers 141 having different heights from each other are formed at the same time in one process by using a halftone mask, but the banks 14 and the pixel restriction layers 141 may be formed by different processes.

For example, first, the pixel restriction layers 141 may be formed in order to partition pixel electrode columns in the Y direction.

As a specific example of a method for forming the pixel restriction layers 141, a die coat method may be used to apply a resin material to an upper surface of the substrate 11 on which the pixel electrodes 13 are already formed. Then, the pixel restriction layers 141 can be formed by patterning the resin material to remain between the pixel electrodes 13 in the Y direction by a photolithography method, then baking.

Next, the banks 14 are formed by uniformly coating a bank resin that is a material of the banks 14 by, for example, a die coating method to form a bank material layer, patterning the bank material layer by a photolithography method, then baking.

(10) According to at least one embodiment, a line bank type of organic EL display panel is described. However, this may be a pixel bank type of organic EL display panel in which banks surround each pixel in four directions in the light emission regions 500.

(11) According to the organic EL panel 10 pertaining to at least one embodiment, the sub pixels 100R, 100G, 100B emit R, G, B colors of light, but light emission colors of the sub pixels are not limited to these examples. For example, in addition to R, G, B colors, yellow (Y) may be a light emission color. Further, in one pixel P, the number of sub pixels of one color is not limited to one, and may be two or more. Further, arrangement of sub pixels in a pixel P are not limited to a sequence R, G, B as illustrated in FIG. 8, and may be in a different sequence.

(12) According to the organic EL panel 10 pertaining to at least one embodiment, the pixel electrodes 13 are anodes and the common electrode 17 a cathode, but the structure may be reversed such that the pixel electrodes 13 are cathodes and the common electrode 17 an anode. Order of layers such as hole injection layer, hole transport layer, electron transport layer, electron injection layer may be modified as appropriate depending on positions of the cathode and the anode.

(13) According to at least one embodiment, the contact openings 161 are formed in a groove shape extending in a direction parallel to the banks 14 (column direction), but in each column, a plurality of contact holes (through holes) may be formed at an appropriate pitch.

(14) The organic EL panel 10 pertaining to at least one embodiment is an active matrix type, but is not limited to this and may be a passive matrix type.

Further, the present disclosure can be applied to manufacture of a bottom emission type of organic EL display panel, and can be applied to general display panel manufacture that requires patterning of a thin film in a sealed space.

<<Supplement 1>>

A display panel patterning device and patterning method have been described pertaining to Embodiment 1, which is an embodiment of the present disclosure, but embodiments of the present disclosure are not limited to Embodiment 1 and modifications thereof. Various modifications of Embodiment 1 and modifications thereof conceivable by a person having ordinary skill in the art, and any combination of elements and functions of Embodiment 1 and modifications thereof that do not depart from the spirit of the present invention are also included in the present disclosure.

In particular, modifications (1), (4), and (6) to (14) of Embodiment 1 can be applied to any of Embodiments 2 to 5, described later, so description thereof is not repeated below.

(II) Embodiment 2

<<Background to Embodiment 2 of Present Disclosure>>

As described above, properties of various organic materials forming an organic EL display panel deteriorate due to the influence of oxygen and moisture in air, and therefore a laser patterning method is beneficially performed in a vacuum.

According to the conventional technology illustrated in FIG. 3A and FIG. 3B (JP 2008-288074), after forming the combined substrate 730 in the vacuum chamber 830, unloading the combined substrate 730 from the vacuum chamber 830, and laser patterning, an additional step is required of peeling the light transmissive substrate 720 from the intermediate product 710, and therefore the efficiency of adopting laser processing to reduce the amount of processing is reduced. In addition, in the step of peeling off the light transmissive substrate 720, unless the combined substrate 730 is returned into the vacuum chamber 830 and the light transmissive substrate 720 carefully peeled off from the intermediate product 710, there is a risk that the banks 714 are damaged and product quality deteriorates.

In other words, according to the conventional processing method illustrated in FIG. 3A and FIG. 3B, not only is time required not significantly reduced, but there is a risk of quality deterioration.

In view of the above, the inventors of the present application proposed a method in which an opening window larger than the substrate is provided to a vacuum chamber, a laser processing device is disposed outside the vacuum chamber, and processing is performed by scanning a laser beam through the opening window, and conducted research accordingly.

Figure 14A:
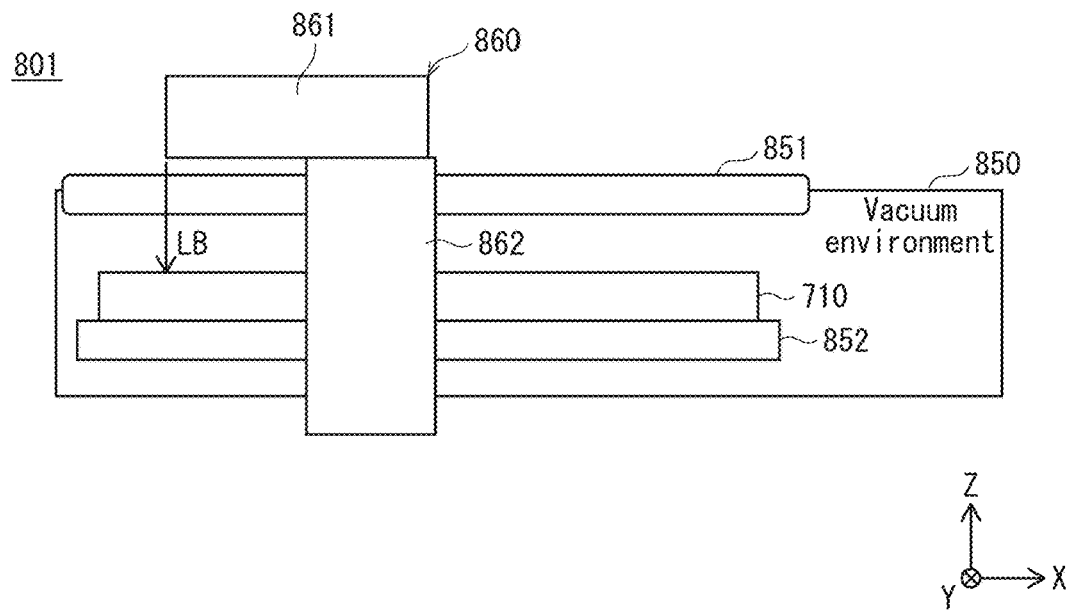
FIG. 14A and FIG. 14B are a schematic side-view diagram and a schematic plan view diagram, respectively, illustrating a thin film patterning device example for explaining background of Embodiment 2, which is an embodiment of the present disclosure.
Figure 14B:
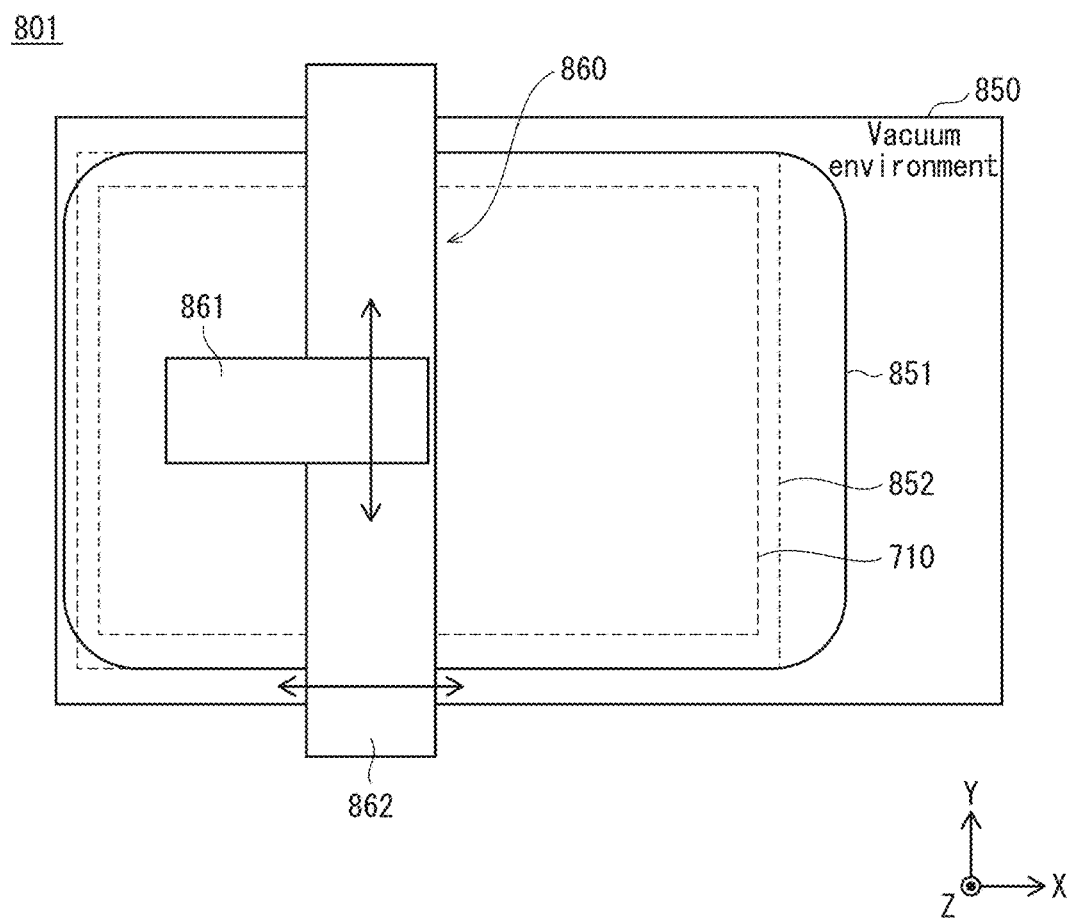

FIG. 14A is a schematic side view diagram illustrating structure of a patterning device 801 posited as an example for such a case, and FIG. 14B is a plan view diagram of same.

As illustrated in FIG. 14A, the patterning device 801 includes a laser processing device 860 and a vacuum chamber 850 in which a flat window glass 851 is mounted in a position facing the laser processing device 860. The laser processing device 860 includes a laser head 861 that emits a laser beam and can scan the laser beam by moving the laser head 861 in the X direction and the Y direction as indicated in the plan view diagram of FIG. 14B.

The intermediate product 710 of an organic EL display panel formed up to formation of the electron transport layer is placed on a table 852 in the vacuum chamber 850, pressure is reduced by a vacuum pump (not illustrated) to create a vacuum, the laser beam LB is emitted, and unnecessary portions of the electrode transport layer on auxiliary electrodes are sublimated and removed.

However, the patterning device 801 as described showed evidence of processing accuracy deterioration.

Figure 15:
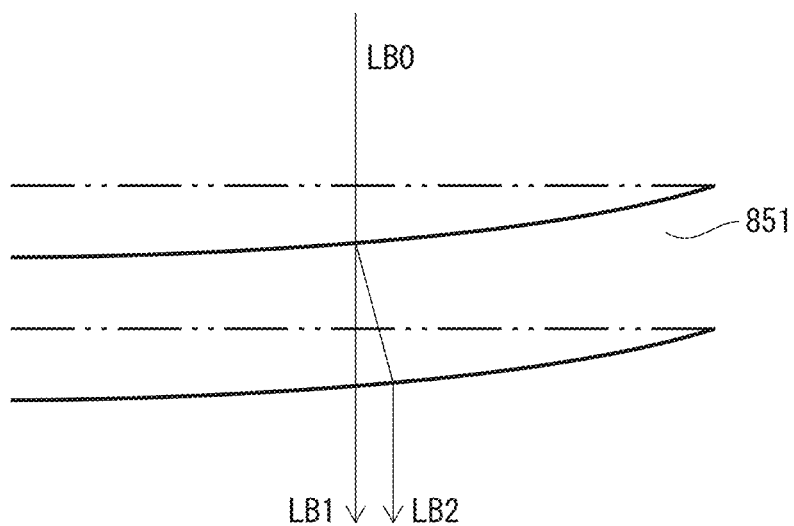
FIG. 15 is a diagram for explaining a potential problem with the thin film patterning device of FIG. 14A and FIG. 14B.

That is, it is beneficial that the laser beam LB is emitted parallel to a direction normal to a main surface of the window glass 851 in order that an optical axis thereof is not shifted by refraction through the window glass 851. However, as illustrated by two dot-dash lines in FIG. 15, the window glass 851 installed horizontally bends under its own weight such that a central portion thereof sags, as illustrated by continuous lines, meaning that the laser beam LB deviates from the expected laser beam LB1 to the laser beam LB2, which has a shifted optical axis, and irradiates a different position from a target position on the intermediate product 710.

Recently there has been strong demand for upsizing of organic EL display panels, meaning that size of the window glass 851 increases, and therefore bending of the window glass 851 increases, processing accuracy decreases, and organic EL display panel quality decreases.

The inventors of the present application conducted extensive research into a laser patterning method for thin film patterning that reduces manufacturing time and cost while making manufacture of a high quality organic EL display possible, and arrived at Embodiment 2 of the present disclosure.

Embodiment 2

Hereinafter, an organic EL display panel patterning device and patterning method pertaining to Embodiment 2, which is an embodiment of the present disclosure, are described with reference to the drawings. For convenience of explanation, drawings may be schematic, and are not necessarily to scale.

1. Structure of Thin Film Patterning Device 201

Figure 16:
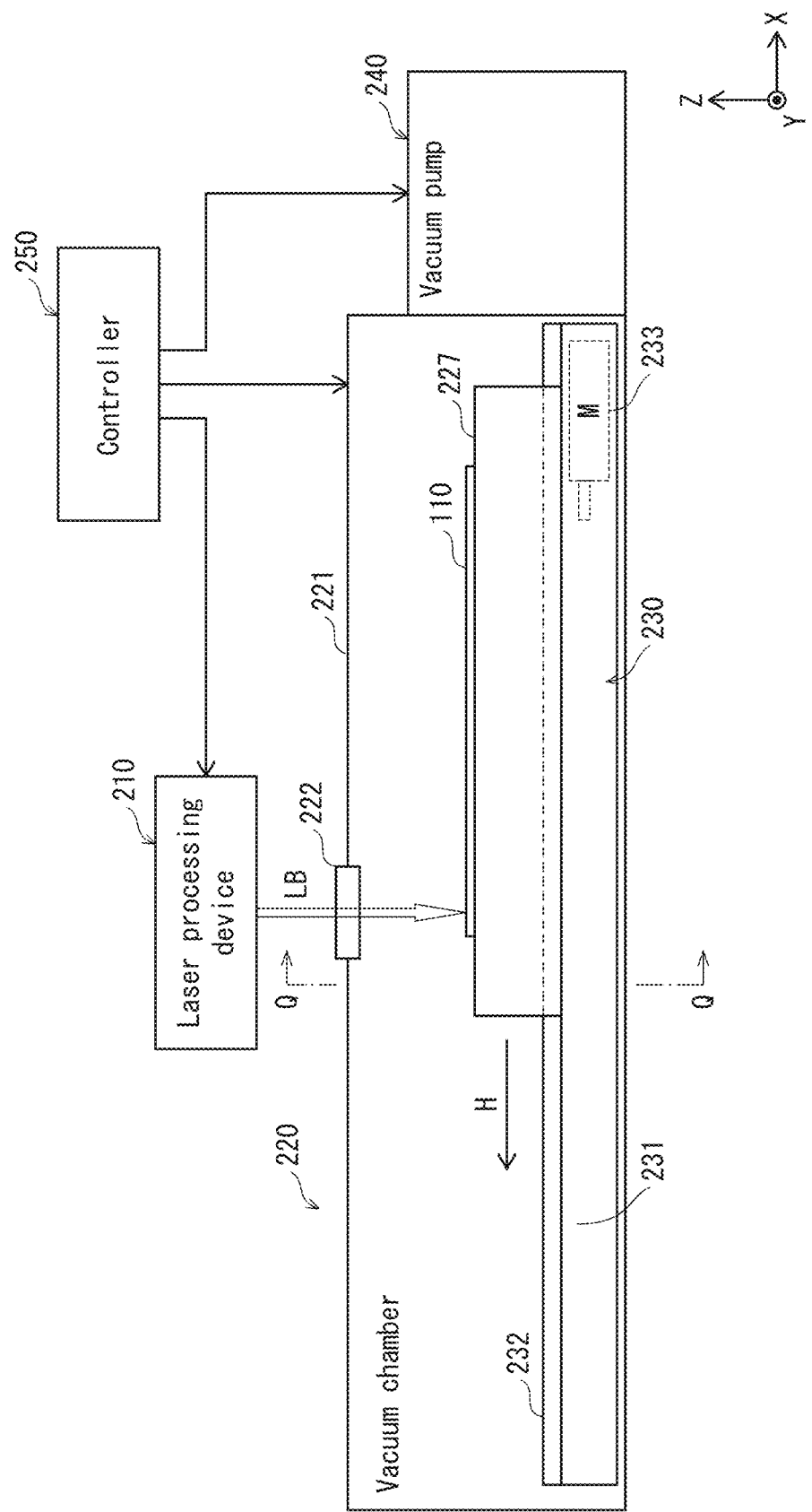
FIG. 16 is a schematic side-view diagram illustrating structure of a thin film patterning device pertaining to Embodiment 2, which is an embodiment of the present disclosure.

FIG. 16 is a schematic diagram illustrating structure of a thin film patterning device 201 in an organic EL display panel manufacturing device. Further, FIG. 17 is a perspective diagram of the thin film patterning device 201, cut along a plane passing through a line Q-Q in FIG. 16.

As illustrated in FIG. 16, the thin film patterning device 201 includes the laser processing device 210 (laser emitter) that scans a laser beam to remove a portion of a thin film formed on the substrate 11, the chamber unit 220 accommodating the thin film laminated substrate 110 (an intermediate product of the organic EL panel 10 in which the thin film to be processed is formed on the substrate), the vacuum pump 240 that evacuates the chamber unit 220 to a vacuum state, a substrate mover 230 that moves a table 227 of the chamber unit 220 in an H direction of FIG. 16 (X axis direction), a controller 250 that controls these, and the like.

(1) Laser Processing Device 210

Figure 17:
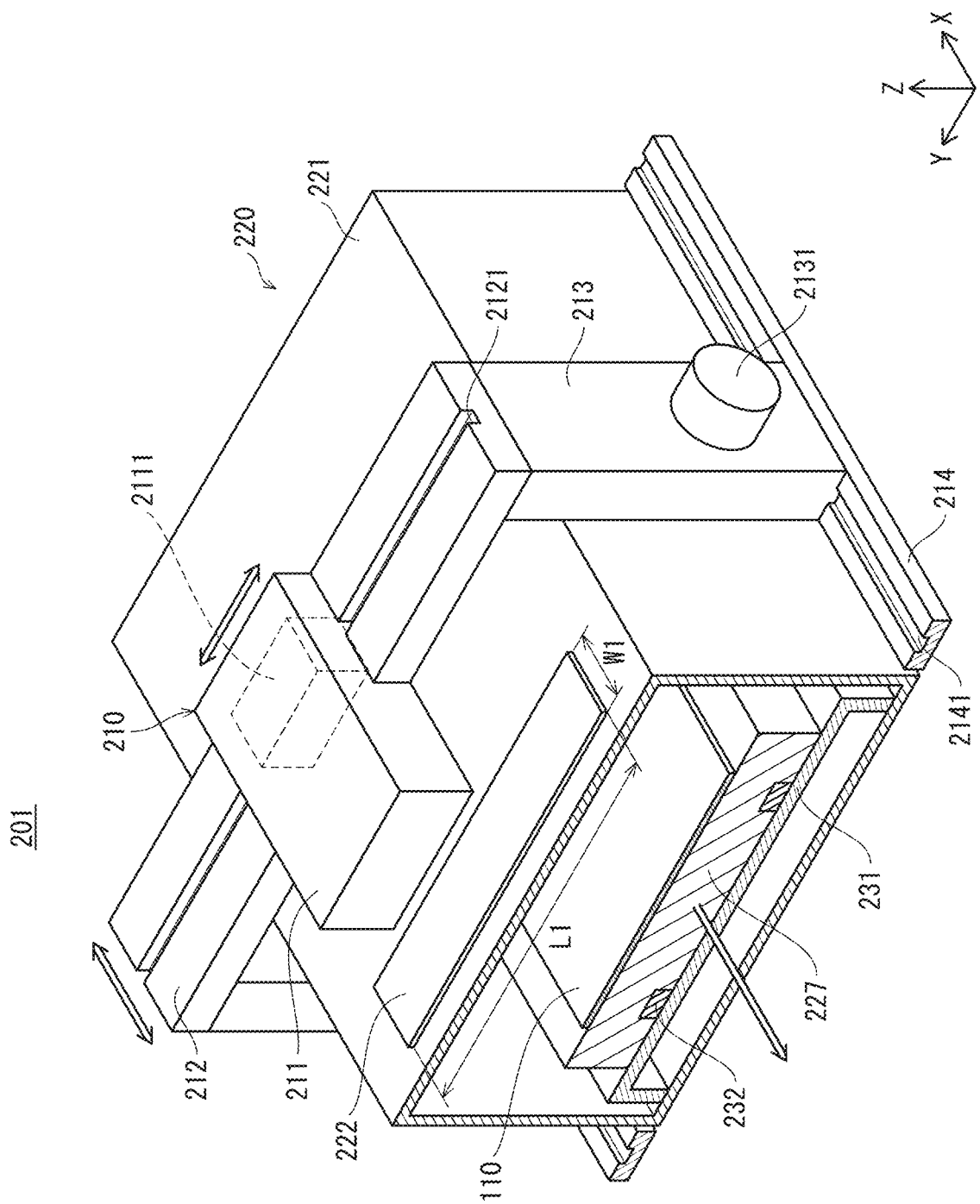
FIG. 17 is a perspective diagram of the thin film patterning device of FIG. 16, cut along a plane passing through a line Q-Q in FIG. 16.

As illustrated in the perspective view diagram of FIG. 17, the laser processing device 210 includes the laser head 211 incorporating a laser beam source and an optical system for convergence of a laser beam, the horizontal gantry 212 that holds the laser head 211 while allowing sliding in a direction parallel to the Y axis, the pair of the legs 213 that hold the horizontal gantry 212 at both end portions thereof in a longitudinal direction thereof, and the pair of the guide rails 214 that extend in the X axis direction and are disposed under the legs 213.

An example of the laser beam source in the laser head 211 is a YAG laser, but the laser beam source is not limited to this and may be any laser beam source that can generate a laser beam in a wavelength absorbed by a thin film to be processed.

Further, inside the casing of the laser head 211 is a drive source, for example the linear motor 2111, and through control of the drive source, the laser head 211 moves along the guide groove 2121 of the horizontal gantry 212 in the Y axis direction.

A drive source is provided in each of the legs 213, for example the servomotor 2131, and the legs 213 are synchronously driven through a known drive mechanism such as a screw feed mechanism or wire drive mechanism to move in the X axis direction along the guide grooves 2141 of the guide rails 214.

In FIG. 17, the guide rails 214 extend long in the X direction, but according to the present embodiment, a distance that at least allows movement of an irradiation position of the laser beam LB by a width W1 in the X direction of the window glass 226 is sufficient.

The controller 250 controls output of the laser beam source of the laser head 211, drives and controls the linear motor 2111 and the servomotors 2131, such that a laser beam emitted from the laser head 211 can be scanned across a processing target position of the thin film laminated substrate 110 for laser processing.

(2) Chamber Unit 220

Returning to FIG. 16, the vacuum chamber 221 of the chamber unit 220 has an opening in a top surface thereof, and the window glass 222 (light transmissive plate) having a flat shape is hermetically sealed to the opening through a sealing member (not illustrated).

The table 227 that has a top surface parallel to the main face of the window glass 222 is installed at a lower portion of the vacuum chamber 221, and the thin film laminated substrate 110 is placed on the table 227 with a surface to be processed facing upward, thereby keeping the window glass 222 and the thin film laminated substrate 110 parallel to each other.

The window glass 222 is a strip-shaped plate glass having a length L1 in a longitudinal direction (Y direction) that is longer than a length of the thin film laminated substrate 110 in the Y direction, and a width W1 in a short direction (X direction) that is considerably shorter than a length of the thin film laminated substrate 110 in the X direction; according to the present embodiment the width W1 is 30 mm, as an example.

Thus, surface area of the window glass 222 becomes significantly smaller than in the case illustrated in FIG. 14A and FIG. 14B and total weight of the window glass 222 decreases, and therefore a central portion of the window glass 222 does not bend downwards under its own weight, and the window glass 222 can maintain a shape parallel to the thin film laminated substrate 110. Thus, when the laser beam LB is emitted from the laser head 211 normal to the main surface of the window glass 222, there is no risk of the laser beam LB being refracted when passing through the window glass 222 such that the optical axis deviates, and a target position of the thin film to be processed can be accurately irradiated for processing.

As material of the window glass 222, it is beneficial to use quartz glass having a wide wavelength range of transmitted laser light and excellent durability.

(3) Substrate Mover 230

The substrate mover 230 includes a base 231 on which the table 227 is mounted so as to be movable in the X direction, guide rails 232 on a top surface of the base 231 that engage with grooves formed in a bottom face of the table 227 to guide the table 227 in the X direction, and a linear motor 233 that moves the table 227 in the X direction.

By moving the table 227 with the linear motor 233, an entire processing region of the thin film laminated substrate 110 in plan view can be sequentially exposed from the window glass 222.

(4) Vacuum Pump 240

The vacuum pump 240 evacuates air from the vacuum chamber 221, and maintains a defined vacuum state in the vacuum chamber 221.

(5) Controller 250

Figure 18:
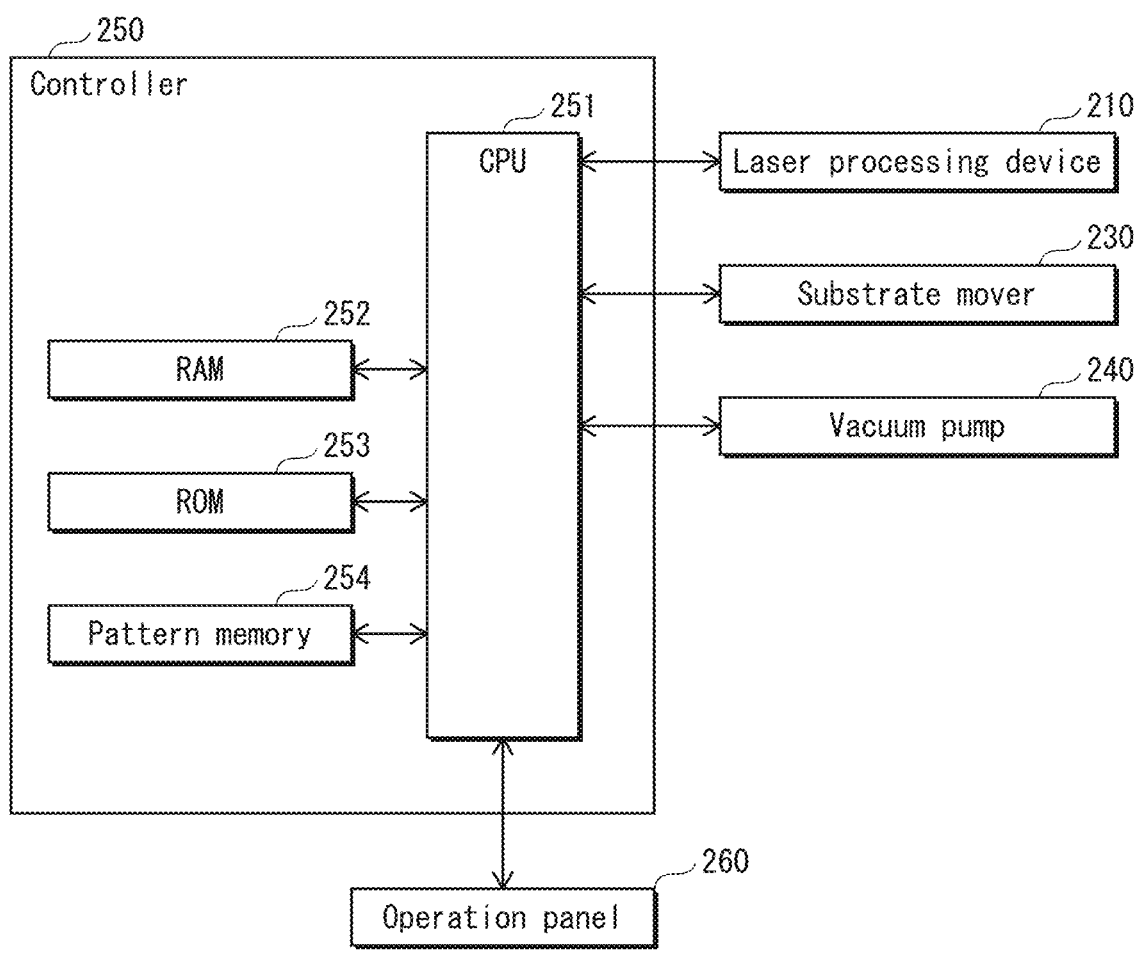
FIG. 18 is a block diagram illustrating structure of a controller of the thin film patterning device pertaining to Embodiment 2.

FIG. 18 is a block diagram illustrating structure of the controller 250.

As illustrated in FIG. 18, the controller 250 includes a central processing unit 251 (CPU), a random access memory 252 (RAM), a read only memory 253 (ROM), a pattern memory 254, and the like.

Upon startup, the CPU 251 accepts an operator's instruction from an operation panel 230, reads a patterning processing program from the ROM 253, executes the program using the RAM 252 as a working memory region, controls the laser processing device 210, the substrate mover 230, and the vacuum pump 240, and causes the thin film laminated substrate 110 to be irradiated by the laser beam in order that the electron transport layer 16 over the auxiliary electrodes 131 is removed.

Further, the controller 250 controls a substrate transport robot (not illustrated) in order to have the thin film laminated substrate 110, on which the thin film to be processed was formed in a device (for example, a vacuum deposition device) prior to the thin film patterning device 201, placed on a predefined position on the table 227 in the vacuum chamber 221, controls the vacuum pump 240 to create a vacuum state in the vacuum chamber 221, and the like. According to the present embodiment, "vacuum" is beneficially a high vacuum (about 0.00001 Pa) in order to prevent deterioration of properties of the organic EL panel 10. The surface area of the window glass 222 is made as small as described above, and therefore as long as the window glass 222 has an appropriate thickness, it will not bend even under high vacuum.

2. Method of Manufacturing Organic EL Panel 10

Structure of the organic EL panel 10 and structure of the organic EL elements 2 are the same as described with reference to FIG. 8 and FIG. 9, and are therefore not described again here.

Processes in the method of manufacturing the organic EL elements 2 are largely the same as those described with reference to drawings from FIG. 10A to FIG. 13, but formation of contact openings in step S6 of FIG. 13 (laser patterning processing) is different from that of Embodiment 1, and therefore this point is described below.

According to the present embodiment, contact opening formation is performed by removing the electron transport layer 16 on the auxiliary electrodes 131 by the thin film patterning device 201 illustrated in FIG. 16 to form the contact openings 161.

The thin film laminated substrate 110 (see FIG. 12A), is placed on a predefined position on the table 227 in the vacuum chamber 221 of the thin film patterning device 201 by a substrate transport robot (not illustrated), and the vacuum pump 240 is operated to evacuate interior of the vacuum chamber 221 to achieve a preset high vacuum state (0.00001 Pa).

Then, the laser processing device 210 is operated to scan the laser beam LB to remove the electron transport layer 16 on all of the auxiliary electrodes 131 above the substrate 11, forming the contact openings 161 (FIG. 12B).

Specifically, after causing the laser head 211 of the laser processing device 210 to move to a defined reference position (home position), the controller causes laser beam irradiation of the thin film laminated substrate 110 through the window glass 222, based on a program (pattern data) stored in advance in internal memory at a laser output and scanning speed that can selectively remove only the thin film to be processed. When processing is complete in a range of the width W1 of the window glass 222, the thin film laminated substrate 110 is moved by the substrate mover 230 in the H direction by the width W1 while the laser head 211 is returned to the reference position, and patterning is executed for the next processing region. By repeating such operations, patterning processing is performed on all processing regions of the thin film laminated substrate 110.

After the patterning processing is completed, the thin film laminated substrate 110 is taken out of the vacuum chamber 221 and transported to a next processing device by the substrate transport robot (not illustrated).

Thereafter, through common electrode formation (step S7 in FIG. 13) and sealing layer formation (step S8 in FIG. 13), the organic EL panel 10 having a laminated structure as illustrated in FIG. 9 can be obtained.

3. Summary of Effects of Embodiment 2

According to Embodiment 2, the following effects can be achieved.

In a display panel including an organic thin film, in particular an organic EL element panel, an organic thin film reacts with oxygen and moisture and therefore laser processing is also necessarily performed in a chamber under a sealed vacuum environment.

When a laser processing device is outside the chamber and patterning through scanning a substrate inside the chamber via window glass through which a laser beam is transmitted, an increase in organic EL display panel size means an increase in window size and weight, and this weight may cause bending of the window size, refraction of the laser beam, and deterioration in processing accuracy.

The window glass 222 is strip-shaped plate glass having a length in the longitudinal direction (Y direction) that is longer than length of the thin film laminated substrate 110 in the Y direction and a width in a short direction (X direction) that is considerably shorter than length of the thin film laminated substrate 110 in the X direction.

The thin film laminated substrate 110 is moved in the H direction by the substrate mover 230, and therefore, when viewed from the direction in which the laser beam is emitted (normal direction to the window glass 222 according to the present embodiment), all processing regions of the thin film laminated substrate 110 can be seen from the window glass 222, and therefore even with the window glass 222 having a small surface area, laser processing of all the processing regions of the thin film laminated substrate 110 is possible.

The surface area of the window glass 222 is reduced, and total weight is reduced, and therefore the central portion of the window glass does not bend downwards under its own weight and the entirety of the window glass 222 and the thin film laminated substrate 110 are maintained in parallel with each other.

Thus, when the laser beam LB is emitted from the laser head 211 normal to the main surface of the window glass 222, there is no risk of the laser beam LB being refracted when passing through the window glass 222 such that the optical axis deviates, and a target position of the thin film to be processed can be accurately irradiated for processing, which results in improved product quality.

Thus, according to at least one embodiment of the present disclosure, through use of laser processing for thin film patterning it is possible to greatly reduce the amount of processing when compared with a patterning method using a conventional photolithography or etching method, while also making it possible to manufacture a high quality organic EL display panel.

Further, merely by changing a program (pattern data) installed in a controller of the laser processing device 210, varied pattern forming can quickly be executed, and therefore there is no need for the labor and expense required to recreate masks for each design change as in conventional etching methods, thereby providing excellent on-demand flexibility.

Modifications of Embodiment 2

Embodiments of a patterning device and a patterning method have been described as aspects of the present disclosure, but the present disclosure is not limited to the description of Embodiment 2 beyond essential characteristic elements thereof. The following describes modifications of Embodiment 2 as further embodiments.

(1) Window Glass Material

According to at least one embodiment, quartz glass is described as being used as a material of the window glass 222 as quartz glass has good light transmission in a wide wavelength range and excellent durability, but depending on a wavelength range of a laser beam used, soda glass or a light transmissive resin such as acrylic may be used. A light transmissive resin plate has lower rigidity and bends more easily than glass, and therefore the effect obtained by making an opening area smaller is great, as described above.

(2) Modifications when Window Glass is Disposed in Multiple Locations

According to Embodiment 2, only one strip-shaped window glass 222 is provided, but a plurality of window glass panes may be provided as described below.

Modification 1

Figure 19:
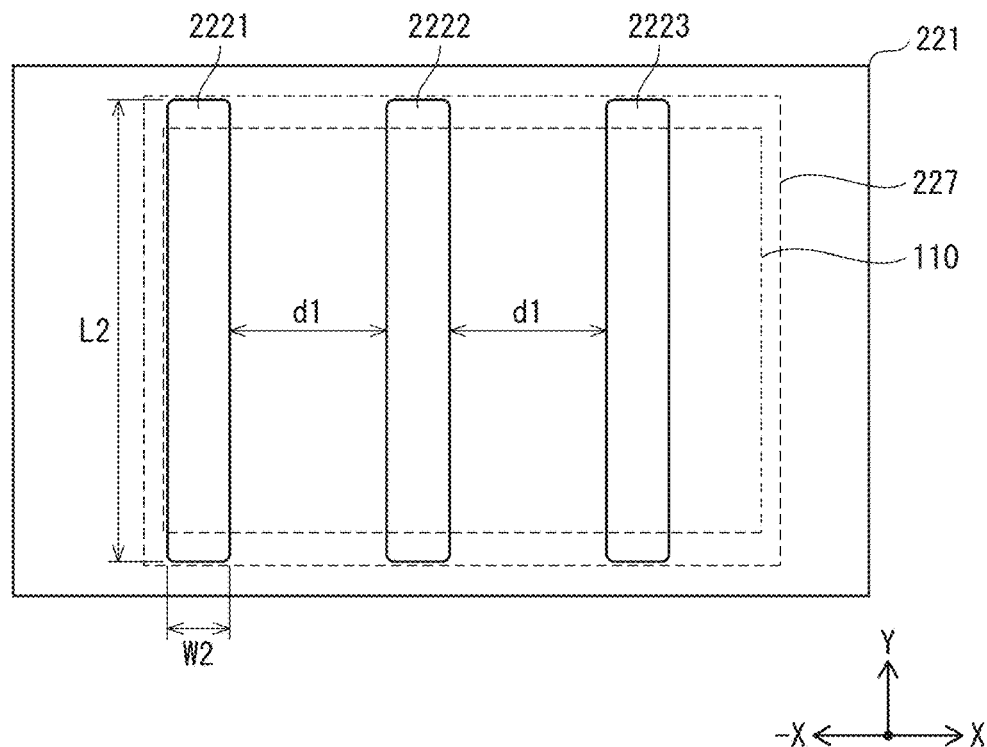
FIG. 19 is a plan view diagram illustrating Modification 1 of Embodiment 2 when panes of window glass are installed.

As illustrated in FIG. 19, three strip-shaped window glass panes 2221, 2222, 2223 each having a width W2 and a length L2 may be provided parallel to each other on a top surface of the vacuum chamber 221 with a defined interval dl between adjacent panes.

In such a case, for example, first, the thin film laminated substrate 110 is set in an initial position (position in FIG. 19), the laser processing device 210 scans and processes a range visible through the window glass panes 2221, 2222, 2223 with a laser beam, then the substrate mover 230 moves the thin film laminated substrate 110 by a distance W1 in the X direction, then by repeating a laser beam scanning operation in a range visible through the window glass panes 2221, 2222, 2223, patterning is executed with respect to all processing regions.

According to this modification, it suffices to move the thin film laminated substrate 110 by at most dl, and because it is unnecessary to move the thin film laminated substrate 110 in the X direction by substantially an entire length thereof, as in Embodiment 2, a movement distance of the substrate mover 230 can be made smaller and the vacuum chamber 221 made more compact.

A maximum interval between window glass panes can be narrowed as the number of strip-shaped window glass panes provided in parallel increases, and therefore a distance that the thin film laminated substrate 110 must be moved along the X direction in the vacuum chamber 221 is shortened accordingly, and the vacuum chamber 221 can be made more compact.

Modification 2

Figure 20:
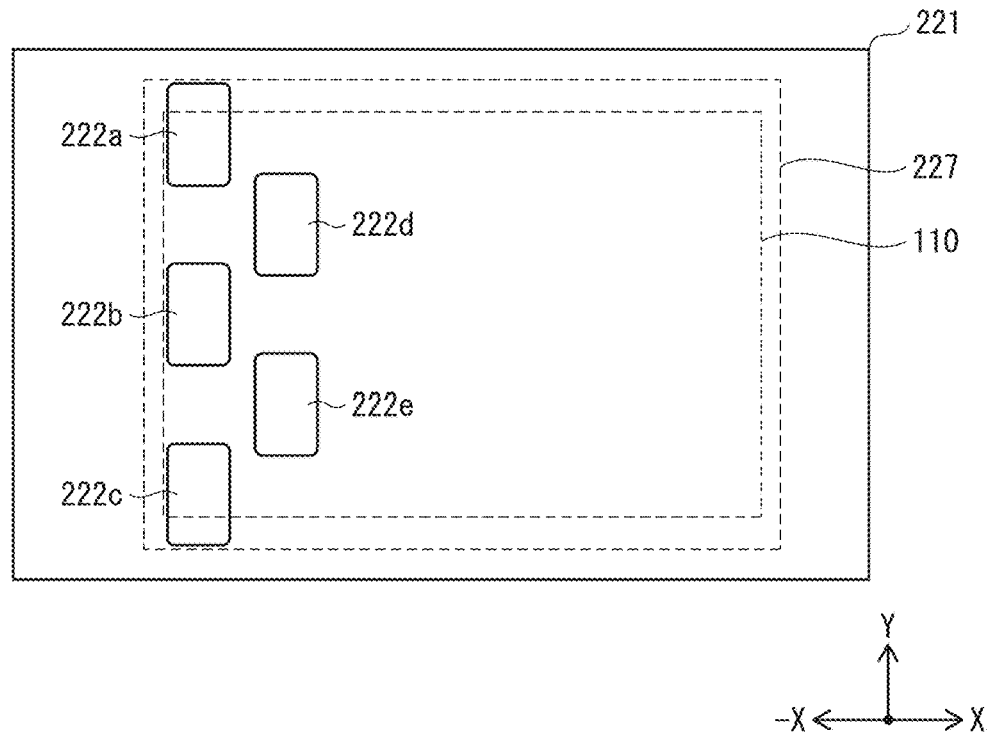
FIG. 20 is a plan view diagram illustrating Modification 2 of Embodiment 2 when panes of window glass are installed.

As illustrated in FIG. 20, laser processing of the entire processing region of the thin film laminated substrate is also possible when small window glass panes 222a, 222b, 222c, 222d, 222e are arranged in a staggered pattern on the top surface of the vacuum chamber 221, and the thin film laminated substrate 110 is moved by a defined amount by the substrate mover 230 while the laser processing device 210 scans a range visible through the window glass panes.

Modification 3

Figure 21:
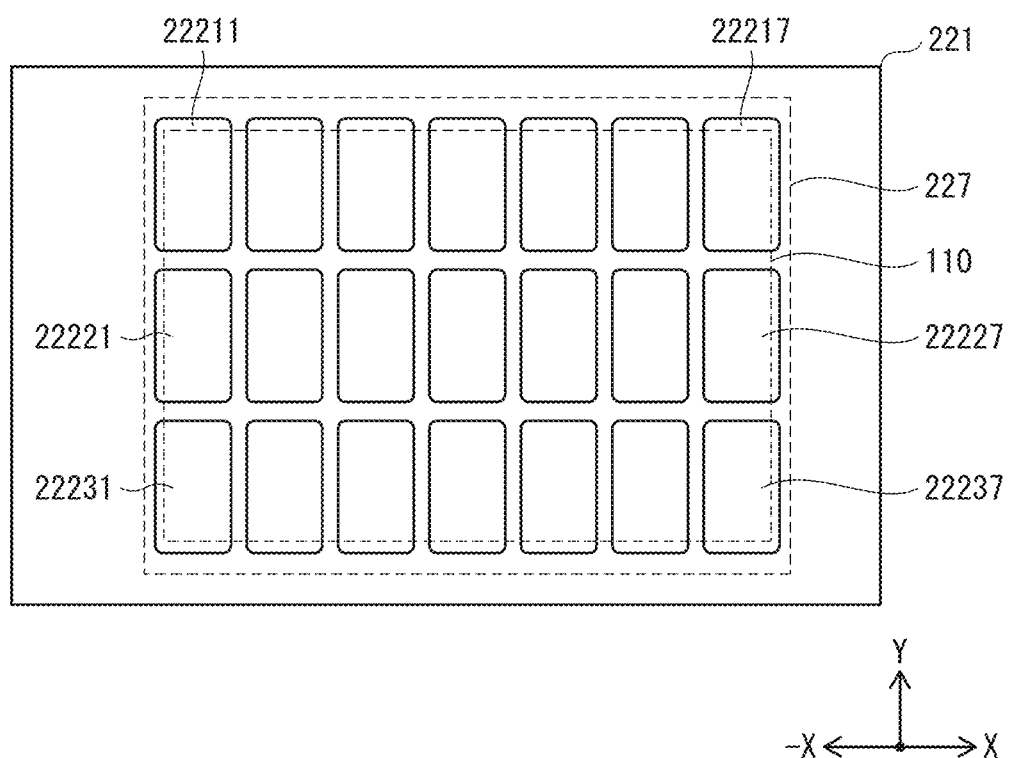
FIG. 21 is a plan view diagram illustrating Modification 3 of Embodiment 2 when panes of window glass are installed.

Further, as illustrated in FIG. 21, a plurality of small window glass panes from 22211 to 22237 may be provided in a matrix within a range including an entire processing region of the thin film laminated substrate 110.

In this case, in order to process the entire processing region of the thin film laminated substrate 110, the substrate mover 230 needs to be configured to move the thin film laminated substrate 110 in both the X direction and the Y direction, but since the interval between window glass panes is narrow, moving distance need not be large, and the vacuum chamber 221 can be made more compact.

According to at least one embodiment, the contact openings 161 are formed as groove shapes in a direction parallel to the banks 14 (column direction), but even if the contact openings 161 are not necessarily continuous in the column direction, as long as the auxiliary electrodes 131 are in contact with the common electrode 17 at defined intervals in the column direction, voltage drop of the common electrode 17 can be suppressed by the auxiliary electrodes 131, and therefore in such a case, it may be considered that removal of the electron transport layer on the auxiliary electrodes 131 just below frame portions between the glass window panes (also referred to as "lattice") in the column direction is not necessary, and it may not be necessary to move the thin film laminated substrate 110 in the Y direction.

Further, according to types of existing laser processing devices, it is possible to scan the laser beam at an angle through use of a galvanomirror (angle an emission direction of the laser beam), and therefore it is possible to perform laser processing of processing regions of the thin film laminated substrate 110 directly below the lattice according to a scanning direction of the laser beam by angling the laser beam through window glass adjacent to the lattice.

Of course, in such a case, the laser beam is incident at an angle to the normal line of the window glass, and therefore there is a problem of slight deviation of the axis of the laser beam due to refraction, and because the laser beam travels at an oblique angle through the window glass, output variation may occur, distance to a processing target position changes, and a convergence position of the laser beam may shift. However, according to the present disclosure, the size of each window glass can be reduced and the window glass does not bend irregularly under its own weight, and therefore if errors due deflection of the laser beam are predicted in advance so as to correct for laser beam output, deflection angle, etc., processing accuracy may not deteriorate too much.

Further, as a special case, in order to increase productivity, when a large number of small display panels (also referred to as "unit panels") are to be made from one large substrate, as long as the position and size of each of the window glass panes from 22211 to 22237 is set in accordance with a formation range of each unit panel on the substrate 11, the thin film laminated substrate 110 need not be moved by the substrate mover 230, and therefore the substrate mover 230 may be omitted.

(III) Embodiment 3

<<Background to Embodiment 3 of Present Disclosure>>

An organic EL display panel has a laminated structure in which a pixel electrode, an organic layer (including a light emitting layer), and a common electrode are laminated in this order on a substrate. In many cases, the common electrode is formed over an entirety of an image display region on the substrate.

In particular, in a top emission type of organic EL display panel, a light transmissive material is used for the common electrode, and therefore electrical resistance is high, voltage drop varies depending on distance of each organic EL element from a power supply portion (not illustrated) disposed at a peripheral portion of the substrate, and as a result, there is a risk that variation in luminescence may occur in the display.

In order to avoid such variance in luminescence, an auxiliary electrode made of an electrically conductive material such as a metal is disposed on the substrate, and by electrically connecting the auxiliary electrode and the common electrode, voltage drop in the common electrode is suppressed.

As illustrated in FIG. 1A, the pixel electrodes 713 are formed for each sub pixel of an organic EL element on the substrate 711, the auxiliary electrode 731 is formed that extends in the Y-axis direction, and the light emitting layers 715 partitioned by the banks 714 are disposed above the pixel electrodes 713.

Subsequently, the electron transport layer 716 is formed to be continuous across the banks 714, the light emitting layers 715, and the auxiliary electrodes 731 (FIG. 1B). Subsequently, a process is performed of removing the electron transport layer 716 on the auxiliary electrodes 731 to form contact openings for connection to a common electrode, but as described above, a patterning method combining photolithography and etching inevitably increase takt time and manufacturing costs, and therefore the inventors of the present application considered adopting a method of scanning a laser beam to sublimate and remove the electron transport layer 716 on the auxiliary electrodes 731 (laser patterning method) (see FIG. 1C).

When the common electrode 717 is laminated after the contact opening is formed, the common electrode 717 and the auxiliary electrodes 731 are in direct contact with each other, and therefore voltage drop in the common electrode 717 is greatly suppressed, and occurrence of luminance unevenness and the like can be prevented (FIG. 1D).

It is known that properties of various organic materials forming an organic EL display panel deteriorate due to the influence of oxygen and moisture in air, and therefore the laser patterning method described above is beneficially performed in a vacuum.

Figure 22A:
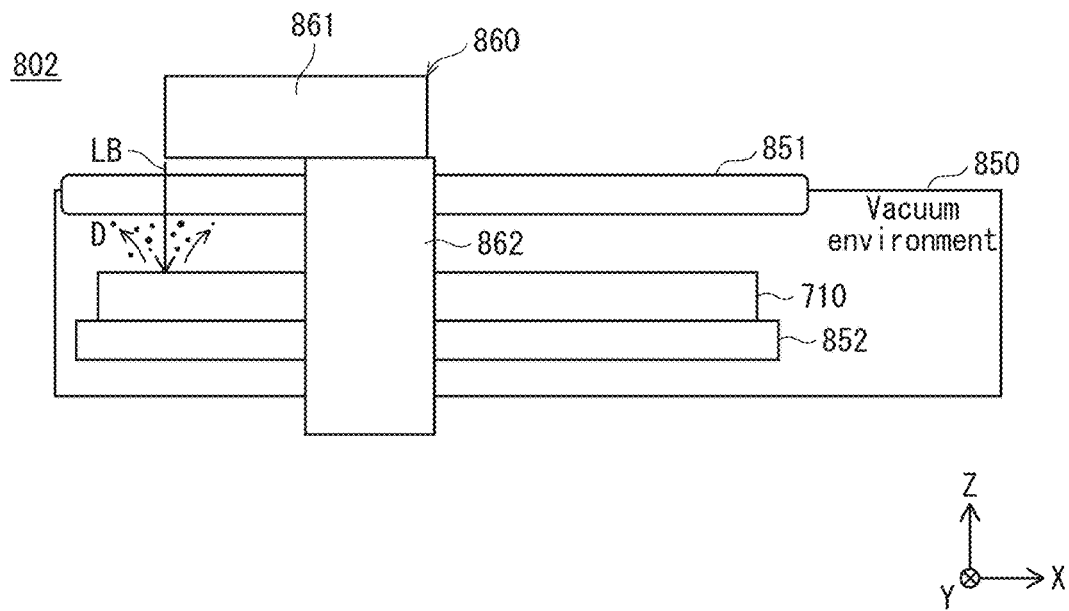
FIG. 22A and FIG. 22B are a schematic side-view diagram and a schematic plan view diagram, respectively, illustrating a thin film patterning device example for explaining background of Embodiment 3, which is an embodiment of the present disclosure.
Figure 22B:
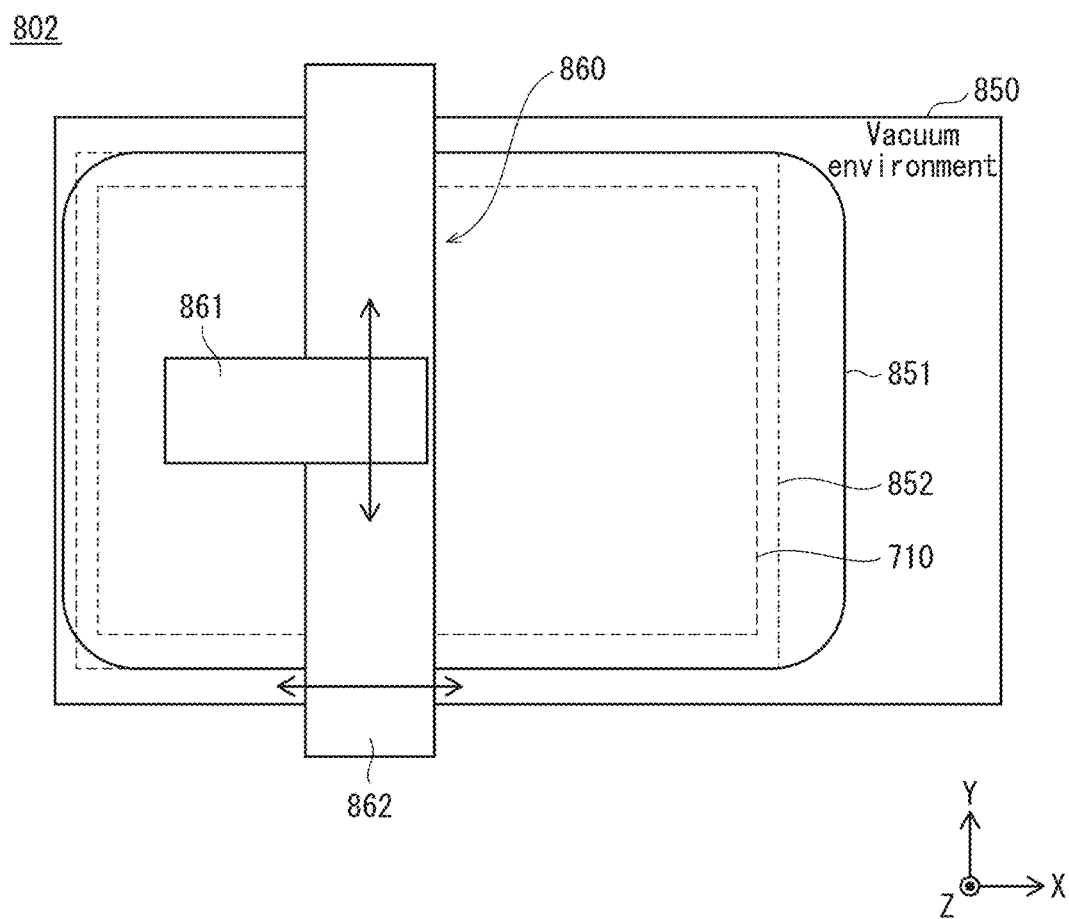

FIG. 22A is a schematic side view diagram illustrating structure of a patterning device 802 posited as an example for such a case, and FIG. 22B is a plan view diagram of same.

As illustrated in FIG. 22A, the patterning device 802 includes the laser processing device 860 and the vacuum chamber 850 in which the flat window glass 851 is mounted in a position facing the laser processing device 860. The laser processing device 860 includes the laser head 861 that emits a laser beam and can scan the laser beam by moving the laser head 861 in the X axis direction and the Y axis direction of FIG. 22A.

The intermediate product 710 of the organic EL display panel formed as far as the electron transport layer 716 on the substrate 711 is conveyed into the vacuum chamber 850, which is depressurized by a vacuum pump (not illustrated) to create a vacuum. The laser beam LB is emitted by the laser processing device 860, transmitted through the window glass 851, and sublimates/removes the electron transport layer 716 on the auxiliary electrodes 731.

However, with an apparatus such as the patterning device 802, it was found that processing accuracy deteriorates and a completed organic EL display panel may have variations in durability and variations in light emission efficiency for each organic EL element. The following can be considered as possible causes.

First is a problem of component accuracy of the window glass 851. It is costly to manufacture a glass plate that is perfectly uniform in thickness and has excellent flatness, and even if manufacture of such a glass plate is possible, changes over time due to the environment and weight of the window glass 851 may cause slight bending and distortion thereof.

In such cases, a laser beam transmitted through the window glass 851 is slightly shifted from a target irradiation position. In a high definition organic EL panel, precision in the order of several micrometers is required, so if a laser beam irradiation position is shifted even slightly, image quality deteriorates.

Second, a resin material constituting the election transport layer 716 is sublimated by the laser beam and scatters in the vacuum chamber 850, but scattered material (debris) D contacts and solidifies on the window glass 851, adhering to the window glass 851, lowering transmittance of the laser beam LB through the window glass 851, deteriorating processing precision, and in a worst case making processing impossible.

Further, debris that does not reach the window glass 851 eventually falls down and adheres to a surface of the electron transport layer 716. When such foreign matter remains on the electron transport layer 716, there is a risk of defects being generated in the common electrode 717 and sealing layer subsequently laminated, allowing moisture or the like to intrude from outside, which may result in deterioration of light emission properties of an organic EL element and dark spot occurrence.

The inventors of the present application conducted extensive research into a laser patterning method for thin film patterning that reduces manufacturing time and cost while overcoming the problems described above to make manufacture of a high quality organic EL display possible, and arrived at Embodiment 3 of the present disclosure.

Embodiment 3

Hereinafter, an organic EL display panel patterning device and patterning method pertaining to Embodiment 3, which is an embodiment of the present disclosure, are described with reference to the drawings. For convenience of explanation, drawings may be schematic, and are not necessarily to scale.

1. Structure of Thin Film Patterning Device 202

Figure 23:
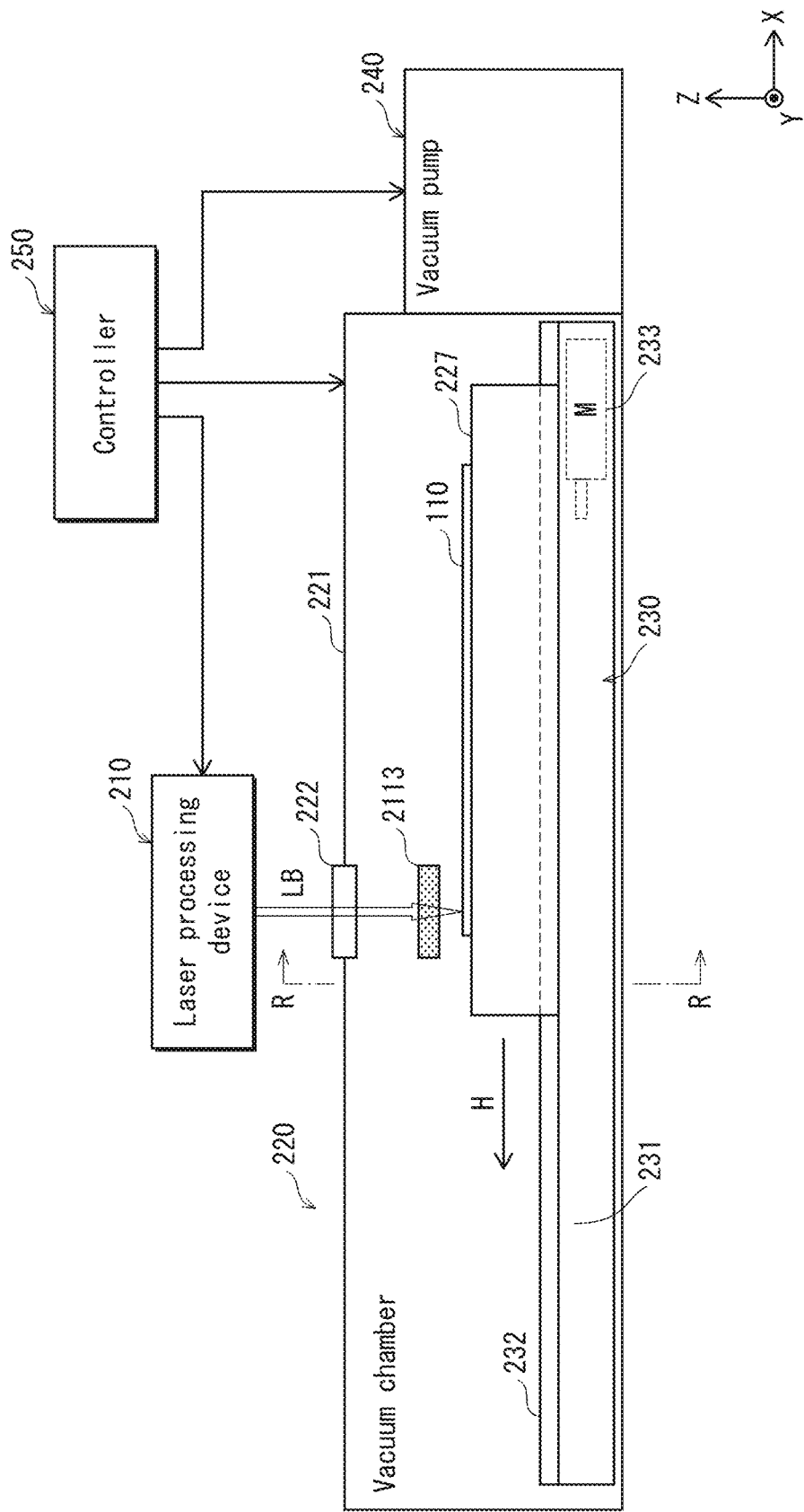
FIG. 23 is a schematic side-view diagram illustrating structure of a thin film patterning device pertaining to Embodiment 3, which is an embodiment of the present disclosure.

FIG. 23 is a schematic diagram illustrating structure of a thin film patterning device 202 in an organic EL display panel manufacturing device. Further, FIG. 24 is a perspective diagram of the thin film patterning device 202, cut along a plane passing through a line R-R in FIG. 23.

As illustrated in FIG. 23, the thin film patterning device 202 includes the laser processing device 210 (laser emitter) that scans a laser beam to remove a portion of a thin film formed on the substrate 11, the chamber unit 220 accommodating the thin film laminated substrate 110, the substrate mover 230 that moves the table 227 of the chamber unit 220 in the H direction of FIG. 23 (X axis direction), the vacuum pump 240 that evacuates the chamber unit 220 to a vacuum state, the controller 250 that controls these, and the like.

(1) Laser Processing Device 210

Figure 24:
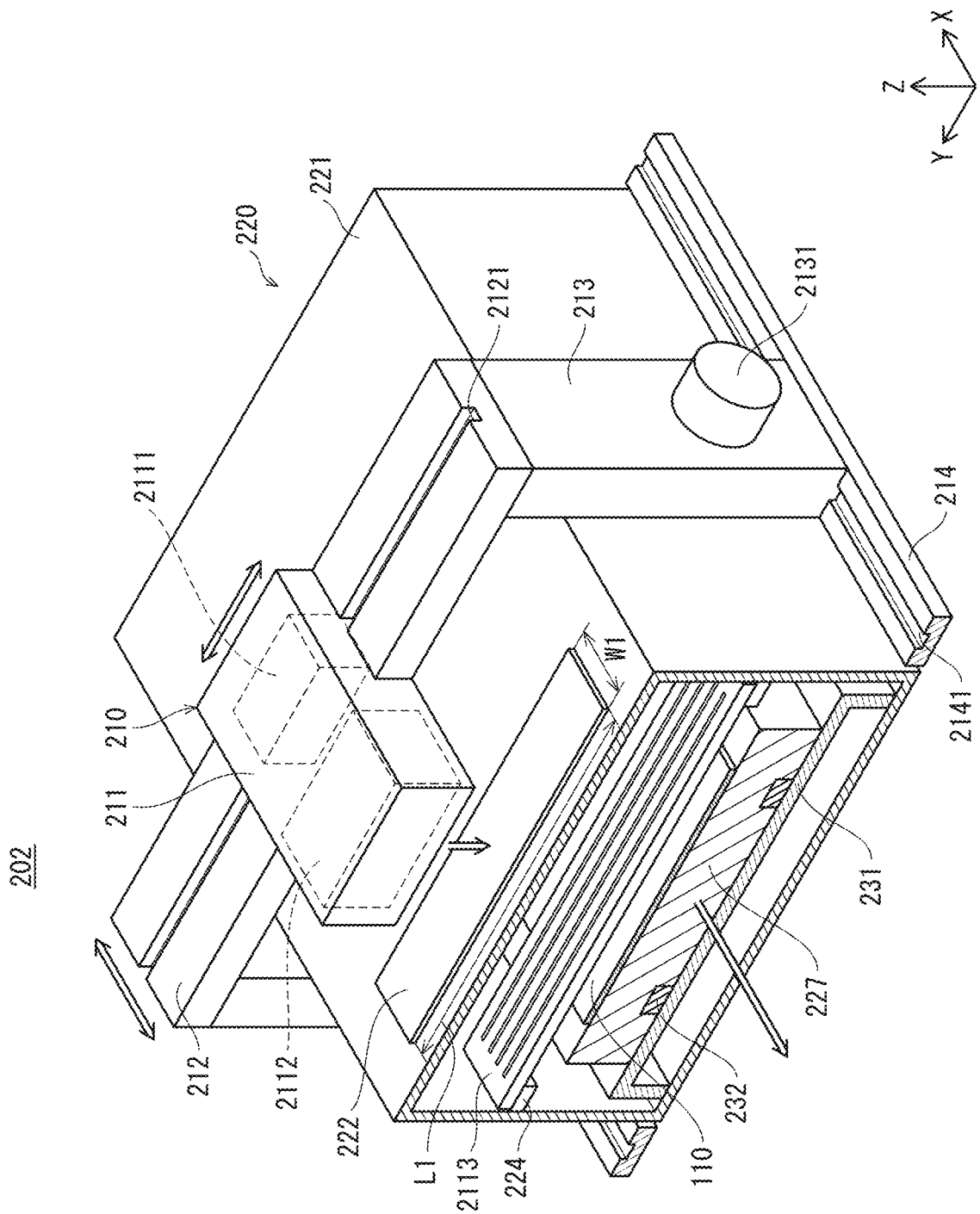
FIG. 24 is a perspective diagram of the thin film patterning device of FIG. 23, cut along a plane passing through a line R-R in FIG. 23.

As illustrated in FIG. 24, the laser processing device 210 includes the laser head 211 incorporating a laser oscillator 2112 (including an optical system for converging the laser beam), the horizontal gantry 212 that holds the laser head 211 while allowing sliding in the direction parallel to the Y axis, the pair of the legs 213 that hold the horizontal gantry 212 at both end portions thereof in a longitudinal direction thereof, and the pair of the guide rails 214 that extend in the X axis direction and are disposed under the legs 213.

An example of the laser oscillator 2112 in the laser head 211 is a YAG laser, but the laser oscillator is not limited to this and may be any laser beam source that can generate a laser beam in a wavelength absorbed by a thin film to be processed.

Further, inside the casing of the laser head 211 is a drive source, for example the linear motor 2111, and through control of the drive source, the laser head 211 moves along the guide groove 2121 of the horizontal gantry 212 in the Y axis direction.

A drive source is provided in each of the legs 213, for example the servomotor 2131, and the legs 213 are synchronously driven through a known drive mechanism such as a screw feed mechanism or wire drive mechanism to move in the X direction along guide grooves 2141 of the guide rails 214.

A controller 250 controls output of the laser beam source of the laser head 211 and controls drive of the linear motor 2111 and the servomotors 2131 so that a laser beam emitted from the laser head 211 scans a position to be processed of the thin film laminated substrate 110 to perform laser processing.

(2) Chamber Unit 220

In FIG. 23, the vacuum chamber 221 of the chamber unit 220 has an opening in a top surface thereof, and the window glass 222 (light transmissive plate) having a flat shape is hermetically sealed to the opening through a sealing member (not illustrated).

The table 227 that has a top surface parallel to the main face of the window glass 222 is installed at a lower portion of the vacuum chamber 221, and the thin film laminated substrate 110 is placed on the table 227 with a surface to be processed facing upward, thereby keeping the window glass 222 and the thin film laminated substrate 110 parallel to each other.

As illustrated in FIG. 24, the window glass 222 is a strip-shaped plate glass having a length L1 in the longitudinal direction (Y direction) that is longer than length of the thin film laminated substrate 110 in the Y direction and a width W1 in a short direction (X direction) that is considerably shorter than length of the thin film laminated substrate 110 in the X direction. According to the present embodiment, the width W1 is 30 mm.

Thus, surface area of the window glass 222 becomes significantly smaller than in the case illustrated in FIG. 22A and FIG. 22B and total weight of the window glass 222 decreases, and therefore a central portion of the window glass 222 does not bend downwards under its own weight, and the window glass 222 can maintain a shape parallel to the thin film laminated substrate 110. Thus, when the laser beam LB is emitted from the laser head 211 normal to the main surface of the window glass 222, the risk of the laser beam LB being refracted when passing through the window glass 222 such that the optical axis deviates is reduced.

A patterning mask 2113 is disposed between the window glass 222 and the table 227 on which the thin film laminated substrate 110 is placed, at a position separated from the thin film laminated substrate 110 by a defined distance.

Figure 25:
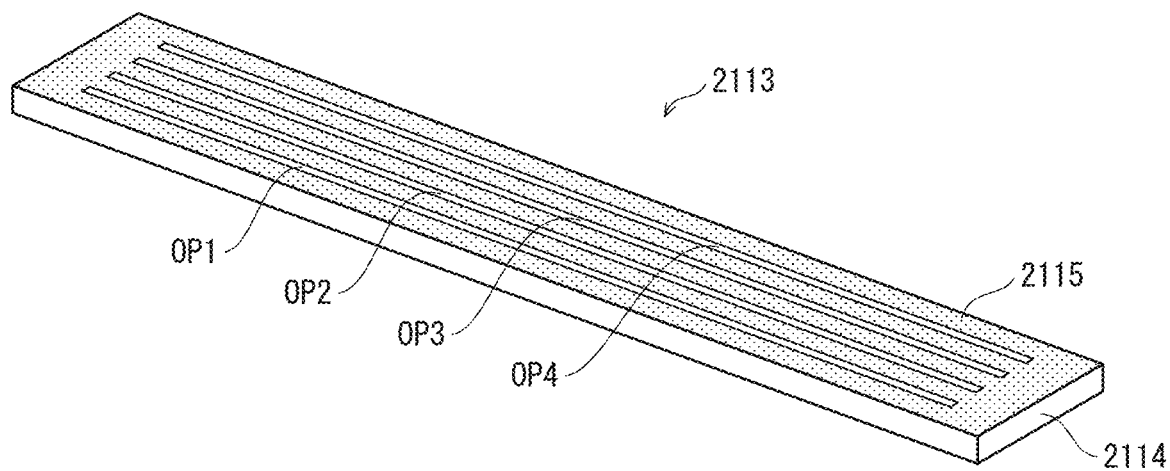
FIG. 25 is a schematic perspective view diagram illustrating shape of a patterning mask in a thin film patterning device pertaining to Embodiment 3.

FIG. 25 is a perspective view diagram illustrating an example of the patterning mask 2113. The patterning mask 2113 is formed, for example, by depositing a light shielding metal such as chromium on a top surface of a strip-shaped flat plate light transmissive base 2114 made of quartz glass to form a metal film 2115, then patterning by performing photolithography using a resist film and etching to form four parallel linearly shaped light transmitting patterns OP1, OP2, OP3, OP4 in the metal film 2115.

The light transmitting patterns OP1 to OP4 are all formed to have the same shape and are arranged at an equal pitch. The pitch is the same distance in the X direction of the pattern to be processed (according to the present embodiment, the distance in the X direction between the auxiliary electrodes 131), or N times the distance (where N is an integer and 2 or greater).

The patterning mask 2113 is mounted on supporting plates 224 provided on the interior of the vacuum chamber 221 (see FIG. 24), such that a main surface of the patterning mask 2113 is parallel to the main surface of the window glass 222.

Thus, the window glass 222, the patterning mask 2113, and the thin film laminated substrate 110 are all parallel to each other, and therefore by emitting the laser beam LB from the laser head 211 perpendicular to the main surface of the window glass 222, the risk of the laser beam LB being refracted in transmission through the window glass 222 and the patterning mask 2113 and the optical axis thereof being shifted is reduced.

Even if the window glass 222 is deformed or distorted such that the optical axis of the laser beam LB shifts to some extent, the laser beam LB passes through the light transmissive pattern of the patterning mask 2113 and therefore irradiates a correct position of the thin film laminated substrate 110, thereby maintaining processing accuracy.

The number and shape of light transmissive patterns formed in the patterning mask 2113 may be appropriately modified according to shape and specification of a pattern to be processed.

As material of the window glass 222, it is beneficial to use quartz glass having a wide wavelength range of transmitted laser light and excellent durability.

(3) Substrate Mover 230

The substrate mover 230 includes the base 231 on which the table 227 is mounted so as to be movable in the X direction, the guide rails 232 on a top surface of the base 231 that engage with grooves formed in the bottom face of the table 227 to guide the table 227 in the X direction, and the linear motor 233 that moves the table 227 in the X direction.

By moving the table 227 with the linear motor 233, an entire processing region of the thin film laminated substrate 110 in plan view can be sequentially exposed from the window glass 222.

(4) Vacuum Pump 240

The vacuum pump 240 evacuates air from the vacuum chamber 221, and maintains a defined vacuum state in the vacuum chamber 221.

(5) Controller 250

The structure of the controller 250 is the same as that illustrated in the block diagram of FIG. 18, described with reference to Embodiment 2, and is therefore not described again here.

The controller 250 causes the thin film laminated substrate 110 on which a thin film to be processed is formed in a device (for example, a vacuum deposition device) prior to the thin film patterning device 202 to be loaded via a substrate loading port (not illustrated) by a substrate transport robot (not illustrated) and placed in a predefined position on the table 227 in the vacuum chamber 221.

Then the interior of the vacuum chamber 221 is depressurized to a vacuum by the vacuum pump 240. For example, a high vacuum at $10^{-3}$ Pa to $10^{-5}$ Pa is beneficial in order to prevent degradation of properties of the organic EL panel 10. The surface area of the window glass 222 is made small as described above, and therefore as long as the window glass 222 has an appropriate thickness, it will not bend even under high vacuum.

Next, the controller 250 causes the laser head 211 to be moved to a reference position (home position) and subsequently causes patterning of the thin film laminated substrate 110 through laser beam emission, based on a program (pattern data) stored in advance in internal storage memory, at a laser output and scanning speed that selectively removes only the thin film to be processed.

After completion of the patterning processing, the thin film laminated substrate 110 and the patterning mask 2113 are taken out of the vacuum chamber 221 by the substrate transport robot, and the thin film laminated substrate 110 is transported to a next processing device while the patterning mask 2113 is transported to a collection point where it may be washed for reuse or disposed of. When a next thin film laminated substrate 110 is transported into the vacuum chamber 221, a new patterning mask 2113 is also installed.

The patterning mask 2113 may be exchanged each time patterning processing of one thin film laminated substrate 110 is performed, or may be periodically exchanged after patterning processing of N thin film laminated substrates 110 (where N is an integer and is 2 or greater). In the latter case, the value of N is an appropriate value such that exchanging occurs before debris adhesion to the patterning mask 2113 causes transmittance of laser light to deteriorate beyond an allowable range, and the value may be determined in advance by experiment or the like.

BRIEF SUMMARY (a) According to the thin film patterning device 202 pertaining to at least one embodiment of the present disclosure, the substrate mover 230 can move the thin film laminated substrate 110 in the X direction while patterning processing is performed, and therefore width in the X direction of the window glass 222 need only be a width to allow a laser beam to pass through, and weight is made lighter such that risk of the window glass 222 bending under its own weight is low, and therefore even if there is slight variation in thickness of a glass plate used for the window glass 222, positional deviation of a laser beam when transmitted therethrough can be minimized (b) For example, even if the window glass 222 is deformed or distorted and the optical axis of a laser beam transmitted therethrough shifts somewhat, by setting laser beam diameter slightly larger than an opening width of each of the transmission patterns OP1 to OP4 formed in the patterning mask 2113 while setting a distance between the patterning mask 2113 and the thin film laminated substrate 110 relatively short, a beam that is transmitted through each of the transmission patterns can be made to irradiate a target position of the thin film laminated substrate 110, and processing accuracy is not greatly impaired.

(c) A component of a thin film is sublimed by laser beam irradiation such that debris scatters, but the debris is cooled and solidified by contact with the patterning mask 2113, such that most debris adheres to a bottom surface of the patterning mask 2113.

The patterning mask 2113 is slightly spaced away from the top surface of the thin film laminated substrate 110, and therefore scattered debris filling a tiny space surrounded by the banks 14 and the patterning mask 2113 to reattach to the auxiliary electrodes 131 and the like does not occur.

(d) Further, the patterning mask 2113 is installed at a position closer to the thin film laminated substrate 110 than the window glass 222, and therefore a situation where a portion of scattered debris D does not reach the window glass 222, falls down, and reattaches to the thin film laminated substrate 110 can be avoided.

In order to fully exhibit effects (b) to (d), it is beneficial that the distance between the patterning mask 2113 and the thin film laminated substrate 110 is from 1 mm to 10 mm.

When less than 1 mm, space for scattering is limited and there is a risk of debris that does not scatter from a space between the banks 14 of the thin film laminated substrate 110 remaining, and when greater than 10 mm, there is a risk that a laser beam irradiation position corrected by the patterning mask 2113 may not be kept within a tolerance range, and that some debris may fail to reach the patterning mask 2113, fall down, and reattach to the thin film laminated substrate 110.

2. Method of Manufacturing Organic EL Panel 10

Structure of the organic EL panel 10 and structure of the organic EL elements 2 are the same as described with reference to FIG. 8 and FIG. 9, and are therefore not described again here.

Processes in the method of manufacturing the organic EL elements 2 are largely the same as those described with reference to drawings from FIG. 10A to FIG. 13, but formation of contact openings in step S6 of FIG. 13 (laser patterning processing) is different from that of Embodiment 1, and therefore this point is described below.

According to the present embodiment, contact opening formation is performed by removing the electron transport layer 16 on the auxiliary electrodes 131 by the thin film patterning device 202 illustrated in FIG. 23 to form the contact openings 161.

The thin film laminated substrate 110 (see FIG. 12A) is placed on a predefined position on the table 227 in the vacuum chamber 221 of the thin film patterning device 202 by a substrate transport robot, and the vacuum pump 240 is operated to evacuate the interior of the vacuum chamber 221 to achieve the high vacuum state described above.

Then, the laser processing device 210 is operated to scan the laser beam LB to remove the electron transport layer 16 on all of the auxiliary electrodes 131 above the substrate 11, forming the contact openings 161 (FIG. 12B).

Specifically, after causing the laser head 211 of the laser processing device 210 to move to a defined reference position (home position), the controller causes laser beam irradiation of the thin film laminated substrate 110 through the window glass 222 and the patterning mask 2113, based on a program (pattern data) stored in advance in internal memory at a laser output and scanning speed that can selectively remove only the thin film to be processed. When processing is complete in a range of the width W1 of the window glass 222, the thin film laminated substrate 110 is moved by the substrate mover 230 in the H direction by a defined amount while the laser head 211 is returned to the reference position, and patterning is executed for the next processing region. By repeating such operations, patterning processing is performed on all processing regions of the thin film laminated substrate 110.

After the patterning processing is completed, the thin film laminated substrate 110 is taken out of the vacuum chamber 221 and transported to a next processing device by the substrate transport robot.

Thereafter, through common electrode formation (step S7 in FIG. 13) and sealing layer formation (step S8 in FIG. 13), the organic EL panel 10 having a laminated structure as illustrated in FIG. 9 can be obtained.

4. Summary of Effects of Embodiment 3

According to Embodiment 3, the following effects can be achieved.

(1) In a display panel including an organic thin film, in particular an organic EL panel, an organic thin film reacts with oxygen and moisture and therefore laser processing is also necessarily performed in a chamber under a sealed vacuum environment. Laser processing devices are relatively large in size, and therefore a configuration is used in which the laser processing device is outside the chamber and a thin film formed on a substrate inside the chamber is irradiated and processed via window glass through which a laser beam is transmitted. However, if the window glass deforms or bends, accurate processing by the laser beam will be adversely affected.

However, according to at least one embodiment of the present disclosure, a patterning mask is disposed between the window glass and the thin film laminated substrate, and therefore even if an irradiation position of the laser beam is slightly shifted, the laser beam irradiates a correct position of the thin film laminated substrate due to the laser beam being transmitted through the light transmitting pattern of the patterning mask, and therefore processing accuracy can be maintained.

(2) Further, when an organic thin film of a thin film laminated substrate melted by a laser beam becomes debris, is scattered in a chamber, and solidifies and attaches to the window glass, the laser beam becomes unable to sufficiently penetrate the window glass. However, according to at least one embodiment of the present disclosure, the patterning mask is closer to the substrate than the window glass, and therefore debris scattered upwards mostly adheres to the patterning mask, the probability of reattachment onto the thin film of the substrate is significantly reduced, and deterioration of quality of the organic EL display panel can be prevented.

The patterning mask is entirely within the vacuum chamber and does not receive the pressing force of atmospheric pressure, unlike the window glass, and therefore a rigidity as great as that of the window glass is not required and a relatively cheap glass plate can be used when compared to that of the window glass. Further, the patterning mask is simply placed on supporting plates in the vacuum chamber so can be exchanged freely. By transporting the substrate and the patterning mask together using the substrate transport robot, there is no need to interrupt a manufacturing line for a long period for maintenance of the thin film patterning device, leading to excellent productivity.

Further, if the patterning mask is removed from the vacuum chamber after each thin film processing, or after several such processes, for example if a dedicated washing machine is prepared to clean the patterning mask for reuse, processing becomes more economical.

Thus, according to at least one embodiment of the present disclosure, through use of laser processing for thin film patterning it is possible to greatly reduce the amount of processing when compared with a patterning method using a conventional photolithography or etching method, while also reducing adverse effects of debris, making maintenance easier, and making it possible to manufacture a high quality organic EL display panel.

Such effects are not limited to organic EL panels, but can also be obtained in manufacture of other display panels in which a plurality of thin films including an organic film are laminated.

Modifications of Embodiment 3

Embodiments of a patterning device and a patterning method have been described as aspects of the present disclosure, but the present disclosure is not limited to the description of Embodiment 3 beyond essential characteristic elements thereof. The following describes modifications of Embodiment 3 as other embodiments.

(1) According to Embodiment 3, scanning of the laser beam in the Y direction (first direction) depends only on movement of the laser head 211 along the guide groove 2121, but instead or in addition to this, a scanning mechanism using a galvanomirror (galvanoscanner mechanism) may be adopted.

Figure 26A:
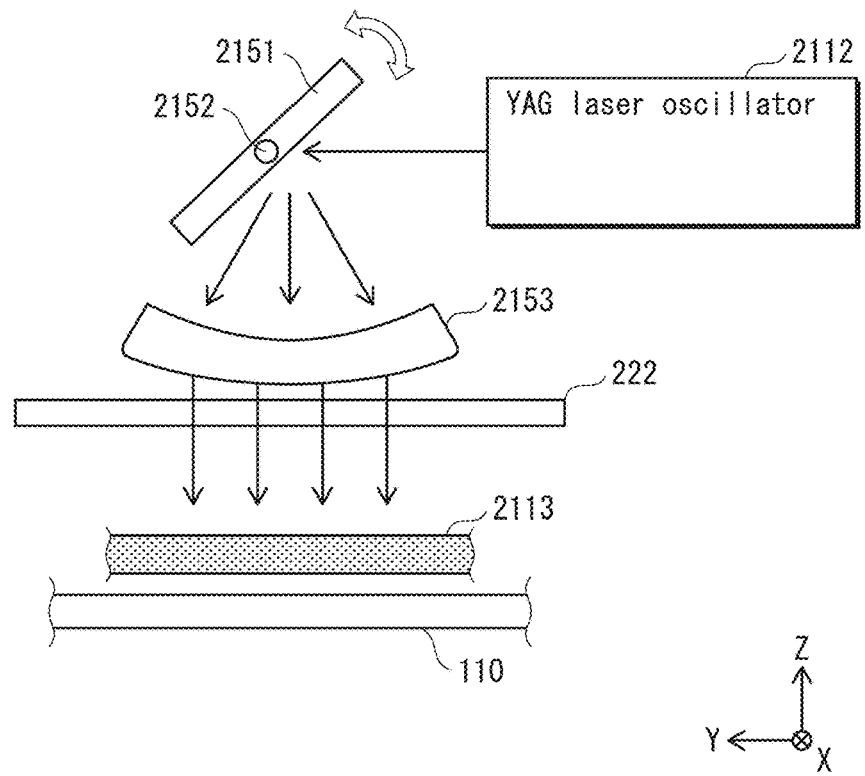
FIG. 26A is a schematic diagram illustrating an example when a galvanoscanner mechanism is used as a laser beam source of a thin film patterning device pertaining to Embodiment 3.

FIG. 26A is a diagram schematically illustrating structure of a galvanoscanner mechanism A laser beam emitted from the YAG laser oscillator 2112 is deflected by a reflective surface of a galvanomirror 2151 rotating about a shaft 2152 according to a motor (galvanomotor; not illustrated) and is converted into parallel light by an fθ lens 2153 to scan the thin film laminated substrate 110 in the Y direction via the patterning mask 2113. Thus, scanning speed of the laser beam is significantly increased, and takt time can be reduced. If another galvanomirror is prepared to change an angle about an axis perpendicular to the shaft 2152, it is also possible to perform scanning in the X direction at the same time.

Figure 26B:
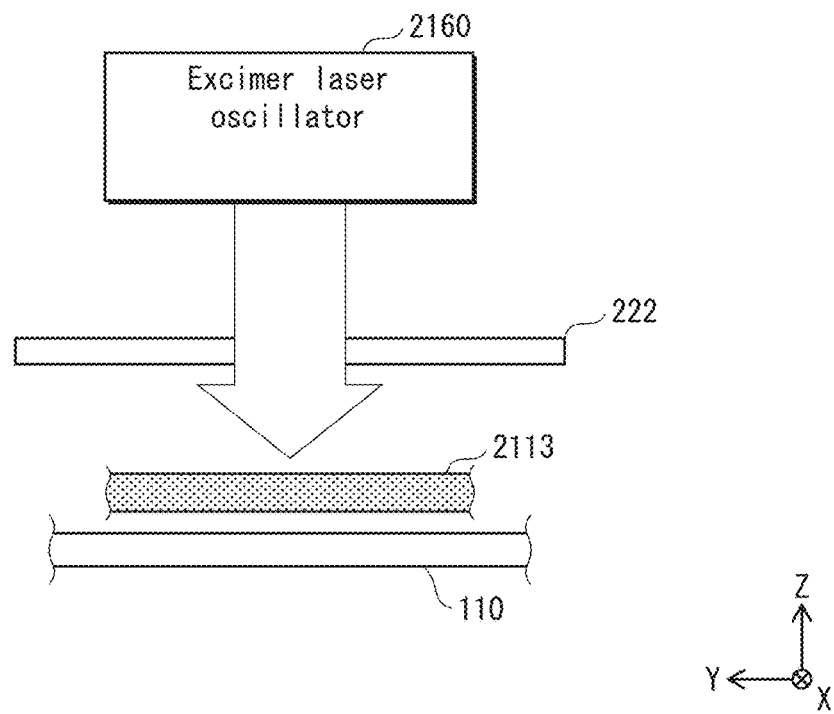
FIG. 26B is a schematic view illustrating an example when an excimer laser oscillator is used as a laser beam source of a thin film patterning device pertaining to Embodiment 3.

Further, as illustrated in FIG. 26B, an excimer laser oscillator 2160 may be adopted instead of the YAG laser oscillator 2112. In general, beam diameter of an excimer laser beam is larger than that of a YAG laser beam (20 mm to 60 mm), and therefore it becomes possible to simultaneously perform more laser processing via the patterning mask 2113, and scanning speed can be increased accordingly. An excimer laser beam may be scanned by the galvanoscanner mechanism described above.

Figure 28A:
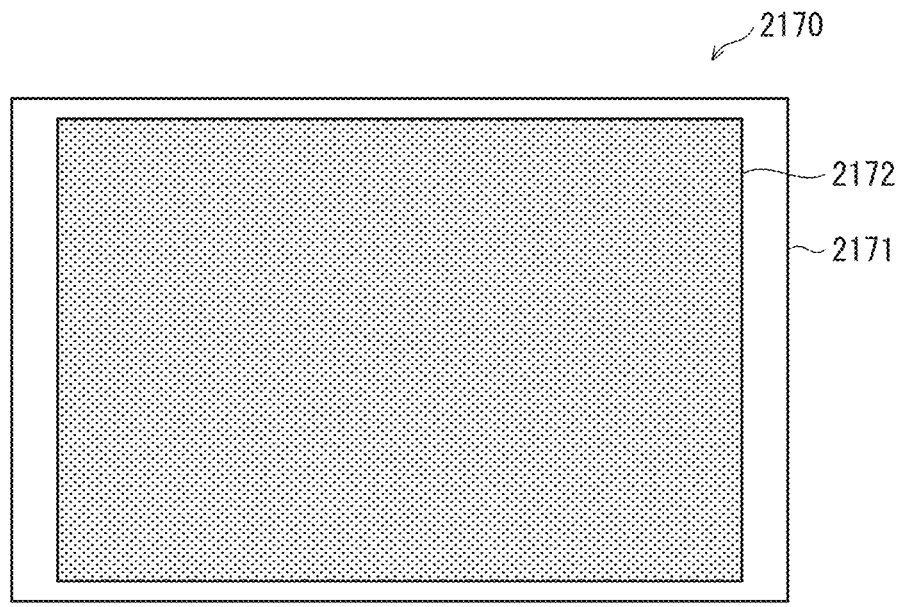
FIG. 28A and FIG. 28B are plan view diagrams illustrating patterning mask examples in the thin film patterning device of FIG. 27.

(2) According to at least one embodiment, the patterning mask 2113 has a strip shape and is provided at a position through which a laser beam is transmitted, but the patterning mask 2113 is not limited to this example. For example, a patterning mask 2170 illustrated in FIG. 28A may be formed in which a mask region 2172 the same size or slightly larger than an entire processing region of the thin film laminated substrate 110 is formed on a large flat plate shaped glass base 2171, and as illustrated in the modification of the thin film patterning device 203 of FIG. 27, the patterning mask 2170 is placed on the table 227 via the spacers 228, and along with movement of the thin film laminated substrate 110 in the X direction, the patterning mask 2120 may be moved while maintaining position relative to the thin film laminated substrate 110.

Further, the patterning mask 2170 may be disposed on a mask frame (not illustrated) placed on a periphery of the thin film laminated substrate 110 such that a defined gap exists between the patterning mask 2170 and the thin film laminated substrate 110.

By making the patterning mask 2170 substantially the same size as or larger than the thin film laminated substrate 110 as described above, the patterning mask 2170 is more effective in preventing debris generated during laser processing rising upwards and attaching to the window glass 222.

Further, when the window glass 222 is made to be about the same size as the thin film laminated substrate 110 (refer to the window glass 851 of FIG. 22B), if regions of the thin film laminated substrate 110 to be laser processed are all arranged to be within a range where the window glass 222 overlaps a mask region of the patterning mask 2113 when viewed from above (that is, when viewed from a laser emission direction (Z direction)), then even when the thin film laminated substrate 110 is not moved, all processing regions of the thin film laminated substrate 110 can be patterned by the thin film patterning device 202 moving the laser head 211 in the XY directions. In such a case, the substrate mover 230 is not required.

If the window glass 222 has a large surface area as described above, weight of the window glass 222 also becomes heavier and there is a risk of a central portion of the window glass 222 bending downwards and deforming, but if thickness of the window glass 222 is increased to increase rigidity, the occurrence of bending can be suppressed, and even if some deflection occurs, processing accuracy can be secured by interposition of the patterning mask 2113 as described above.

Figure 28B:
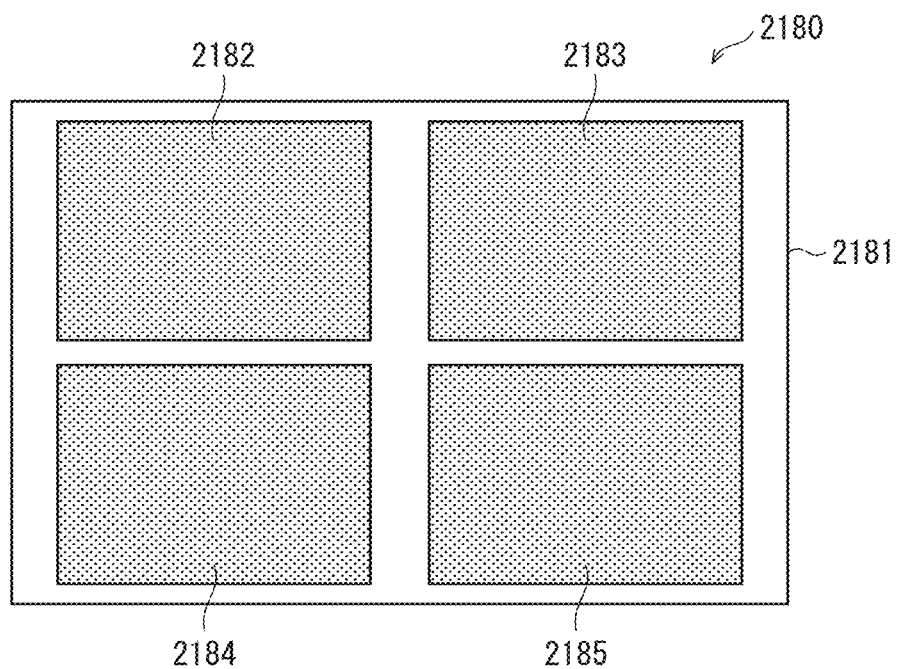

(3) When a plurality of substrates are to be taken from the substrate 11 (for example, four small organic EL panels), then as illustrated by the patterning mask 2180 of FIG. 28B, patterning mask regions 2182 to 2185 corresponding to each region can be formed on the glass base 2181.

(4) Wavelength Range of Laser Beam Source in Thin Film Patterning Device

In order to more stably and reliably leave only the auxiliary electrodes 131 while removing a thin film thereon, it is beneficial to select material and specific laser beam wavelength range such that absorption of the laser beam by the thin film is as great as possible when contrasted with absorption of the laser beam by metal of the auxiliary electrode 131.

As an example, by setting wavelength of a YAG laser to a third harmonic at 355 MHz and forming the auxiliary electrodes 131 from aluminum or aluminum alloy, only the electron transport layer 16 (resin thin film) thereon is selectively removed.

When an excimer laser is used, a xenon fluoride (XeF) excimer laser (351 nm wavelength) is beneficial for the same reason.

(IV) Embodiment 4

Background to Embodiment 4 of Present Disclosure

It is known that properties of various organic materials forming an organic EL display panel deteriorate due to the influence of oxygen and moisture in air, and therefore the laser patterning method described above is beneficially performed in a vacuum.

FIG. 14A and FIG. 14B are side and plan view diagrams schematically illustrating an example of the patterning device 801 that can be posited in such a case.

According to the patterning device 801 illustrated in FIG. 14A, the laser processing device 860 is configured to scan a laser beam by causing the laser head 861 from which the laser beam is emitted to move in the X direction and the Y direction as illustrated in FIG. 14B (head scan method).

According to such a head scan method, there is a problem that processing one organic EL panel takes time.

As another processing method, a galvanoscanner method may be adopted in which an angle of a galvanomirror is changed to deflect a laser beam to scan at high speed, but in order to irradiate with a laser beam through a glass window as described above, changes in angle of incidence with the glass window cause different shifts in optical axes of incident light and emitted light, which may lead to a decrease in processing position accuracy, deterioration in processing straightness, and deterioration in display image.

Thus, as a result of research into adopting laser processing for thin film patterning processing in which processing steps and manufacturing costs are reduced with the high accuracy of a head scan method and relatively short processing time, the inventors of the present application arrived at Embodiment 4, which is an embodiment of the present disclosure.

Embodiment 4

Hereinafter, an organic EL display panel patterning device and patterning method pertaining to Embodiment 4 of the present disclosure are described with reference to the drawings. For convenience of explanation, drawings may be schematic, and are not necessarily to scale.

1. Structure of Thin Film Patterning Device 204

FIG. 29 is a schematic diagram illustrating structure of a thin film patterning device 204 in an organic EL display panel manufacturing device. Further, FIG. 30 is a perspective diagram of the thin film patterning device 204, cut along a plane passing through a line S-S in FIG. 29.

As illustrated in FIG. 29, the thin film patterning device 204 includes the laser processing device 210 (laser emitter) that scans a laser beam to remove an unnecessary portion of a thin film formed on the substrate 11, the chamber unit 220 that accommodates the thin film laminated substrate 110 on which the thin film to be processed is formed, the substrate mover 230 that moves the table 227 of the chamber unit 220 in the H direction of FIG. 29 (X axis direction), the vacuum pump 240 that depressurizes the interior of the chamber unit 220 to create a vacuum, and the controller 250 that controls these elements.

(1) Laser Processing Device 210

Figure 30:
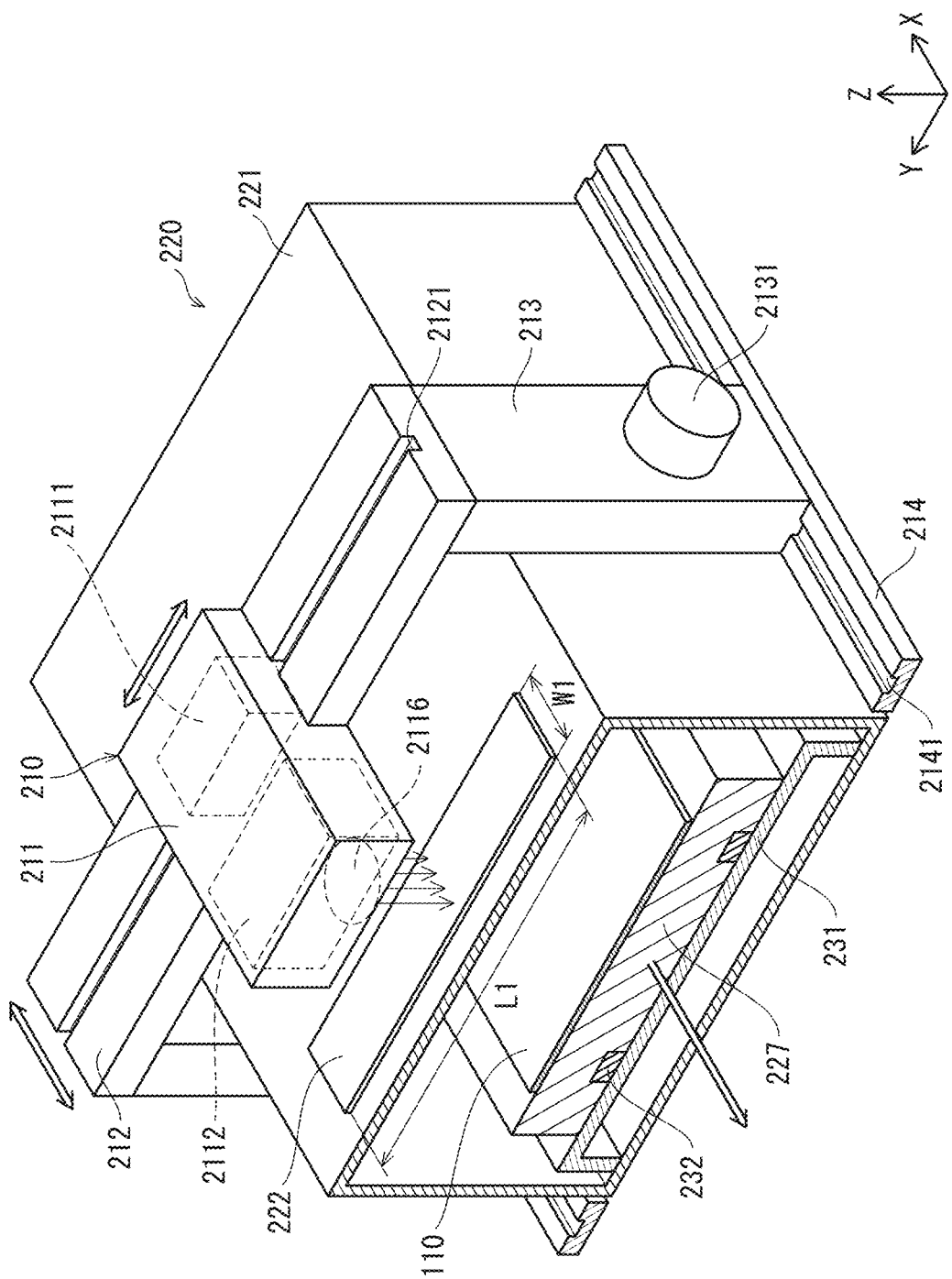
FIG. 30 is a perspective diagram of the thin film patterning device of FIG. 29, cut along a plane passing through a line S-S in FIG. 29.

As illustrated in FIG. 30, the laser processing device 210 includes the laser head 211 incorporating the laser oscillator 2112 (including an optical system for converging the laser beam), the horizontal gantry 212 that holds the laser head 211 while allowing sliding in the direction parallel to the Y axis, the pair of the legs 213 that hold the horizontal gantry 212 at both end portions thereof in a longitudinal direction thereof, and the pair of the guide rails 214 that extend in the X axis direction and are disposed under the legs 213.

According to the present embodiment, an excimer laser beam source that has a large output and relatively large beam diameter among various laser types is used as the laser oscillator 2112 in the laser head 211.

Although an excimer laser can take a plurality of different wavelength ranges from ultraviolet to visible short wavelengths depending on type of reaction gas, a wavelength range that is easily absorbed by a material of the target thin film is selected.

Below the laser oscillator 2112 of the laser head 211 is disposed a mask material 2116 (hereinafter also referred to as a "patterning mask") for transmitting only a portion of the laser beam emitted from the laser oscillator 2112 into four small diameter beams for irradiating the thin film laminated substrate 110.

Figure 31:
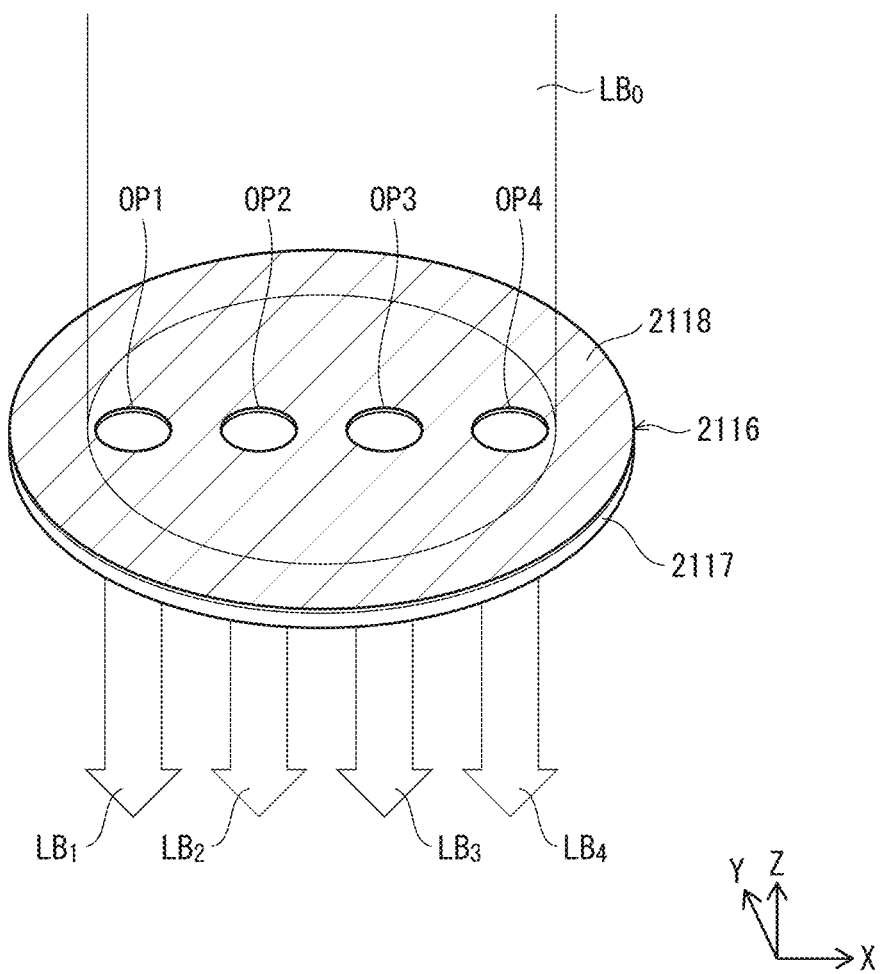
FIG. 31 is a schematic diagram illustrating an example structure of a patterning mask for use in a thin film patterning device pertaining to Embodiment 4.

FIG. 31 is a perspective view diagram illustrating an example of the patterning mask 2116. The patterning mask 2116 is formed, for example, by depositing a metal such as chromium over an entire top surface of a light transmissive flat plate base 2117 made of quartz glass to form a metal film 2118, then forming circular light transmitting holes OP1 to OP4 in the metal film 2118 through a photolithography method using a resist film.

The light transmitting holes OP1 to OP4 are all formed to have the same shape and are arranged at an equal pitch. The pitch is the same as the distance in the X direction between a pattern to be processed, or an integer multiple thereof.

The light transmitting holes OP1 to OP4 need not be arranged in one line in the X direction, and may be slightly shifted in the Y direction as long as they satisfy the above conditions relating to the pitch in the X direction.

As illustrated in FIG. 30, inside the casing of the laser head 211 is a drive source, for example the linear motor 2111, and through control of the drive source, the laser head 211 moves along the guide groove 2121 of the horizontal gantry 212 in the Y axis direction.

A drive source is provided in each of the legs 213, for example the servomotor 2131, and the legs 213 are synchronously driven through a known drive mechanism such as a screw feed mechanism or wire drive mechanism to move in the X axis direction along the guide grooves 2141 of the guide rails 214.

Although the guide rails 214 extend long in the X direction in FIG. 30, according to the present embodiment it suffices that the guide rails 214 extend a distance that allows small diameter beams LB1 to LB4 to move within the width W1 in the X direction of the window glass 222.

The controller 250 controls output of the laser beam source of the laser head 211 and drives and controls the linear motor 2111 and the servomotors 2131, such that a laser beam emitted from the laser head 211 can be scanned across a processing target position of the thin film laminated substrate 110 for laser processing.

An excimer laser beam LB0 having a large beam diameter emitted from the laser oscillator 2112 is transmitted only through the light transmitting holes OP1 to OP4 of the patterning mask 2116 to become the four small diameter beams LB1 to LB4. The excimer laser has a large beam energy, and therefore beam energies of each of the small diameter beams LB1 to LB4 are also sufficient for pattern processing, and patterning of the thin film laminated substrate 110 can be performed four times faster than when patterning with one YAG laser. That is, the takt time can become one fourth of the takt time when using a YAG laser. The number, pitch, and the like of the light transmitting holes in the patterning mask 2116 can be set appropriately in accordance with a specification of an organic EL panel to be processed.

(2) Chamber Unit 220

Returning to FIG. 29, the vacuum chamber 221 of the chamber unit 220 has an opening in a top surface thereof, and the window glass 222 (light transmissive plate) having a flat shape is hermetically sealed to the opening through a sealing member (not illustrated).

The table 227 that has a top surface parallel to the main face of the window glass 222 is installed at a lower portion of the vacuum chamber 221, and the thin film laminated substrate 110 is placed on the table 227 with a surface to be processed facing upward, thereby keeping the window glass 222 and the thin film laminated substrate 110 parallel to each other.

As illustrated in FIG. 30, the window glass 222 is a strip-shaped plate glass having a length L1 in the longitudinal direction (Y direction) that is longer than length of the thin film laminated substrate 110 in the Y direction and a width W1 in a short direction (X direction) that is considerably shorter than length of the thin film laminated substrate 110 in the X direction and sufficiently wide for the small diameter beams LB1 to LB4 to be transmitted therethrough. According to the present embodiment, the width W1 is 30 mm.

Thus, surface area of the window glass 222 becomes significantly smaller than in the case illustrated in FIG. 14A and FIG. 14B and total weight of the window glass 222 decreases, and therefore a central portion of the window glass 222 does not bend downwards under its own weight, and the window glass 222 can maintain a shape parallel to the thin film laminated substrate 110. Thus, when the laser beam LB is emitted from the laser head 211 normal to the main surface of the window glass 222, there is no risk of the laser beam LB being refracted when passing through the window glass 222 such that the optical axis deviates, and a target position of the thin film to be processed can be accurately irradiated for processing.

As material of the window glass 222, it is beneficial to use quartz glass having a wide wavelength range of transmitted laser light and excellent durability.

(3) Substrate Mover 230

The substrate mover 230 includes the base 231 on which the table 227 is mounted so as to be movable in the X direction, the guide rails 232 on a top surface of the base 231 that engage with grooves formed in the bottom face of the table 227 to guide the table 227 in the X direction, and the linear motor 233 that moves the table 227 in the X direction.

By moving the table 227 with the linear motor 233, an entire processing region of the thin film laminated substrate 110 in plan view can be sequentially exposed from the window glass 222.

(4) Vacuum Pump 240

The vacuum pump 240 evacuates air from the vacuum chamber 221, and maintains a defined vacuum state in the vacuum chamber 221.

(5) Controller 250

Structure of the controller 250 is the same as that described with reference to FIG. 18, and therefore description is not repeated here.

The controller 250 controls a substrate transport robot (not illustrated) in order to have the thin film laminated substrate 110, on which the thin film to be processed was formed in a device (for example, a vacuum deposition device) prior to the thin film patterning device 204, placed on a predefined position on the table 227 in the vacuum chamber 221, controls the vacuum pump 240 to create a vacuum state in the vacuum chamber 221, and the like. According to the present embodiment, a high vacuum at $10^{-3}$ Pa to $10^{-5}$ Pa, for example, is beneficial in order to prevent degradation of properties of the organic EL panel 10. The surface area of the window glass 222 is made small as described above, and therefore as long as the window glass 222 has an appropriate thickness, it will not bend even under high vacuum.

2. Method of Manufacturing Organic EL Panel 10

Structure of the organic EL panel 10 and structure of the organic EL elements 2 are the same as described with reference to FIG. 8 and FIG. 9, and are therefore not described again here.

Processes in the method of manufacturing the organic EL elements 2 are largely the same as those described with reference to drawings from FIG. 10A to FIG. 13, but formation of contact openings in step S6 of FIG. 13 (laser patterning processing) is different from that of Embodiments 1 to 3, and therefore this point is described below.

According to the present embodiment, contact opening formation is performed by removing the electron transport layer 16 on the auxiliary electrodes 131 by the thin film patterning device 204 illustrated in FIG. 29 to form the contact openings 161.

First, the thin film laminated substrate 110 (see FIG. 12A) is placed on a predefined position on the table 227 in the vacuum chamber 221 of the thin film patterning device 204 by a substrate transport robot, and the vacuum pump 240 is operated to evacuate the interior of the vacuum chamber 221 to achieve the preset high vacuum state described above.

Then, the laser processing device 210 is operated to scan the laser beam LB to remove the electron transport layer 16 on all of the auxiliary electrodes 131 above the substrate 11, forming the contact openings 161 (FIG. 12B).

Specifically, after causing the laser head 211 of the laser processing device 210 to move to a defined reference position (home position), the controller causes laser beam irradiation of the thin film laminated substrate 110 through the window glass 222, based on a program (pattern data) stored in advance in internal memory at a laser output and scanning speed that can selectively remove only the thin film to be processed. When processing is complete in a range of the width W1 of the window glass 222, the thin film laminated substrate 110 is moved by the substrate mover 230 in the H direction by the width W1 while the laser head is returned to the reference position, and patterning is executed for the next processing region. By repeating such operations, patterning processing is performed on all processing regions of the thin film laminated substrate 110.

Patterning can be performed with the four small diameter beams LB1 to LB4, and therefore patterning can be performed in a short time.

After the patterning processing is completed, the thin film laminated substrate 110 is taken out of the vacuum chamber 221 and transported to a next processing device by the substrate transport robot.

Thereafter, through common electrode formation (step S7 in FIG. 13) and sealing layer formation (step S8 in FIG. 13), the organic EL panel 10 having a laminated structure as illustrated in FIG. 9 can be obtained.

3. Summary of Effects of Embodiment 4

According to Embodiment 4, the following effects can be achieved.

In a display panel including an organic thin film, in particular an organic EL element panel, an organic thin film reacts with oxygen and moisture and therefore laser processing is also necessarily performed in a chamber under a sealed vacuum environment.

The excimer laser beam with a large beam diameter emitted from the laser head is transmitted through the patterning mask to become a plurality of small diameter beams. The excimer laser has a large beam energy, and therefore the beam energies of each small diameter beam is also sufficient for pattern processing, and the increase in number of beams makes it possible to perform patterning faster. Thus, takt time of patterning processing can be greatly reduced.

Further, the window glass 222 is strip-shaped plate glass having a length in the longitudinal direction (Y direction) that is longer than length of the thin film laminated substrate 110 in the Y direction and a width in a short direction (X direction) that is considerably shorter than length of the thin film laminated substrate 110 in the X direction.

The thin film laminated substrate 110 is moved in the H direction by the substrate mover 230, and therefore, when viewed from the direction in which the laser beam is emitted (normal direction to the window glass 222 according to the present embodiment), all processing regions of the thin film laminated substrate 110 can be seen from the window glass 222, and therefore even with the window glass 222 having a small surface area, laser processing of all the processing regions of the thin film laminated substrate 110 is possible.

The surface area of the window glass 222 is reduced, and total weight is reduced, and therefore the central portion of the window glass does not bend downwards under its own weight and the entirety of the window glass 222 and the thin film laminated substrate 110 are maintained in parallel with each other.

Thus, when the laser beam LB is emitted from the laser head 211 normal to the main surface of the window glass 222, there is no risk of the small diameter laser beams LB1 to LB4 being refracted when passing through the window glass 222 such that the optical axes deviate, and a target position of the thin film to be processed can be accurately irradiated for processing, which results in improved product quality.

Further, merely by changing a program (pattern data) installed in the controller 250 of the thin film patterning device 204, varied pattern forming can quickly be executed, and therefore there is no need for the labor and expense required to recreate masks for each design change as in conventional etching methods, thereby providing excellent on-demand flexibility.

Such effects are not limited to organic EL panels, but can also be obtained in manufacture of other display panels in which a plurality of thin films including an organic film are laminated.

Modifications

Embodiments of a patterning device and a patterning method have been described as aspects of the present disclosure, but the present disclosure is not limited to the description of Embodiment 4 beyond essential characteristic elements thereof. The following describes modifications, which are other embodiments of Embodiment 4.

(1) When a size of the thin film laminated substrate 110 to be processed is not so large, even if thickness of the window glass 222 is increased to a certain extent, the problem of the window glass 222 bending under its own weight may not occur. In such a case, by making size of the window glass 222 equivalent to size of the thin film laminated substrate 110 (see the window glass 851 of FIG. 14B), if regions of the thin film laminated substrate 110 to be laser processed are all arranged to be within a range that overlaps with the window glass 222 when viewed from above (that is, when viewed from a laser emission direction (Z direction)), then even when the thin film laminated substrate 110 is not moved, all processing regions of the thin film laminated substrate 110 can be patterned by the thin film patterning device 202 moving the laser head 211 in the XY directions. In such a case, the substrate mover 230 is not required.

(2) Window Glass Material

According to at least one embodiment, quartz glass is described as being used as a material of the window glass 222 as quartz glass has good light transmission in a wide wavelength range and excellent durability, but depending on a wavelength range of a laser beam used, soda glass or a light transmissive resin such as acrylic may be used. The same is true for the light transmissive base 2117 of the patterning mask 2116.

(V) Embodiment 5

Background to Embodiment 5 of Present Disclosure

A top emission type of organic EL element has an element structure in which a pixel electrode, at least one organic layer (including a light emitting layer), and a common electrode are provided in this order on a substrate. Light from the light emitting layer is reflected by the pixel electrode made of a light reflective material and emitted upwards from the common electrode made of a light transmissive material. In many cases, the common electrode is formed over an entirety of an image display region on the substrate. As organic EL display panels for use in large screen display devices such as televisions increase in size, electrical resistance of the common electrode increases, and in areas far from a power supply, sufficient current is not supplied due to voltage drop, light emission efficiency decreases, and there is a concern that luminance unevenness may occur as a result.

With respect to this problem, as an example, according to JP 2001-230086, an auxiliary electrode is extended in a longitudinal direction thereof, superimposed above or below the common electrode (upper electrode) opposite the pixel electrode, and electrically connected to the common electrode, thereby reducing electrical resistance in the common electrode to control luminance unevenness.

When a functional layer is present between the auxiliary electrode and the common electrode, contact resistance between the auxiliary electrode and the common electrode is high, and the effect of providing the auxiliary electrode becomes insufficient. Regarding this problem, for example, JP 2007-103098 describes a manufacturing method including irradiating an organic functional layer laminated on an auxiliary electrode made of ITO with a laser beam having a wavelength of 450 nm to remove a portion of the organic functional layer, then forming the common electrode thereon, thereby ensuring contact and electrical connection between the elongated auxiliary electrode and the common electrode.

However, when a laser beam is applied to remove a portion of an organic functional layer, the auxiliary electrode below the functional layer may be damaged by transmitted laser light, degrading performance of an organic EL element.

The inventors of the present application, in order to resolve the above problems and as a result of intensive research, arrived at the following embodiment in order to provide an organic EL display panel manufacturing method that can reduce influence of a laser beam on an auxiliary electrode when removing a portion of a functional layer through laser beam irradiation while removing the portion to ensure contact between the auxiliary electrode and the common electrode.

Embodiment 5

A method of manufacturing the organic EL panel pertaining to Embodiment 5 is described with reference to the drawings.

1. Structure of Organic EL Panel 10

Figure 32:
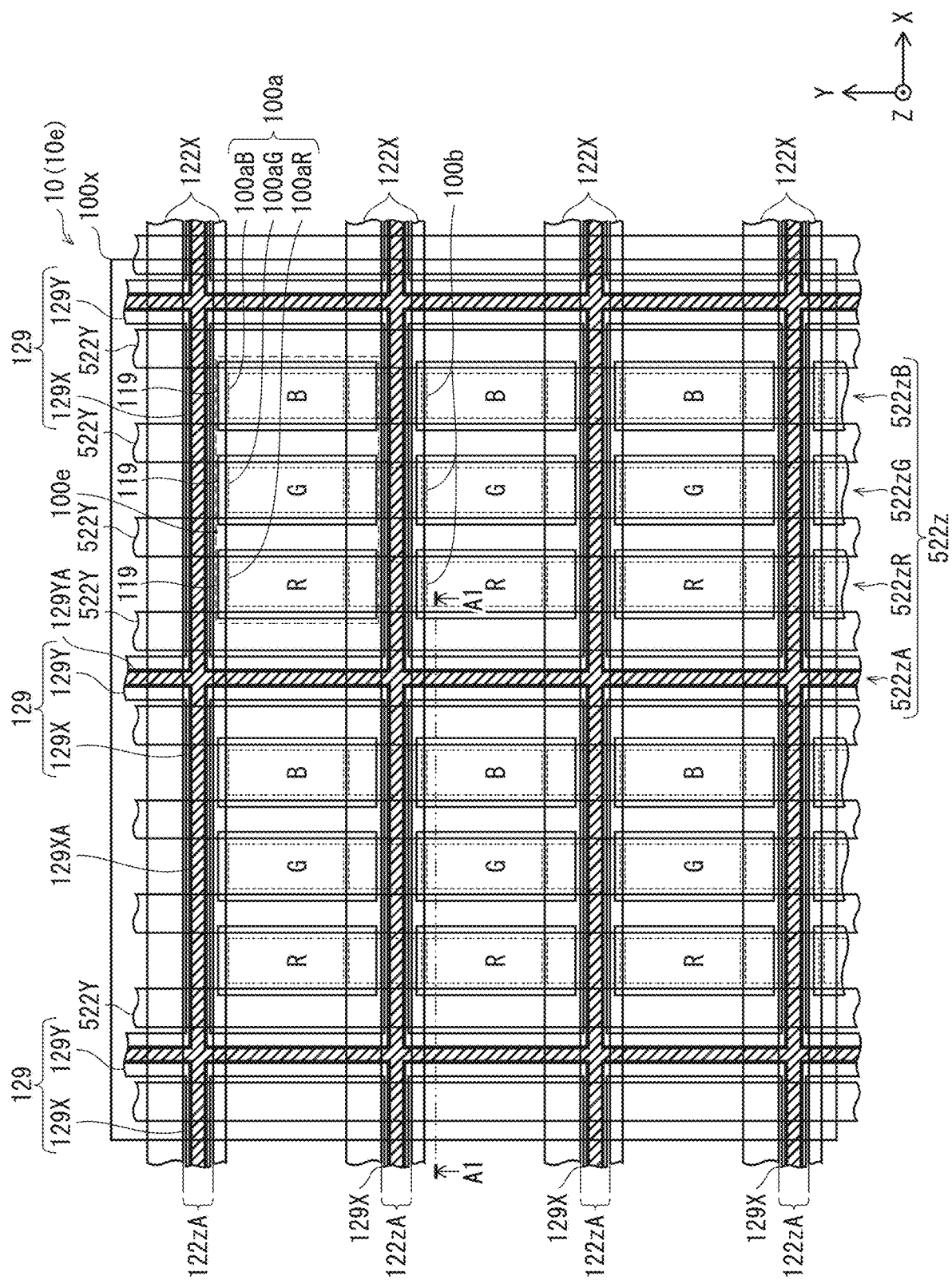
FIG. 32 is a schematic plan view diagram illustrating a portion of an organic EL display panel pertaining to Embodiment 5, which is an embodiment of the present disclosure.

The organic EL panel 10 pertaining to the present embodiment is described with reference to the drawings. Note that the drawings are schematic diagrams and are not necessarily to scale. FIG. 32 is a schematic plan view diagram illustrating a portion of the organic EL panel 10 pertaining to at least one embodiment, viewed below an insulating layer 122, described later.

The organic EL panel 10 is a display panel including organic EL elements that make use of electroluminescence of an organic compound. The organic EL panel 10 has a top-emission structure in which light is emitted from a top surface thereof, and in which organic EL elements 100, which constitute pixels, are arranged in a matrix on a substrate 100x (TFT substrate) including thin film transistors (TFTs). Here, the X direction, Y direction, and Z direction in FIG. 32 represent a row direction, column direction, and thickness direction of the organic EL panel 10, respectively.

As illustrated in FIG. 32, the organic EL panel 10 includes a partitioned region 10e in which column banks 522Y and row banks 122X define light emission units of RGB colors in a matrix on the substrate 100x. In the present description, the column banks 522Y and the row banks 122X may also be referred to as an insulating layer 122.

The partitioned region 10e is a region in which the organic EL elements 100 are formed in each partition defined by the column banks 522Y and the row banks 122X.

Unit pixels 100e corresponding to the organic EL elements 100 are arranged in a matrix in the partitioned region 10e (also referred to as region 10e) of the organic EL panel 10.

In each of the unit pixels 100e are a red-self-light-emission region 100aR, a green-self-light-emission region 100aG, and a blue-self-light-emission region 100aB (also referred to as self-light-emission regions 100a), the three self-light-emission regions 100a each being a region that emits light due to an organic compound.

That is, as illustrated in FIG. 32, three sub pixels 100se corresponding to the self-light-emission regions 100aR, 100aG, 100aB lined up in the row direction form one set, which is the unit pixel 100e in a color display.

Further, as illustrated in FIG. 32, in the organic EL panel 10, pixel electrodes 119 are arranged in a matrix on the substrate 100x at predefined distances in the row and column directions. The pixel electrodes 119 are each rectangular in plan view, and are made of a light reflective material. The pixel electrodes 119 arranged in the matrix correspond to the self-light-emission regions 100aR, 100aG, 100aB.

In the organic EL panel 10, the insulating layer 122 has a line-like insulating layer form, and in regions above row direction ends of the pixel electrodes 119 adjacent to each other and above the substrate 100x, the column banks 522Y extend in the column direction (Y direction in FIG. 32) and are arranged side-by-side along the row direction.

On the other hand, in regions above column direction ends of the pixel electrodes 119 adjacent to each other and above the substrate 100x, the row banks 122X extend in the row direction (X direction in FIG. 32) and are arranged side-by-side along the column direction. Regions in which the row banks 122X are present are non-self-light-emission regions 100b in which organic electroluminescence does not occur in the light emitting layers 123 above the pixel electrodes 119.

Gaps between adjacent column banks 522Y are defined as gaps 522z, gaps corresponding to the self-light-emission regions 100aR are red gaps 522zR, gaps corresponding to the self-light-emission regions 100aG are green gaps 522zG, gaps corresponding to the self-light-emission regions 100aB are blue gaps 522zB, and gaps between the blue gaps 522zB and the red gaps 522zR are defined as auxiliary gaps 522zA in which auxiliary electrodes 129Y are formed (hereinafter, the red gaps 522zR, green gaps 522zG, blue gaps 522zB may be referred to as the gaps 522z where a distinction is not made). Further, gaps between adjacent row banks 122X in the non-self-light-emission regions 100b in which auxiliary electrodes 129X are formed are defined as auxiliary gaps 122zA.

Further, as illustrated in FIG. 32, in the organic EL panel 10, the self-light-emission regions 100a and the non-self-light-emission regions 100b are arranged alternating in the column direction along the gaps 522z. Contact holes (not illustrated) are provided in the non-self-light-emission regions 100b to connect the pixel electrodes 119 to sources of TFTs (not illustrated).

Further, as illustrated in FIG. 32, in the organic EL panel 10, auxiliary electrodes 129Y are continuous in the column direction and are arranged between the unit pixels 100e on the substrate 100x, and in plan view, contact portions 129YA that are portions of a top surface of the auxiliary electrodes 129Y are in contact with the common electrode 125. Further, auxiliary electrodes 129X are continuous in the row direction and are arranged between the unit pixels 100e on the substrate 100x, and in plan view, contact portions 129XA that are portions of a top surface of the auxiliary electrodes 129X are in contact with the common electrode 125. The auxiliary electrodes 129Y and the auxiliary electrodes 129X are also referred to as auxiliary electrodes 129 in this description.

Further, as illustrated in FIG. 32, in the organic EL panel 10, above three consecutive pixel electrodes 119 in the row direction are one each of the light emitting layers 123 emitting red, blue, and green light, respectively. When each set of three consecutive pixel electrodes 119 in the row direction corresponding to one of the unit pixels 100e is referred to as a pixel electrode group, and portions of the top surfaces of the auxiliary electrodes 129X, 129Y in contact with the common electrode 125 are defined as the contact portions 129XA, 129YA, the auxiliary electrodes 129X and the contact portions 129XA extending in the row direction extend along the auxiliary gaps 122zA between the pixel electrode groups, and the auxiliary electrodes 129Y and the contact portions 129YA extending in the column direction extend along the auxiliary gaps 522zA between the pixel electrode groups. According to this structure, wiring resistance of the auxiliary electrodes 129 can be efficiently reduced.

2. Structure of Organic EL Panel 10

Figure 33:
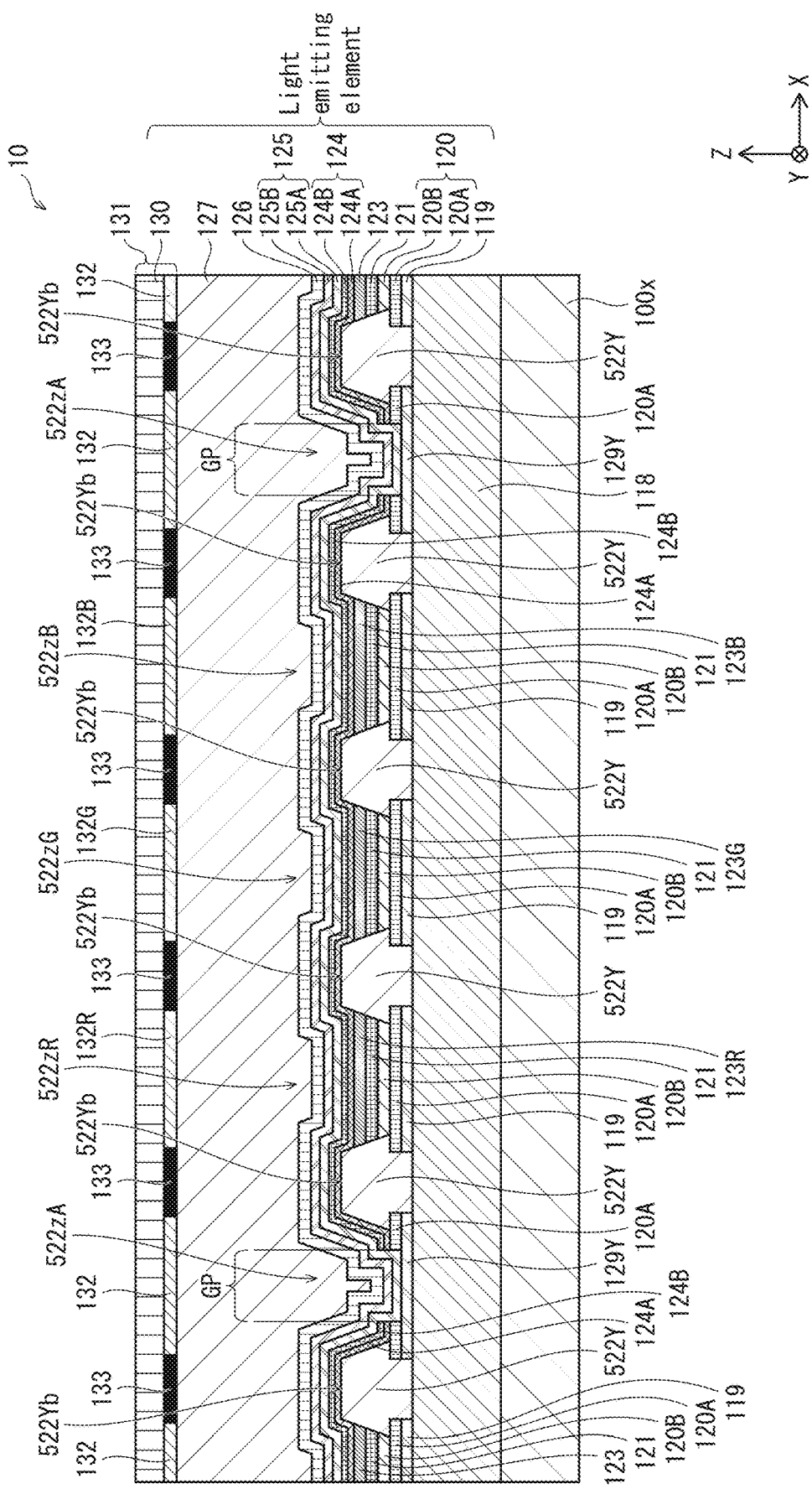
FIG. 33 is a schematic cross-section diagram of the organic EL display panel of FIG. 32, taken along a line A1-A1.

Structure of the organic EL elements 100 in the organic EL panel 10 is described with reference to FIG. 33. FIG. 33 is a schematic cross-section diagram of the organic EL panel of FIG. 32, taken along a line A1-A1.

In the organic EL panel 10 according to the present embodiment, a substrate (TFT substrate) including thin film transistors is lowest in the Z axis direction, above which are organic EL elements.

(1) Substrate 100x

The substrate 100x is a support member of the organic EL panel 10 and includes a base (not illustrated) and a thin film transistor layer (not illustrated) on the base.

The base is a support member of the organic EL panel 10, and is a flat plate. As a material of the base, an electrically insulating material such as a glass material, a resin material, a semiconductor material, or a metal material coated with an insulating layer can be used.

The TFT layer includes TFTs and wiring (connecting sources of the TFTs to corresponding pixel electrodes 119) formed on a top surface of the base. TFTs electrically connect corresponding pixel electrodes 119 to an external power source in response to a drive signal from an external circuit of the organic EL panel 10, and have multilayer structures including an electrode, a semiconductor layer, an insulating layer, and the like. Wiring electrically connects the TFTs, the pixel electrodes 119, external power source, external circuitry, and the like.

(2) Planarizing Layer 118

A planarizing layer 118 is provided on a top surface of the base and TFT layer. The planarizing layer 118 on the top surface of the substrate 100x planarizes the top surface of the substrate 100x, which is irregular due to the TFT layer, while also filling between the wiring and TFTs, electrically insulating between the wiring and TFTs.

In order to connect the pixel electrodes 119 to wiring connected to the sources of TFTs of corresponding pixels, the planarizing layer 118 is provided with contact holes (not illustrated) above the wiring.

(3) Pixel Electrodes 119

On the planarizing layer 118 in the region 10e of the substrate 100x, the pixel electrodes 119 are provided in one-to-one correspondence with the sub-pixels 100se, as illustrated in FIG. 33.

The pixel electrodes 119 supply carriers to the light emitting layers 123. For example, if functioning as anodes, the pixel electrodes 119 supply holes to the light emitting layers 123. Further, the organic EL panel 10 is a top-emission type, and therefore the pixel electrodes 119 are light reflective. The pixel electrodes 119 have, for example, a flat substantially rectangular plate shape in plan view. In contact holes (not illustrated) of the planarizing layer 118 are formed connecting recesses (contact holes, not illustrated) of the pixel electrodes 119 that are portions of the pixel electrodes 119 recessed towards the substrate 100x, and at bottoms of the connecting recesses the pixel electrodes 119 are connected to wiring connected to sources of TFTs of corresponding pixels.

(4) Auxiliary Electrodes 129

The auxiliary electrodes 129Y extend in the column direction on the planarization layer 118 in the auxiliary gaps 522zA between the column banks 522Y. The auxiliary electrodes 129Y are an auxiliary electrode layer for reducing electrical resistance of the common electrode 125 by electrically connecting with the common electrode 125 through openings GP provided in hole injection layers 120A and the electron transport layer 124. Further, as illustrated in FIG. 32, the auxiliary electrodes 129X extend in the row direction on the planarization layer 118 in the auxiliary gaps 122zA between the row banks 122X so as to connect between the auxiliary electrodes 129Y. The auxiliary electrodes 129X, like the auxiliary electrodes 129Y, are an auxiliary electrode layer for reducing electrical resistance of the common electrode 125 by electrically connecting with the common electrode 125 through openings provided in the hole injection layers 120A and the electron transport layer 124. The auxiliary electrodes 129Y and the auxiliary electrodes 129X are also referred to as auxiliary electrodes 129 in this description.

Here, film thickness of the auxiliary electrodes 129 is beneficially from 100 nm to 1000 nm, in order to obtain sufficient cross-section area to support electrical power supply. According to the present embodiment, film thickness of the auxiliary electrodes 129 is 400 nm.

Width of the auxiliary electrodes 129 is beneficially narrow in order to widen a light emitting surface area. At least, the width of the auxiliary electrodes 129 is beneficially less than width of the subpixels 100se in the X direction. Width of the auxiliary electrodes 129 is beneficially from 30 μm to 40 μm, and width of the openings GP when trimming is applied with respect to the auxiliary electrodes 129 is beneficially about 10 μm. Further, when the width of the auxiliary electrodes 129 is increased to reduce wiring resistance, an impact on light emitting surface area is less when width of the auxiliary electrodes 129X is greater than width of the auxiliary electrodes 129Y.

5) Hole Injection Layers 120

As illustrated in FIG. 33, the hole injection layers 120 are laminated on the pixel electrodes 119. The hole injection layers 120 have a function of transporting holes injected from the pixel electrode layers 119 to hole transport layers 121.

The hole injection layers 120 include, in order from a side nearest the substrate 100x, the hole injection layers 120A made of a metal oxide formed on the pixel electrodes 119 and the auxiliary electrodes 129, and hole injection layers 120B made of an organic material laminated on the hole injection layers 120A in the gaps 522zR, 522zG, 522zB. In the gaps 522zA, portions of the hole injection layers 120A are trimmed, and openings GP are opened in the hole injection layers 120A.

According to the present embodiment, the hole injection layers 120B each have a line-like shape extending in the column direction in the gaps 522zR, 522zG, 522zB. The hole injection layers 120B are not present in the auxiliary gaps 522zA.

(6) Banks 122

As illustrated in FIG. 33, banks made of an insulating material are formed covering edges of the pixel electrodes 119 and the hole injection layers 120. The banks include the column banks 522Y that extend in the column direction and are arranged side-by-side in the row direction and the row banks 122X that extend in the row direction and are arranged side-by-side in the column direction (the column banks 522Y and the row banks 122X may also be referred to as banks 122).

The column banks 522Y each have a line-like shape extending in the column direction, and in a cross-section taken parallel to the row direction the column banks 522Y each have a tapered trapezoid shape that tapers upwards. The column banks 522Y block flow of ink in the row direction, the ink including an organic compound that is a material of the light emitting layers 123. Thus, the column banks 522Y define the row direction edges of the light emitting layers 123. Base portions in the row direction of the column banks 522Y define edges of the self-light-emission regions 100a of the sub-pixels 100se in the row direction.

The row banks 122X each have a line-like shape extending in the row direction, and in a cross-section taken parallel to the column direction the row banks 122X each have a tapered trapezoid shape that tapers upwards. The row banks 122X pass through the column banks 522Y and extend along the row direction orthogonal to the column direction. The row banks 122X have a top surface that is lower than a top surface 522Yb of the column banks 522Y. Thus, the row banks 122X and the column banks 522Y form openings corresponding to the self-light-emission regions 100a.

(7) Electron Transport Layers 121

As illustrated in FIG. 33, the hole transport layers 121 are laminated on the hole injection layers 120 in the gaps 522zR, 522zG, 522zB. The hole transport layers 121 are not present in the auxiliary gaps 522zA. Further, the hole transport layers 121 are also laminated on the hole injection layers 120 on the row banks 122X (not illustrated). The hole transport layers 121 are in contact with the hole injection layers 120B. The hole transport layers 121 have a function of transporting holes injected from the hole injection layers 120 to the light emitting layers 123.

According to the present embodiment, a structure is adopted in which the hole transport layers 121 each have a line-like shape extending in the column direction in the gaps 522z, similar to the hole injection layers 120B.

(8) Light Emitting Layers 123

As illustrated in FIG. 33, the light emitting layers 123 are layered on the hole transport layers 121. The light emitting layers 123 are layers each made of an organic compound, and have a function of emitting light through recombination of holes and electrons that occurs in the light emitting layers 123. In the gaps 522zR, 522zG, 522zB defined by the column banks 522Y, the light emitting layers 123 each have a line-like shape extending in the column direction. The light emitting layers 123 are not present in the auxiliary gaps 522zA. Light emitting layers 123R, 123G, 123B that emit R, G, and B light, respectively, are formed in the red gaps 522zR, the green gaps 522zG, and the blue gaps 522zB, respectively.

In each color of the subpixels 100se, a corresponding color of the light emitting layers 123 is present between one of the pixel electrodes 119 and the common electrode 125, forming an optical resonator structure that resonates light emitted from the light emitting layer 123 and emits the light from the common electrode 125 side thereof. An optical distance between a top surface of the light emitting layer 123 and a top surface of the pixel electrode 119 is set according to a wavelength of light emitted from the light emitting layer 123 (123R, 123G, or 123B) such that the optical resonator structure causes light components to constructively interfere with each other.

Only portions of the light emitting layers 123 that are supplied carriers from the pixel electrodes 119 emit light, and therefore in regions in which the row banks 122X, which are insulators, are present between layers, organic compound electroluminescence does not occur. Thus, portions of the light emitting layers 123 where the row banks 122X are not present are the self-light-emission regions 100a, and portions above side and top faces of the row banks 122X are the non-self-light-emission regions 100b.

(9) Electron Transport Layer 124

As illustrated in FIG. 33, the electron transport layer 124 is laminated covering the column banks 522Y and the light emitting layers 123 in the gaps 522z defined by the column banks 522Y. The electron transport layer 124 is continuous across at least the entire display area of the organic EL panel 10. The electron transport layer 124 has a function of transporting electrons from the common electrode 125 to the light emitting layers 123 and a function of restricting injection of electrons into the light emitting layers 123. The electron transport layer 124 includes, in order from the substrate 100x, an electron transport layer 124A made of a metal oxide, fluoride, or the like, and an electron transport layer 124B that is primarily an organic substance laminated on the electron transport layer 124A (the electron transport layer 124A and the electron transport layer 124B are also referred to together as the electron transport layer 124). In the gaps 522zA, portions of the electron transport layer 124 are trimmed, providing the openings GP in the electron transport layer 124.

(10) Common Electrode 125

As illustrated in FIG. 33, the common electrode 125 is formed on the electron transport layer 124. The common electrode 125 is an electrode common to the light emitting layers 123. The common electrode 125 and the pixel electrodes 119 sandwich the light emitting layers 123 to form a current path. The common electrode 125 supplies carriers to the light emitting layers 123. For example, when the common electrode 125 functions as a cathode, the common electrode 125 supplies electrons to the light emitting layers 123.

The common electrode 125 includes, in order from closest to the substrate 100x, a common electrode 125A whose main component is a metal and a common electrode 125B composed of a metal oxide and laminated on the common electrode 125A (the common electrodes 125A, 125B are also referred to as "common electrode 125" in this description).

The order of laminating the common electrodes 125A, 125B may be reversed for the purpose of optical adjustment.

(11) Sealing layer 126

The sealing layer 126 covers the common electrode 125. The sealing layer 126 is for suppressing deterioration of the light emitting layers 123 caused by contact with moisture, air, and the like. The sealing layer 126 is formed to cover the top surface of the common electrode 125. Further, in order to ensure good light extraction in a display, high light transmittance is necessary.

(12) Joining Layer 127

Above the sealing layer 126 in the Z axis direction is a color filter substrate 131 including an upper substrate 130 and a color filter layer 132 disposed below the upper substrate 130 in the Z axis direction. The color filter substrate 131 is joined to the sealing layer 126 by a joining layer 127. The joining layer 127 has a function of joining the color filter substrate 131 to a "back panel" consisting of each layer from the substrate 100x to the sealing layer 126, and has a function of preventing each layer from being exposed to moisture and air.

(13) Upper Substrate 130

The color filter substrate 131, which includes the upper substrate 130 and the color filter layer 132, is disposed on and joined to the joining layer 127. The organic EL panel 10 is a top-emission type of panel and therefore, for example, a light-transmissive material such as cover glass, light-transmissive resin film, or the like is used for the upper substrate 130. Further, the upper substrate 130 can improve rigidity of the organic EL panel 10, and help prevent intrusion of moisture, air, and the like.

(14) Color Filter Layer 132

The color filter layer 132 is formed on the upper substrate 130 at positions corresponding to each of the self-light-emission regions 100a of pixels. The color filter layer 132 is a light-transmissive layer provided for allowing transmission of visible light of wavelengths corresponding to R, U, and B and has a function of transmitting light emitted from each color pixel and correcting chromaticity of the transmitted light. For example, according to the present embodiment, red, green, and blue color filter layers 132R, 132G, and 132B are formed above self-light-emission regions 100aR in the red gaps 533zR, the self-light-emission regions 100aG in the green gaps 532zG, and the self-light-emission regions 100aB in the blue gaps 522zB, respectively.

(15) Light Shielding Layer 133

The light shielding layer 133 is formed on the upper substrate 130 in positions corresponding to boundaries between the self-light-emission regions 100a of pixels. The light shielding layer 133 is a black resin layer provided to prevent transmission of visible light of wavelengths corresponding to R, G, and B. For example, the light shielding layer 133 is made of a resin material including black pigment with excellent light absorption and light shielding properties.

3. Component Materials

Examples of materials included in layers illustrated in FIG. 32 and FIG. 33 are provided below.

(1) Substrate 100x (TFT Substrate)

For the base 100p, for example, a glass substrate, a silica glass substrate, a silicon substrate, a metal substrate of a metal such as molybdenum sulfide, copper, zinc, aluminum, stainless steel, magnesium, iron, nickel, gold, or silver, a semiconductor substrate such as gallium arsenide, a plastic substrate, or the like can be used.

The TFT layer includes TFT circuits formed on the base 100p, an inorganic insulating layer (not illustrated) formed on the TFT circuits, and the planarizing layer 118. The TFT circuits formed on the top surface of the base 100p each have a multilayer structure including an electrode, a semiconductor layer, an insulating layer, and the like.

Publicly known materials can be used for TFT elements such as gate electrodes, gate insulating layers, channel layers, channel protection layers, source electrodes, drain electrodes, and the like.

As a material of the planarizing layer 118 on a top surface of the substrate 100x, an organic compound such as polyimide resin, acrylic resin, siloxane resin, novalac-type phenolic resin, or the like can be used.

(2) Pixel Electrodes 119

The pixel electrodes 119 are made of a metal material. In the case of the organic EL panel 10 pertaining to the present embodiment, which is a top-emission type, chromaticity of emitted light is adjusted and luminance increased by adoption of an optical resonator structure for which thickness is optimized, and therefore a surface portion of the pixel electrodes 119 has a high reflectivity. The pixel electrodes 119 in the organic EL panel 10 pertaining to the present embodiment may have a structure in which a plurality of films selected from a metal layer, an alloy layer, and a light-transmissive conductive layer are laminated. The metal layer can be made from a metal material including, for example, aluminum (Al) as a material that has low sheet resistance and high light reflectivity. For example, an aluminum (Al) alloy has a high light reflectivity from 80% to 95% and a low electrical resistivity of $2.82 \times 10^{-8}$ (10 n$\Omega$·m), and is therefore an appropriate material of the pixel electrodes 119. Further, in terms of cost, it is beneficial to use a metal layer or an alloy layer that is primarily aluminum.

Aside from an aluminum alloy metal layer, in terms of high reflectivity, silver, a silver alloy, or the like can be used.

When the pixel electrodes 119 are made of aluminum or aluminum alloy, an aluminum oxide layer is formed on surfaces thereof.

As a material of the light-transmissive conductive layer, indium tin oxide (ITO), indium zinc oxide (IZO), or the like can be used.

(3) Auxiliary Electrodes 129

The auxiliary electrodes 129 are an auxiliary electrode layer that establishes an electrical connection with the common electrode 125 for reducing electrical resistance of the common electrode 125. Thus, the auxiliary electrodes 129 can be made of a material with a low sheet resistance, such as a metal layer or alloy layer including aluminum (Al) as a main component. For example, aluminum alloy is suitable as a material of the auxiliary electrodes 129 in view of its small electric resistivity of $2.82 \times 10^{-8}$ (10n$\Omega$·m) and further in view of costs.

(4) Hole Injection Layers 120

The hole injection layers 120A are layers made of an oxide such as silver (Ag), molybdenum (Mo), vanadium (V), tungsten (W), nickel (Ni), or the like. When the hole injection layers 120A include a transition metal oxide, multiple valences and multiple energy levels can be taken. As a result, hole injection is facilitated, and a reduction in drive voltage becomes possible.

The hole injection layers 120B, as described above, can be formed by using, for example, an applied film made from an organic polymer solution of an electrically-conductive polymer material such as poly(3,4-ethylenedioxythiophene) polystyrene sulfonate (PEDOT:PSS).

(5) Banks 122

The banks 122 are formed by using an organic material such as a resin, and are insulative. As examples of the organic material used to form the banks 122, acrylic resin, polyimide resin, novalac-type phenolic resin, or the like may be used. The banks 122 beneficially have an organic solvent resistance. More beneficially, acrylic resin is used, because acrylic resin has a low refractive index and is appropriate as a reflector.

Alternatively, when an inorganic material is used for the banks 122, use of silicon oxide (SiO), for example, is beneficial in terms of having an appropriate refractive index. Alternatively, for example, an inorganic material such as silicon nitride (SiN), silicon oxynitride (SiON), or the like can be used.

Further, as the banks 122 may be treated with etching, baking, and the like during a manufacturing process, the banks 122 are beneficially formed by using a highly resistant material that does not excessively deform or change due to such treatments.

In order to make surfaces of the banks 122 liquid-repellant, the surfaces can be treated with fluorine. Further, the banks 122 may be formed by using a material that includes fluorine. Further, in order to lower liquid repellency of surfaces of the banks 122, ultraviolet irradiation of the banks 122 and/or low temperature baking of the banks 122 may be performed.

(6) Hole Transport Layers 121

For the hole transport layers 121, for example, a polyfluorene or a derivative thereof, a polymer compound such as a polyarylamine, which is a amine organic polymer, or a derivative thereof, poly(9,9-di-n-octylfluorene-alt-(1,4-phenylene-((4-sec-butylphenyl)imino)-1,4-phenylene) (TFB), or the like can be used.

(7) Light Emitting Layers 123

The light emitting layers 123, as described above, have a function of emitting light in an excited state generated by recombination of injected holes and electrons. Thus, the light emitting layers 123 are formed by using an organic material that can emit light and can be made into a film by using a wet printing method.

In particular, for example, the light emitting layers 123 are beneficially formed by using a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth metal complex, or the like, as described in JP H05-163488.

(8) Electron Transport Layer 124

An organic material with high electron transportability is used in the electron transport layer 124. The electron transport layer 124A may include a layer made of sodium fluoride. An example of an organic material that may be used in the electron transport layer 124B is a π electron low molecular weight organic material such as an oxadiazole derivative (OXD), a triazole derivative (TAZ), a phenanthroline derivative (BCP, Bphen), or the like.

Further, the electron transport layer 124B may include a layer formed by doping a high electron transporting property organic material with a metal dopant selected from alkali metals or alkaline earth metals.

(9) Common Electrode 125

The common electrode 125A is formed by using silver (Ag), aluminium (Al), or the like as a thin film electrode.

An electrically conductive light-transmissive material is used as the common electrode 125B. For example, the common electrode 125B may be formed by using indium tin oxide (ITO), indium zinc oxide (IZO), or the like.

(10) Sealing Layer 126

The sealing layer 126 is formed by using, for example, a light-transmissive material such as silicon nitride (SiN), silicon oxynitride (SiON), or the like. Further, a sealing resin layer made of a resin material such as acrylic resin, silicone resin, or the like may be provided on the layer formed by using the material such as silicon nitride (SiN), silicon oxynitride (SiON), or the like.

In the case of a top-emission type of display panel, the sealing layer 126 is formed by using a light-transmissive material.

(11) Joining Layer 127

The joining layer 127 is made of a material such as a resin adhesive, for example. For the joining layer 127, a light transmissive resin material such as acrylic resin, silicone resin, epoxy resin, or the like can be used.

(12) Upper Substrate 130

As the upper substrate 130, for example, a light transmissive material such as a glass substrate, a silica glass substrate, or a plastic substrate can be used.

(13) Color Filter Layer 132

As the color filter layer 132, a known resin material (as an example of a commercially available product, color resists manufactured by JSR Corporation) or the like can be used.

(14) Light Shielding Layer 133

The light shielding layer 133 is made of a resin material that is primarily an ultraviolet curable resin (for example, ultraviolet curable acrylic resin) material to which a black pigment is added. As the black pigment, for example, a light shielding material such as a carbon black pigment, a titanium black pigment, a metal oxide pigment, an organic pigment, or the like can be used.

4. Method of Manufacturing Organic EL Panel 10

Figure 34:
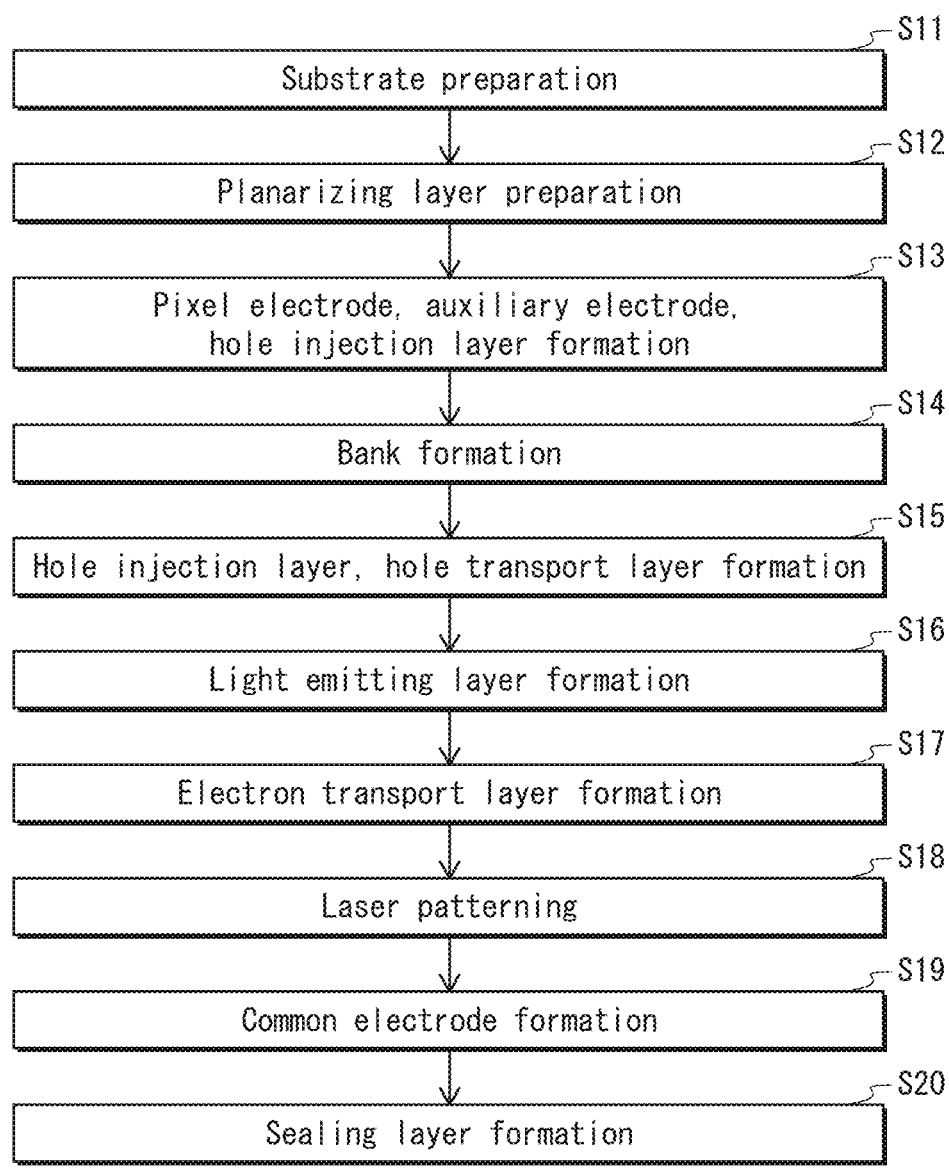
FIG. 34 is a flowchart of an organic EL display panel manufacturing process pertaining to Embodiment 5.

A method of manufacturing the organic EL panel 10 is described with reference to drawings from FIG. 34 to FIG. 41B. FIG. 34 is a flowchart of the organic EL panel 10 manufacturing process pertaining to at least one embodiment. Each drawing from FIG. 35A to FIG. 41B is a schematic cross-section diagram of stages in manufacturing of the organic EL panel 10, taken from the same position indicated by the line A1-A1 in FIG. 32.

(1) Preparing Substrate 100$x$

Figure 35A:
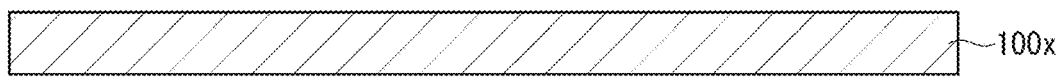
FIG. 35A to FIG. 35D are schematic cross-section diagrams illustrating processes in an organic EL display panel manufacturing process pertaining to Embodiment 5, taken at the same position as line A1-A1 in FIG. 32.

The substrate 100$x$ on which TFTs and wiring are formed is prepared. The substrate 100$x$ can be manufactured by using a known TFT manufacturing method (step S11 in FIG. 34; FIG. 35A).

(2) Forming Planarizing Layer 118

Figure 35B:
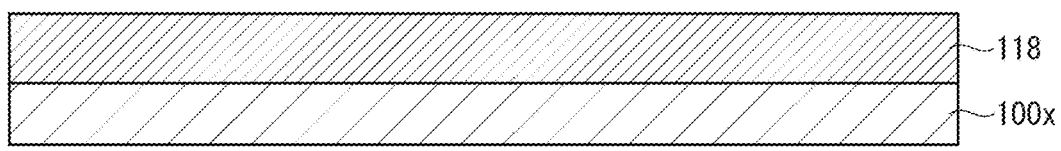

The planarizing layer 118 is formed by coating the substrate 100$x$ with a component material (photosensitive resin material) of the planarizing layer 118 as a photoresist, and by planarizing the coated surface (step S12 in FIG. 34; FIG. 35B).

(3) Forming of Pixel Electrodes 119, Hole Injection Layer 120A

Next, the pixel electrodes 119 and the hole injection layers 120A are formed (step S13 in FIG. 34). A metal film 119$x$ for forming the pixel electrodes 119 is formed by using a vapor phase growth method such as sputtering or vacuum deposition, then patterning is performed by using photolithography and etching. More specifically, first, after forming the planarizing layer 118, dry etching processing is applied to a surface of the planarizing layer 118 to perform cleaning prior to film formation.

Figure 35C:
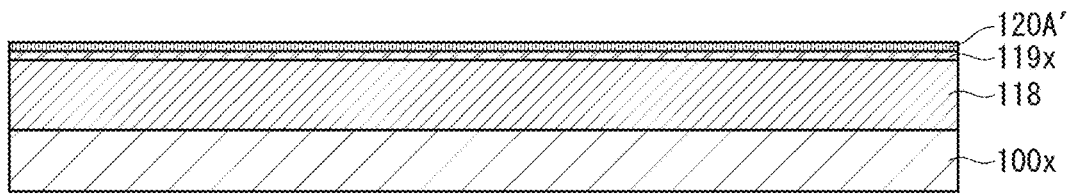

Next, after the cleaning of the surface of the planarizing layer 118, the metal film 119$x$ for forming the pixel electrodes 119 and the auxiliary electrodes 129 is formed on the surface of the planarizing layer 118 by a vapor phase growth method (FIG. 35C). According to the present embodiment, the metal film 119$x$ is a film made of aluminum or an alloy that is primarily aluminum formed by using a sputtering method.

After pre-film-forming cleaning of a surface of the metal film 119$x$, a metal layer 120A' for forming the hole injection layers 120A is formed on the surface of the metal film 119$x$ by a vapor phase growth method (FIG. 35C). According to the present embodiment, the metal layer 120A' is formed by sputtering tungsten.

Figure 35D:
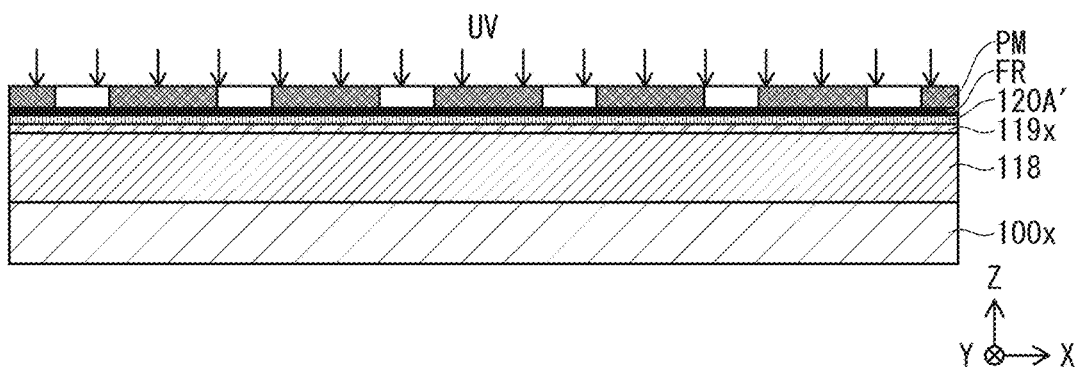

Subsequently, after applying a photoresist layer FR made of a photosensitive resin or the like, a photomask PM provided with defined openings is disposed thereon and irradiated with ultraviolet light to expose the photoresist and transfer the pattern of the photomask to the photoresist (FIG. 35D). Next, the photoresist layer FR is patterned by developing.

Subsequently, dry etching is performed on the metal layer 120A' through the patterned photoresist layer FR to perform patterning, thereby forming the hole injection layers 120A.

Next, the metal film 119$x$ is subjected to wet etching processing through the patterning photoresist layer FR and the hole injection layers 120A to perform patterning, thereby forming the pixel electrodes 119 and the auxiliary electrodes 129.

In forming the hole injection layers 120A, dry etching is performed because, for example, there is a large difference in wet etching rates between the metal layer 120A' made of a tungsten oxide film and the metal film 119$x$ made of an aluminum alloy and therefore it is difficult to process them at the same time. Thus, according to the present embodiment, dry etching using argon gas or the like is used for tungsten oxide, while wet etching is used for aluminum alloy, but the present disclosure is not limited to this example.

According to the manufacturing method of the present embodiment, the hole injection layers 120A are formed and baked under defined conditions, and therefore the hole injection layers 120 are formed made of a tungsten oxide film including tungsten oxide having an oxygen defect structure and the occupied levels described above.

Figure 36A:
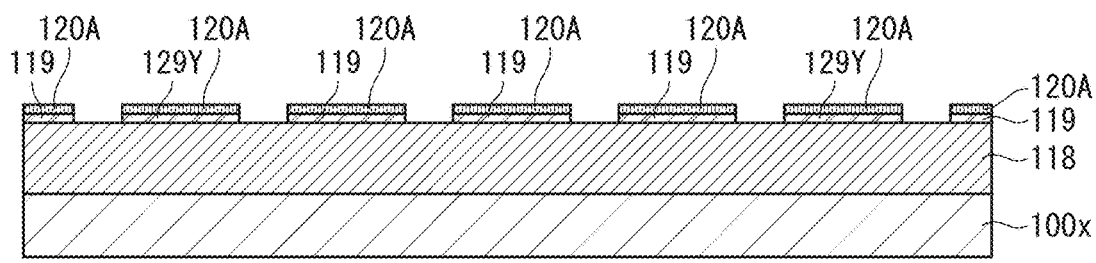
FIG. 36A to FIG. 36C are schematic cross-section diagrams illustrating the organic EL display panel manufacturing process continuing from FIG. 35D.

Finally, the photoresist layer FR is peeled off, leaving the pixel electrodes 119 and the hole injection layers 120A patterned in the same shapes (FIG. 36A).

(4) Forming Banks 122

Figure 36B:
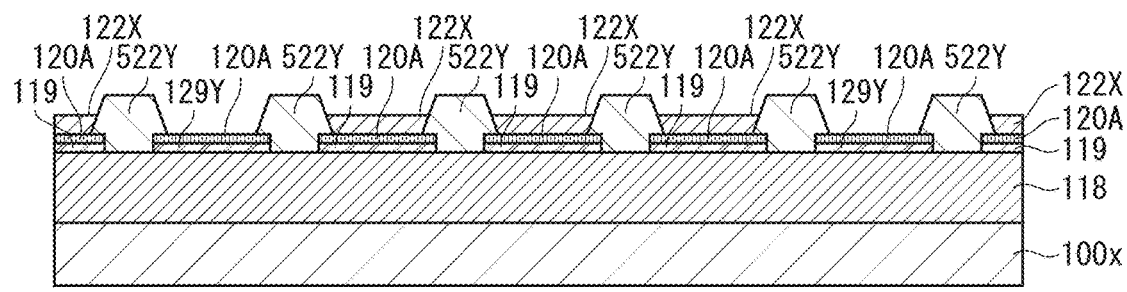

After forming the hole injection layers 120A of the hole injection layers 120, the banks 122 are formed partially covering the hole injection layers 120A. In forming the banks 122, first the row banks 122X are formed and subsequently the column banks 522Y are formed, thereby forming the gaps 522$z$ (step S14 in FIG. 34; FIG. 36B).

To form the row banks 122X, first, a film made of a material of the row banks 122X (for example, a photosensitive resin material) is laminated on the hole injection layers 120A by using a spin coating method or the like. Then the resin film is patterned to form the row banks 122X.

Patterning of the row banks 122X is performed by light exposure using a photomask above the resin film, developing, and baking (at approximately 230° C. for approximately 60 minutes).

Next, to form the column banks 522Y, a film made of a material of the column banks 522Y (for example, a photosensitive resin material) is layered on the hole injection layers 120A and the row banks 122X by using a spin coating method or the like. Forming the gaps 522$z$ is performed by positioning a mask above the resin film, exposing it to light, then developing to pattern the resin film to form the gaps 522$z$ and the column banks 522Y.

More specifically, when forming the column banks 522Y, a photosensitive resin film made of an organic photosensitive resin material such as acrylic resin, polyimide resin, novolac-type phenolic resin, or the like is formed. After drying to partially volatize solvent, a photomask provided with defined openings is overlaid, and ultraviolet irradiation is performed from above to expose a photoresist made of the photosensitive resin or the like, transferring the pattern of the photomask to the photoresist.

Next, insulating layers that are the column banks 522Y patterned by developing of the photosensitive resin are baked (at approximately 230° C. for approximately 60 minutes).

As described above, the hole injection layers 120A are patterned per pixel unit by using photolithography and etching after a film made of metal (for example, tungsten) is formed by using a vapor phase growth method such as sputtering or vacuum deposition, but it is in the baking of the row banks 122X and the column banks 522Y that the metal is oxidized to complete the hole injection layers 120A.

(5) Forming Organic Functional Layers

Figure 36C:
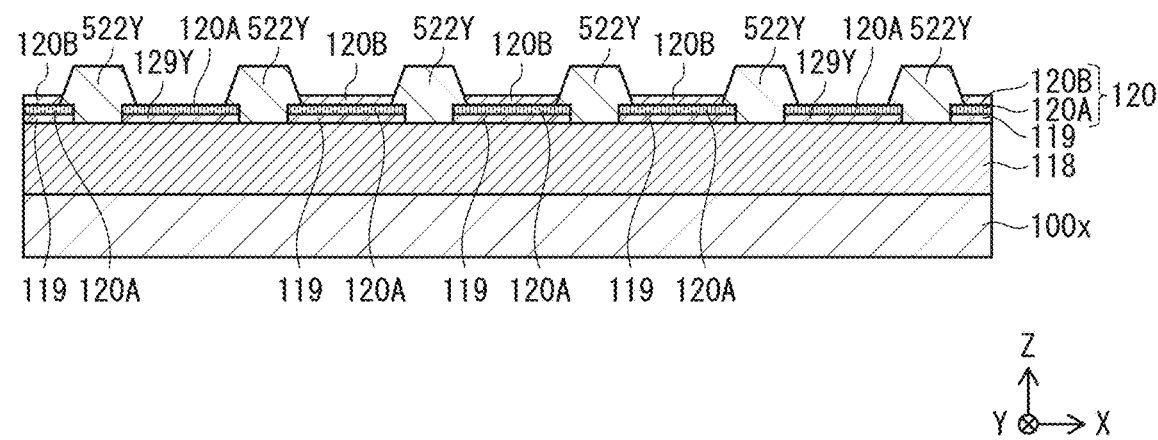
Figure 37A:
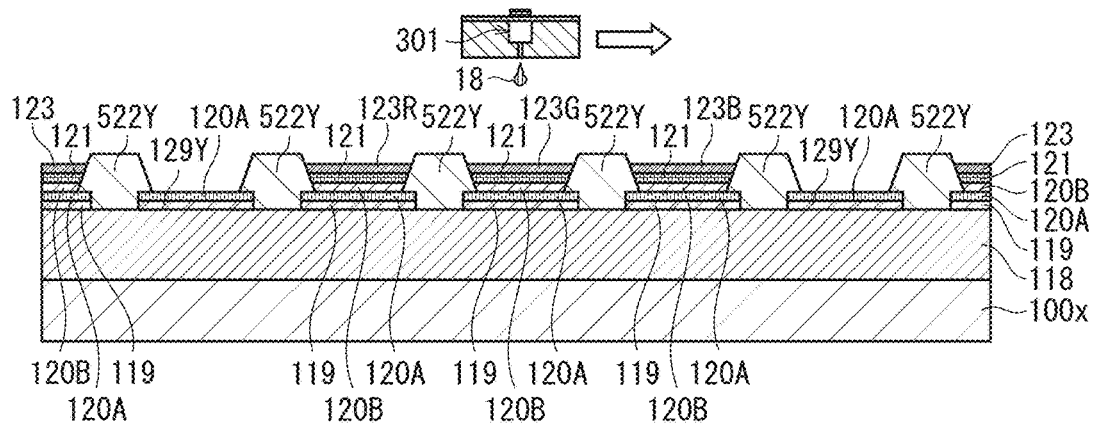
FIG. 37A to FIG. 37C are schematic cross-section diagrams illustrating the organic EL display panel manufacturing process continuing from FIG. 36C.

The hole injection layers 120B, the hole transport layers 121, and the light emitting layers 123 are laminated in this order on the hole injection layers 120A in the gaps 522$z$ defined by the column banks 522Y, including on the row banks 122X (steps S15 and S16 in FIG. 34; FIG. 36C and FIG. 37A).

The hole injection layers 120B are formed by using an inkjet method to apply an ink including an electrically conductive polymer material such as PEDOT:PSS into the gaps 522$z$ defined by the column banks 522Y, then removing a solvent by volatilization or by baking. The hole injection layers 120B are not present in the auxiliary gaps 522$z$A. Subsequently, patterning of each pixel unit may be performed by using photolithography and etching.

The hole transport layers 121 are formed by using a wet process such an inkjet method or gravure printing method to apply ink including a material of the hole transport layers 121 into the gaps 522$z$ defined by the column banks 522Y, then removing a solvent by volatilization or by baking (FIG. 36C). The method of applying ink for forming the hole transport layers 121 in the gaps 522$z$ is the same as the method used for the hole injection layer 120B. The hole transport layers 121 are not present in the auxiliary gaps 522$z$A.

The light emitting layers 123 are formed by using an inkjet method to apply ink including a material of the light emitting layers 123 into the gaps 522$z$ defined by the column banks 522Y (FIG. 37A). More specifically, the substrate 100$x$ on which the column banks 522Y are present extending in the Y direction is placed on an operation table of a droplet ejection device, and while an inkjet head 301 in which nozzle holes are arranged along the Y direction moves relative to the substrate 100$x$ in the X direction, ink droplets 18 from the nozzle holes are made to land on landing targets set in the gaps 522z between the column banks 522Y. The light emitting layers 123 are not formed in the auxiliary gaps 522zA.

Further, in this process, inks 123RI, 123GI, and 123BI including R, G, and B organic light emitting layer material, respectively, are applied by using an inkjet method into the gaps 522z, which are sub pixel formation regions. The inks are then dried under low pressure and baked to form the light emitting layers 123R, 123G, and 123B. In applying the ink of the light emitting layers 123, a solution for forming the light emitting layers 123 is applied by using a droplet ejecting device.

Upon completion of application of ink for forming any one of the red light emitting layers, the green light emitting layers, and the blue light emitting layers with respect to the substrate 100x, another color of ink is applied with respect to the substrate 100x, then the third color of ink is applied. By repeating this process, three colors of ink are applied in order. As a result, red light emitting layers, green light emitting layers, and blue light emitting layers repeatedly alternate across the substrate 100x in the row direction.

Methods of forming the hole injection layers 120B of the hole injection layers 120, the hole transport layers 121, and the light emitting layers 123 are not limited to those described above, and ink may be dropped and applied by a known method other than an inkjet method or a gravure printing method, such as a dispenser method, a nozzle coating method, a spin coating method, intaglio printing, letterpress printing, or the like.

(6) Forming of Electron Transport Layer 124

Figure 37B:
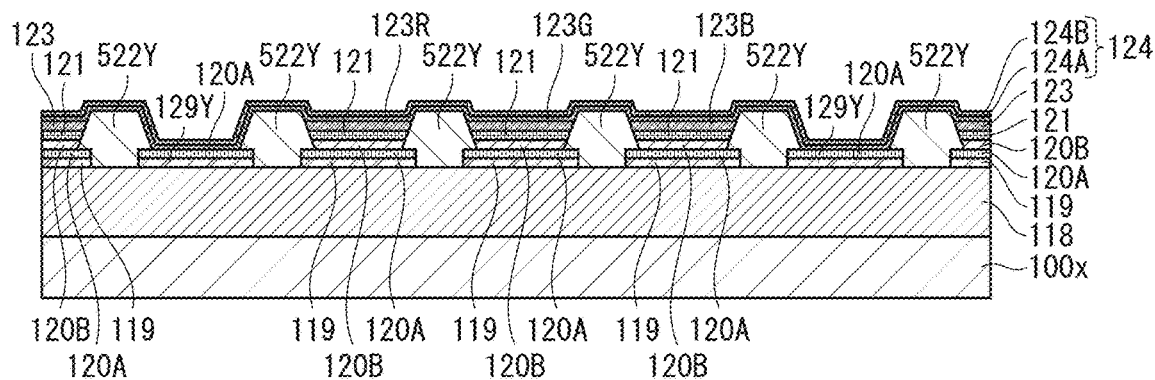

After forming the light emitting layers 123, the electron transport layer 124 is formed to be continuous across a display area of the display panel 10 by using a method such as vacuum deposition (step S17 in FIG. 34; FIG. 37B). Reasons for using vacuum deposition are to avoid damage to the light emitting layers 123, which are organic, and because, in a vacuum deposition method performed under high vacuum, molecules to form a film proceed directly in a direction normal to the substrate. The electron transport layer 124A is formed by vacuum deposition or the like of a metal oxide or fluoride on the light emitting layers 123, to have a film thickness from 1 nm to 10 nm, for example. On the electron transport layer 124A, the electron transport layer 124B is formed by co-evaporation of an organic material and a metal material, to have a film thickness from 10 nm to 50 nm, for example. The electron transport layer 124 has a total film thickness from 20 nm to 50 nm. Note that the above film thicknesses of the electron transport layers 124A, 124B are merely examples. The film thicknesses are not limited to the above values, and are set to thicknesses that are most appropriate for optical light extraction.

(7) Laser Trimming

Figure 37C:
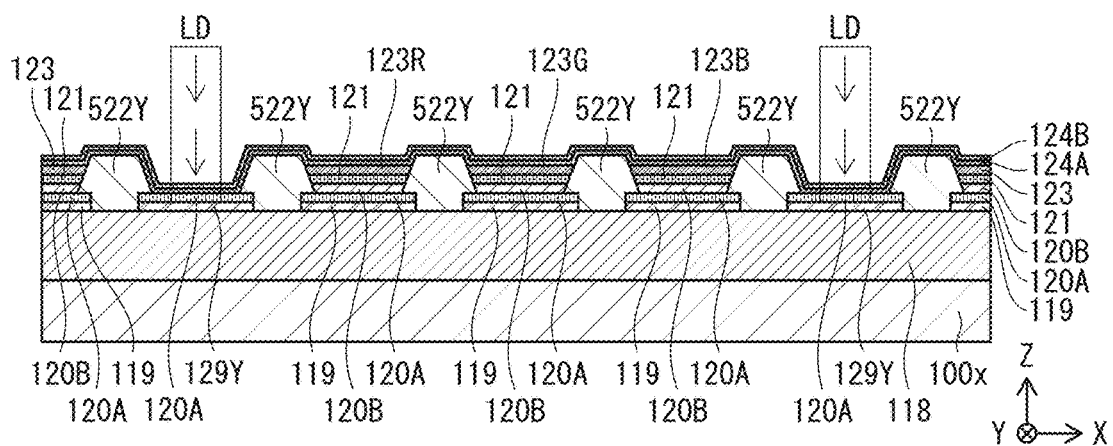
Figure 39A:
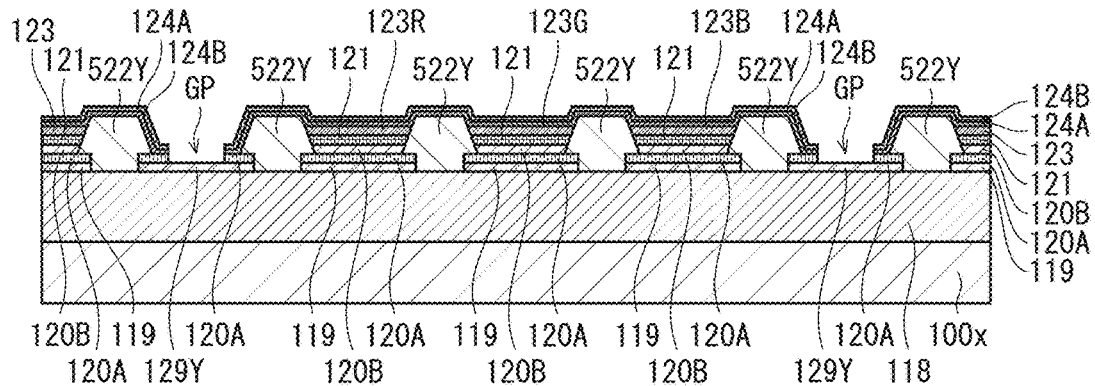
FIG. 39A to FIG. 39C are schematic cross-section diagrams illustrating the organic EL display panel manufacturing process continuing from FIG. 37C.

Portions of the electron transport layer 124 and the hole injection layers 120A in the auxiliary gaps 522zA are irradiated by a laser beam LD to remove portions of the electron transport layer 124 and the hole injection layers 120A (step S18 in FIG. 34; FIG. 37C). Thus, at least in the auxiliary gaps 522zA, portions of the electron transport layer 124 and the hole injection layers 120A extending in the column direction are trimmed to form openings GP, exposing portions of the auxiliary electrodes 129 through the openings GP (FIG. 39A). More specifically, a laser processing device causes a laser head (not illustrated) to execute trimming by irradiating a thin-film-laminated substrate with a laser beam at a laser output and scanning speed that can selectively remove only thin film to be processed, based on a program stored in advance in internal memory or the like.

A known solid-state laser processing device or the like can be used as the laser processing device. As the laser beam, a YAG laser, a UV laser, or the like can be used as a semiconductor laser selected from a range of wavelengths from 200 nm to 380 nm. According to the present embodiment, for example, the third harmonic (approximately 355 nm) or fourth harmonic (approximately 266 nm) of a YAG laser can be used.

Further, it is beneficial that irradiation of the electron transport layer 124 and the hole injection layer 120A by laser beam be performed in a vacuum by depressurizing the chamber containing the substrate by using a vacuum pump. If laser processing were not performed in a vacuum, properties of various organic materials forming the organic EL panel 10 would deteriorate due to the influence of oxygen and moisture in air. Here, "vacuum" may mean a pressure at which properties of the organic EL panel 10 can be prevented from deteriorating (for example, about 0.01 Pa), and a perfect vacuum is not required.

Laser processing is processing in which material is removed by raising a temperature of a portion irradiated with a laser beam, changing the portion from a solid phase to a liquid phase and further to a gas phase.

The auxiliary electrodes 129 are a base layer during laser trimming of the electron transport layer 124 and the hole injection layers 120A, and it is beneficial that the auxiliary electrodes 129 are not damaged by laser irradiation. Thus, it is necessary that processing resistance to laser irradiation of the auxiliary electrodes 129 is higher that of the material of the electron transport layer 124 and the hole injection layers 120A to be removed. In order to achieve a high processing resistance to laser irradiation, the auxiliary electrodes 129 need to have a light absorptivity lower than that of the material to be processed at the wavelength of the laser irradiation. Thus, the auxiliary electrodes 129 need to be made of a material with a lower light absorptivity at the wavelength of the laser irradiation than the material of the electron transport layer 124 and the hole injection layers 120A.

By selecting a material having a light absorptivity lower than that of the electron transport layer 124 and the hole injection layers 120A at the wavelength of the laser irradiation, the auxiliary electrodes 129 have a high resistance to the laser irradiation, and damage to the auxiliary electrodes 129 when the electron transport layer 124 and the hole injection layers 120A are laser trimmed can be prevented.

Figure 38:
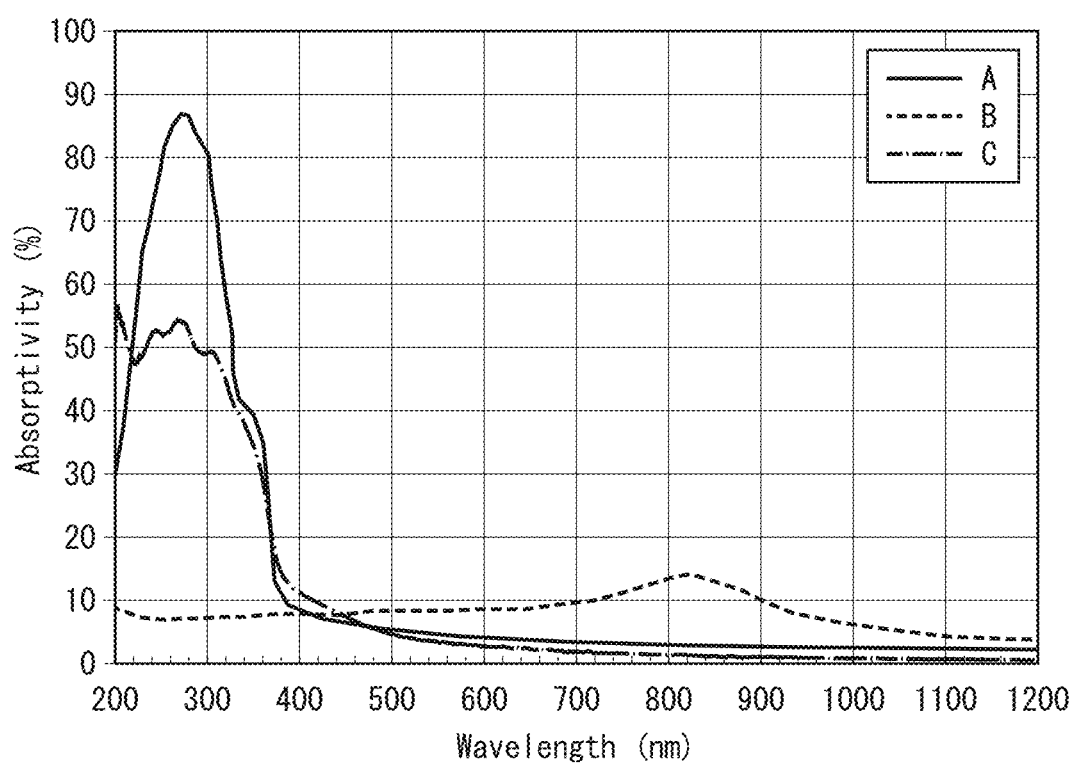
FIG. 38 illustrates experimental results showing a relationship between light wavelength and light absorption rate in constituent material of an organic EL display panel.

FIG. 38 illustrates experimental results showing a relationship between light wavelength and light absorption rate in constituent material of the organic EL panel 10. In FIG. 38, light absorptivity at each wavelength of light is illustrated, where A indicates silver, B indicates aluminum, and C indicates constituent material of the electron transport layer 124. As shown in FIG. 38, aluminum, which is a constituent material of the auxiliary electrodes 129, has a peak of high light absorptivity in a range from 700 nm to 900 nm, and a small light absorptivity of 10% or less in a range equal to or less than 700 nm. In contrast, silver, which can be used for the pixel electrodes 119, has a peak of high light absorptivity in a range from 200 nm to 380 nm. Further, an organic substance that is a constituent material of the electron transport layer 124 has a peak of high light absorptivity in a range from 200 nm to 380 nm, and a small light absorptivity of 10% or less in a range equal to or greater than 400 nm.

Further, although not shown in FIG. 38, it is known that oxides of one or more elements selected from silver (Ag), molybdenum (Mo), vanadium (V), tungsten (W), and nickel (Ni), which is a constituent material of the hole injection layers 120A, have a high light absorptivity in a range equal to or greater than 400 nm (for examples, see JP 2004-020822, JP 2011-034917, JP 2007-252974, and JP H08-86752).

According to the present embodiment, the electron transport layer 124 is irradiated with a laser beam to trim a portion thereof, material of the auxiliary electrodes 129 is a metal layer or alloy layer a main component of which is aluminum, and by using a laser that emits light of a wavelength from 200 nm to 380 nm, damage to the auxiliary electrodes 129 can be prevented and only portions of the electron transport layer 124 and the hole injection layers 120A, and other functional layers intended to be removed, can be efficiently removed.

As a result, when trimming is performed by irradiating portions to be removed of the electron transport layer 124 and the hole injection layers 120A with a laser beam, emission energy of the laser can be increased when compared with conventional technology, the portions to be removed can be reliably removed, and it is possible to perform high speed trimming at several meters per second.

(8) Forming of Common Electrode 125

Figure 39B:
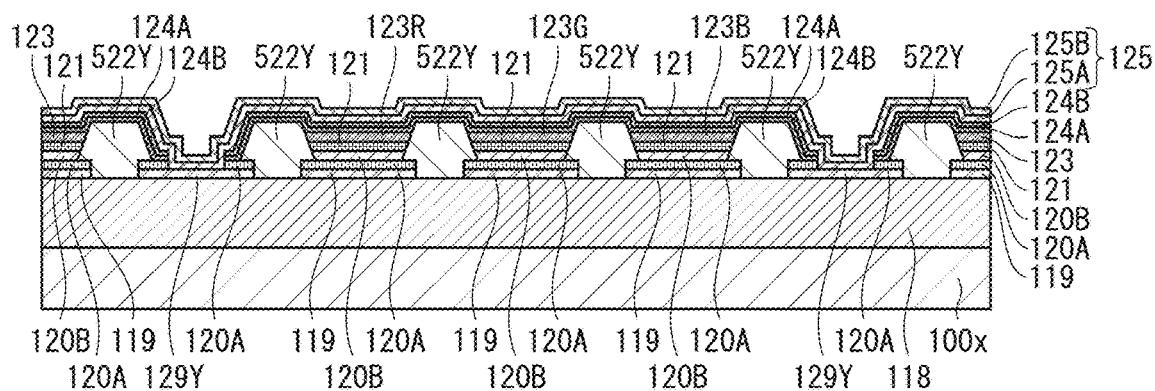

After forming the electron transport layer 124, the common electrode 125 is formed covering the electron transport layer 124 (step S19 in FIG. 34; FIG. 39B). The common electrode 125 includes, in order from closest to the substrate 100x, a common electrode 125A whose main component is a metal and a common electrode 125B composed of a metal oxide and laminated on the common electrode 125A.

First, the common electrode 125A is formed to cover the electron transport layer 124 by a CVD method, a sputtering method, or a vacuum deposition method (FIG. 39B). In the present example, the common electrode 125A is formed by depositing silver by using vacuum deposition.

Next, the common electrode 125B is formed on the common electrode 125A by a sputtering method or the like. According to the present example, the common electrode 125B is formed by using a sputtering method to form a light-transmissive electrically-conductive layer of ITO, IZO, or the like.

In forming the common electrode 125, portions of the auxiliary electrodes 129 and the common electrode 125 are reliably brought into contact with each other through the openings GP in the auxiliary gaps 522zA where portions of the electron transport layer 124 and the hole injection layers 120A are trimmed along the column direction, ensuring electrical connection between the auxiliary electrodes 129 and the common electrode 125.

(9) Forming Sealing Layer 126

Figure 39C:
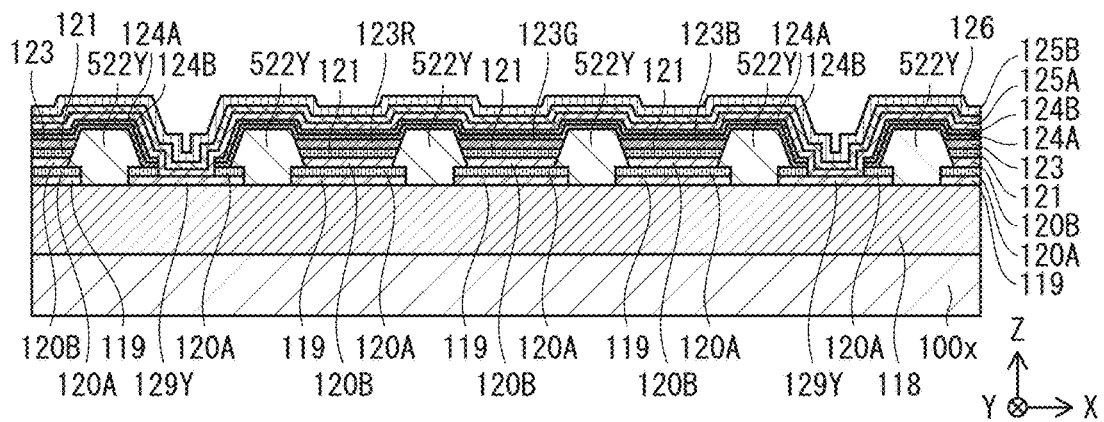

The sealing layer 126 is formed to cover the common electrode 125 (step S20 in FIG. 34; FIG. 39C). The sealing layer 126 can be formed by using a CVD method, a sputtering method, or the like.

(10) Forming Color Filter Substrate 131

Next, an example of a manufacturing process of the color filter substrate 131 is described.

Figure 40A:
FIG. 40A to FIG. 40G are schematic cross-section diagrams illustrating an example of an organic EL display panel color filter substrate manufacturing process.

The upper substrate 130, which is light-transmissive, is prepared, and a material layer 133' of the light shielding layers 133 that is primarily an ultraviolet curable resin (for example, ultraviolet curable acrylic resin) material to which a black pigment is added, is applied on one surface of the upper substrate 130 (FIG. 40A).

Figure 40B:
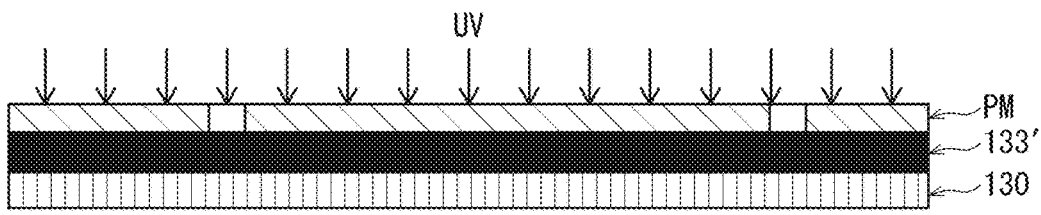

A pattern mask PM having defined openings is overlaid on an upper surface of the material layer 133' and is irradiated from above with ultraviolet light (FIG. 40B).

Figure 40C:
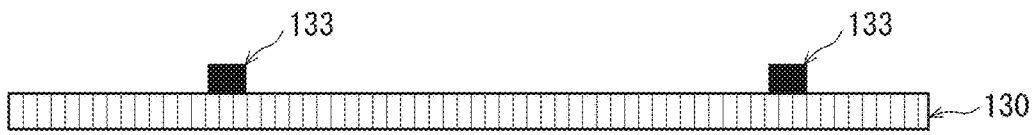

Then, by removing the pattern mask PM and uncured portions of the material layer 133', developing, and curing, the light shielding layers 133 are completed and each has, for example, a substantially rectangular shape in cross-section (FIG. 40C).

Figure 40D:
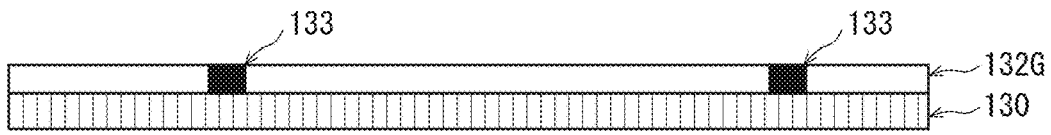
Figure 40E:
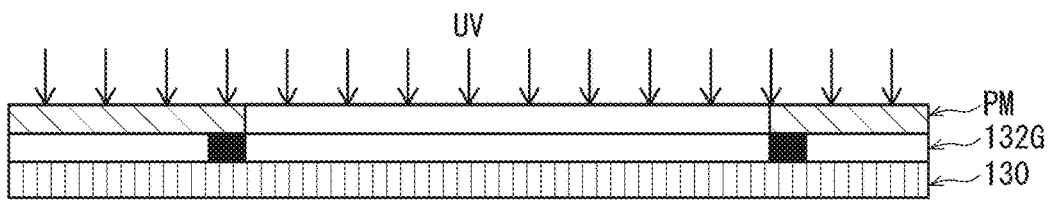

Next, a material of the color filter layer 132 (in this example, 132G) that is primarily an ultraviolet curable resin component is applied to a surface of the upper substrate 130 on which the light shielding layers 133 are formed (FIG. 40D). Next, a defined pattern mask PM is placed, and ultraviolet irradiation is performed (FIG. 40E).

Figure 40F:
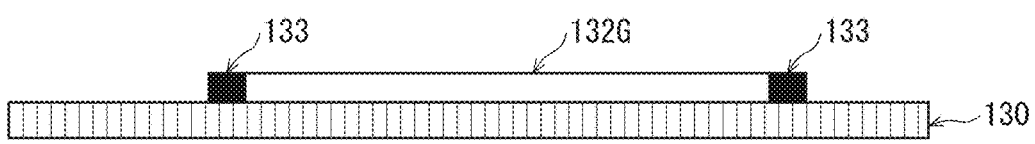

Subsequently, curing is performed, and the pattern mask PM and uncured portions of the material 132G are removed by developing to form the color filter layer 132G (FIG. 40F).

Figure 40G:
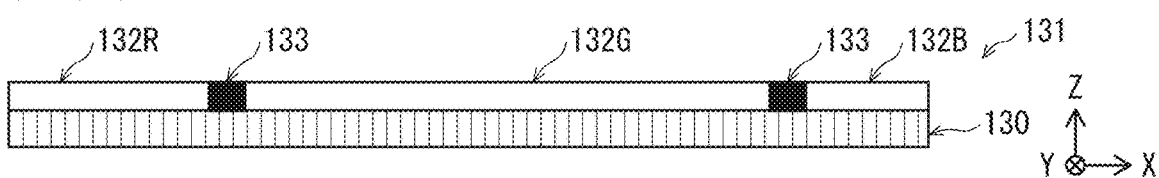

This process is repeated for each color of color filter material to form the color filter layers 132R, 132B (FIG. 40G). Thus, the color filter substrate 131 is formed.

(11) Joining of Color Filter Substrate 131 and Back Panel

Next, a material of the joining layer 127 that is primarily an ultraviolet curable resin such as acrylic resin, silicone resin, epoxy resin, or the like, is applied to a back panel that includes every layer from the substrate 100x to the sealing layer 126 (FIG. 41A).

Next, the applied material is irradiated with ultraviolet light, and the back panel and the color filter substrate 131 are joined while matching positions relative to each other. No gas should enter between the back panel and the color filter substrate 131 at this time. Next, a sealing process is completed by baking, completing the organic EL panel 10 (FIG. 41B).

5. Effects of Embodiment 5

(1) Effects of Organic EL Panel 10 Manufacturing Method and Organic EL Panel 10

As described above, the method of manufacturing the organic EL panel 10 pertaining to at least one embodiment includes: preparing the substrate 100x, forming the pixel electrodes 119 and the auxiliary electrode 129 on the substrate 100x, the auxiliary electrode 129 comprising aluminum or aluminum alloy and extending in a row and/or column direction in plan view; forming the light emitting layers 123 above the pixel electrodes 119; forming the electron transport layer 124 above the pixel electrodes 119 and the auxiliary electrode 129; irradiating the electron transport layer 124 with a laser beam of wavelength from 200 nm to 380 nm to remove a portion of the electron transport layer 124 above the auxiliary electrode 129 to expose a portion of the auxiliary electrode 129; and forming the common electrode 125 to be continuous above the pixel electrodes 119 and the auxiliary electrode 129 and in contact with the portion of the auxiliary electrode 129.

Conventionally, when a laser beam is applied to remove portions of an organic functional layer such as the electron transport layer 124, the auxiliary electrodes 129 below the functional layer are damaged by transmitted laser light, degrading performance of organic EL elements. When the auxiliary electrodes 129 are damaged by laser beam irradiation, issues can occur such as a burr forming and a defect occurring in sealing over the burr during a subsequent process, lowering reliability, and a change in film thickness of the auxiliary electrodes 129 leading to an increase in electrical resistance of the auxiliary electrodes 129, and in a worst case removal of the auxiliary electrodes 129 leading to a deterioration in function due to disconnection.

If the electron transport layer 124 and the hole injection layers 120A are irradiated with a laser beam at a wavelength around 450 nm, constituent material of the electron transport layer 124 and constituent material of the hole injection layers 120A have a small light absorptivity at wavelengths greater than 400 nm, as described above, and therefore the electron transport layer 124 and the hole injection layers 120A on the auxiliary electrodes 129 cannot be reliably removed.

In contrast, in the method of manufacturing the organic EL panel 10 pertaining to the present embodiment, when portions of a functional layer are irradiated with a laser beam at wavelength from 200 nm to 380 nm, the effect of the laser beam on the auxiliary electrodes 129 made of aluminum or aluminum alloy is reduced, while portions of functional layers including the electron transport layer 124 made of an organic material that has a high light absorptivity in a range from 200 nm to 380 nm and the hole injection layers 120A made of an oxide that has a high light absorptivity in a range equal to or less than 400 nm can be reliably removed.

Thus, emission energy of the laser can be increased when compared to conventional technology, and high speed patterning at several meters per second can be achieved. Further, while suppressing deterioration in performance of the organic EL elements 100, contact is ensured between the auxiliary electrodes 129 and the common electrode 125, making an electrical connection, reducing unevenness in luminance due to voltage drop, allowing manufacture of the organic EL panel 10 that has improved light emission efficiency in comparison to conventional technology.

(2) Effects of not Forming Light Emitting Layers 123 Above the Auxiliary Electrodes 129

According to the method of manufacturing a display panel pertaining to the present embodiment, in forming the light emitting layers 123, a printing method is used in which the light emitting layers 123 are selectively formed on the pixel electrodes 119, and not above the auxiliary electrodes 129.

In the method of manufacturing the organic EL panel 10, the light emitting layers 123R, 123G, 123B are selectively formed only in the gaps 522zR, 522zG, 522zB of corresponding sub-pixels. Further, functional layers other than the light emitting layers 123, i.e., the hole injection layers 120B and the hole transport layers 121 are also selectively formed in only the gaps 522zR, 522zG, 522zB. Accordingly, manufacturing equipment or processes for masking or the like are not required to ensure that the light emitting layers 123 are not formed in the auxiliary gaps 522zA where the auxiliary electrodes 129 are present. Thus, in manufacturing the organic EL panel 10, it is possible to achieve a structure in which the light emitting layers 123 are not formed above the auxiliary electrodes 129 without requiring specific manufacturing costs and the like.

Accordingly, in manufacturing the organic EL panel 10, film thickness of an organic functional layer to be removed can be reduced by laser trimming without requiring specific manufacturing costs and the like, and therefore an amount of debris generated by laser irradiation can be reduced, making is possible to further suppress occurrence of defects due to the debris in post-processing sealing. Further, laser emission energy can be kept low by reducing the number of layers to be processed, making damage to the auxiliary electrodes 129 less likely.

(3) Effect of Reliably Removing Hole Injection Layers 120A Formed at Same Time as Pixel Electrodes 119 and Auxiliary Electrodes 129

According to a method of manufacturing the organic EL panel 10, the hole injection layers 120A that include an oxide of one or more elements selected from the group consisting of silver, molybdenum, vanadium, tungsten, and nickel, may be formed above the pixel electrodes 119 and the auxiliary electrodes 129 by patterning outer shape thereof at the same time as the pixel electrodes 119 and the auxiliary electrodes 129, and portions of the hole injection layers 120A overlapping with portions of the electron transport layers 124 may be removed by laser irradiation.

As described above, according to a method of manufacturing the organic EL panel 10, the hole injection layers 120B and the hole transport layers 121, which are functional layers, are also selectively formed in only the gaps 522zR, 522zG, 522zB. Accordingly, such functional layers (hole injection layers 120B, hole transport layers 121) are not formed above the auxiliary electrodes 129.

However, the hole injection layers 120A formed on top surfaces of the pixel electrodes 119, as illustrated in FIG. 35C, FIG. 35D, and FIG. 36A, are formed by forming a metal layer 120A' on a surface of the metal film 119x by a vapor phase growth method, then patterning by using photolithography to form stacks of the pixel electrodes 119 and the hole injection layers 120A.

In such a case, if the electron transport layer 124 and the hole injection layers 120A are irradiated with a laser beam at a wavelength around 450 nm, constituent material of the electron transport layer 124 and constituent material of the hole injection layers 120A have a small light absorptivity at wavelengths greater than 400 nm, and therefore the electron transport layer 124 and the hole injection layers 120A on the auxiliary electrodes 129 cannot be reliably removed.

In contrast, in a method of manufacturing the organic EL panel 10, even when the hole injection layers 120A above the pixel electrodes 119 and the auxiliary electrodes 129 are patterned at the same time as the pixel electrodes 119 and the auxiliary electrodes 129, the electron transport layer 124 and the hole injection layers 120A above the auxiliary electrodes 129 are irradiated by a laser beam of wavelength from 200 nm to 380 nm, and therefore overlapping portions of both the electron transport layer 124 and the hole injection layers 120A can be removed. The oxide of the hole injection layers 120A has a high light absorptivity in a range equal to or below 400 nm, and by irradiating defined portions thereof above the auxiliary electrodes 129 with a laser beam, damage to the auxiliary electrodes 129 is prevented while the portions irradiated by the laser beam are removed to allow contact between the auxiliary electrodes 129 and the common electrode 125, and the oxide layers formed over the pixel electrodes 119 can function as the hole injection layers 120A.

As a result, the organic EL panel 10 at high definition can be manufactured with a better light emission efficiency than that of conventional technology while reducing luminance unevenness due to voltage drop across a plane.

By combining the organic EL panel 10 manufactured as described above with a known drive controller (see drive controller 400, FIG. 7), an organic EL display device can be formed.

Modifications of Embodiment 5

An organic EL panel pertaining to Embodiment 5 has been described as an embodiment of the present disclosure, but the present disclosure is not limited to the description of Embodiment 5 beyond essential characteristic elements thereof. For example, various modifications conceivable by a person having ordinary skill in the art, and any combination of elements and functions of embodiments that do not depart from the spirit of the present invention are also included in the present disclosure. The following describes modifications of the organic EL panel 10 as examples of such embodiments.

(1) Modifications 1, 2, 3

The following describes an organic EL panel 10A pertaining to Modification 1 of Embodiment 5. According to a method of manufacturing the organic EL panel 10 pertaining to at least one embodiment, as illustrated in FIG. 32, red, blue, and green light emission colors of the light emitting layers 123 are disposed above three columns of the pixel electrodes 119, and when three consecutive ones of the pixel electrodes 119 in the row direction are referred to as a pixel electrode group, the auxiliary electrodes 129X are formed extending along the auxiliary gaps 122zA in the row direction between adjacent pixel electrode groups, and the auxiliary electrodes 129Y are formed extending along the auxiliary gaps 522zA in the column direction between adjacent pixel electrode groups. Then, in removal of portions of the electron transport layer 124 and the hole injection layers 120A by laser irradiation, portions of the electron transport layer 124 and the hole injection layers 120A above the auxiliary electrodes 129 in both the column and row directions are removed to form the contact portions 129XA, 129YA.

However, arrangements of the auxiliary electrodes 129 and the contact portions 129XA, 129YA are not limited to this example, and may be changed as appropriate.

Figure 42:
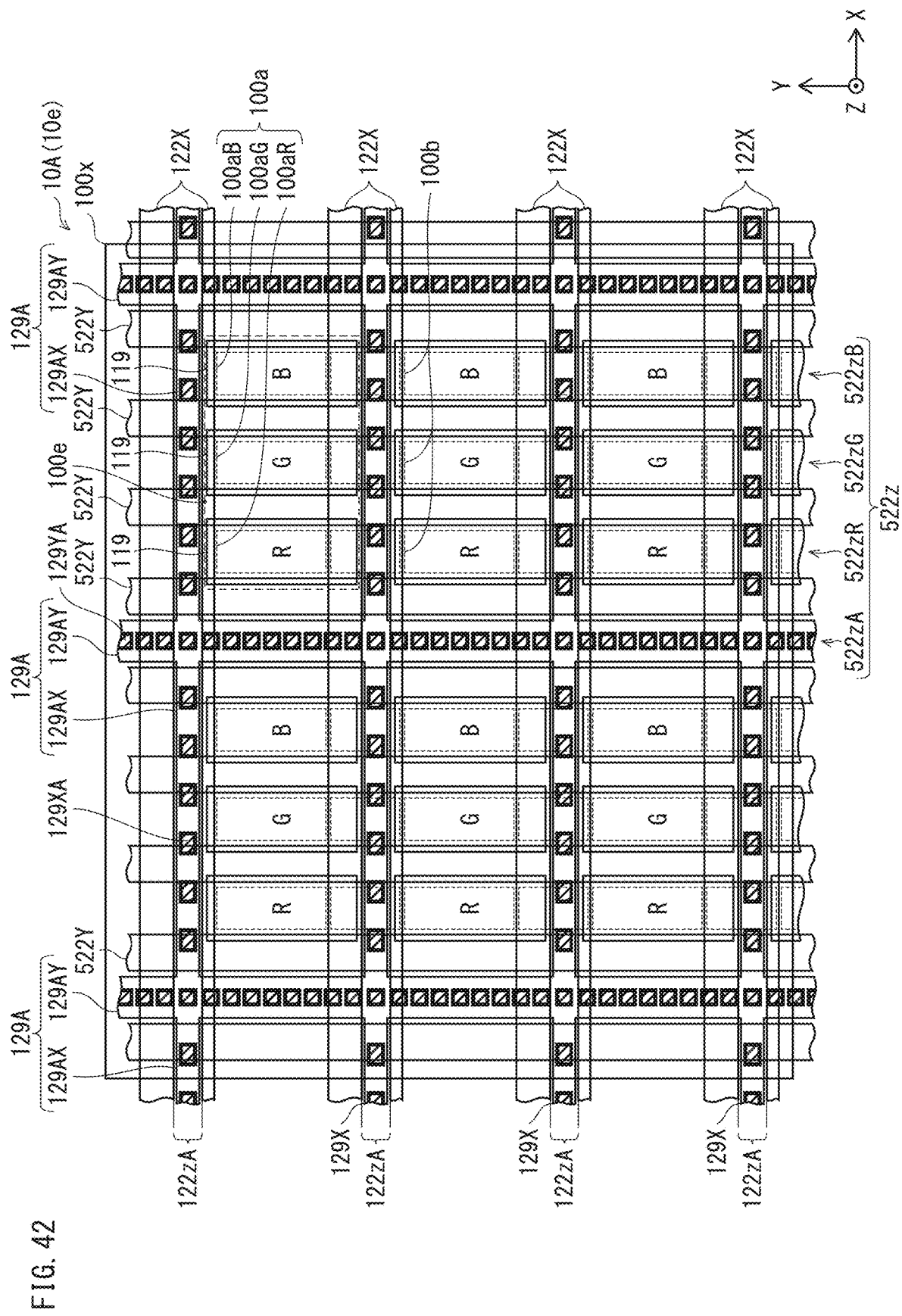
FIG. 42 is a schematic plan view diagram illustrating a portion of an organic EL display panel pertaining to Modification 1 of Embodiment 5.

FIG. 42 is a schematic plan view diagram illustrating a portion of the organic EL panel 10A pertaining to Modification 1 of Embodiment 5. According to the method of manufacturing the organic EL panel 10A pertaining to Modification 1 of Embodiment 5, in removal of portions of the electron transport layer 124 and the hole injection layers 120A, discrete portions of the electron transport layer 124 and the hole injection layers 120A above the auxiliary electrodes 129 are removed. As a result, in the formation of the auxiliary electrode 129A, the contact portions 129XA are intermittent in the row direction of the auxiliary gaps 122zA between adjacent pixel groups, and the contact portions 129YA are intermittent in the column direction of the auxiliary gaps 522zA between adjacent pixel groups.

According to this structure, when manufacturing the organic EL panel 10A pertaining to Modification 1 of Embodiment 5, processing is easier than when forming the contact portions 129XA, 129YA extending continuously in the row and column directions.

Further, processing time can be shortened, and laser beam source usage can be reduced. Further, the auxiliary electrode 129Y itself may be intermittently disposed in the row direction in the auxiliary gaps 122zA and/or the column direction in the auxiliary gaps 522zA. This can further shorten processing time and reduce laser beam source usage.

Figure 43:
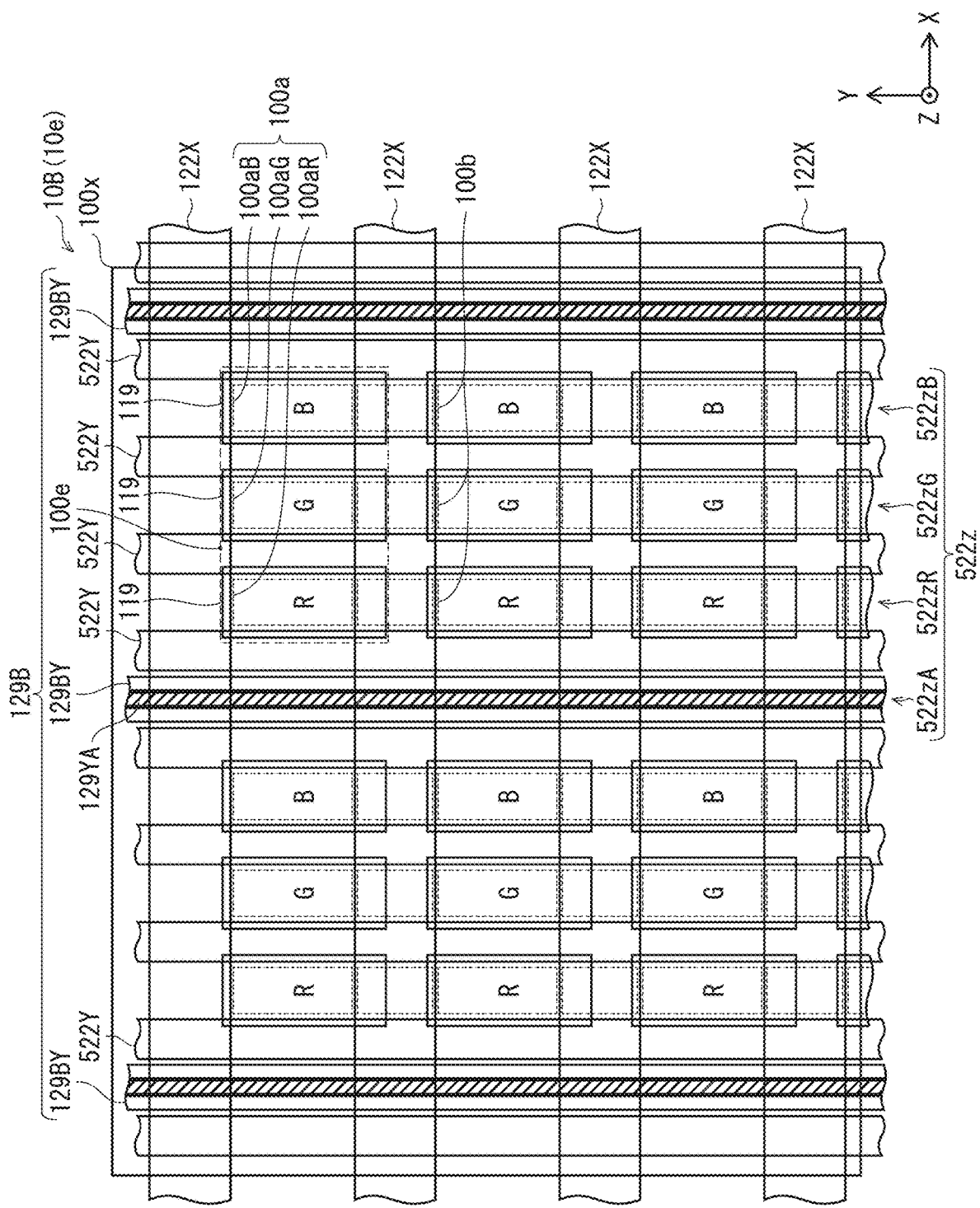
FIG. 43 is a schematic plan view diagram illustrating a portion of an organic EL display panel pertaining to Modification 2 of Embodiment 5.

As illustrated in the schematic plan view of FIG. 43, illustrating a portion of an organic EL panel 10B pertaining to Modification 2 of Embodiment 5, in a method of manufacturing the organic EL panel 10B pertaining to Modification 2 of Embodiment 5, in forming of auxiliary electrodes 129B, auxiliary electrodes 129BY and the contact portions 129YA extending in the longitudinal direction of the auxiliary electrodes 129BY may be disposed in only all of the auxiliary gaps 522zA between the pixel electrode groups, or only all of the auxiliary gaps 122zA between the pixel electrode groups. When compared to a structure in which the auxiliary electrodes 129 are in all gaps between pixel electrode groups in the row direction and the column direction, processing time can be shortened and usage of the laser beam source can be reduced.

Figure 44:
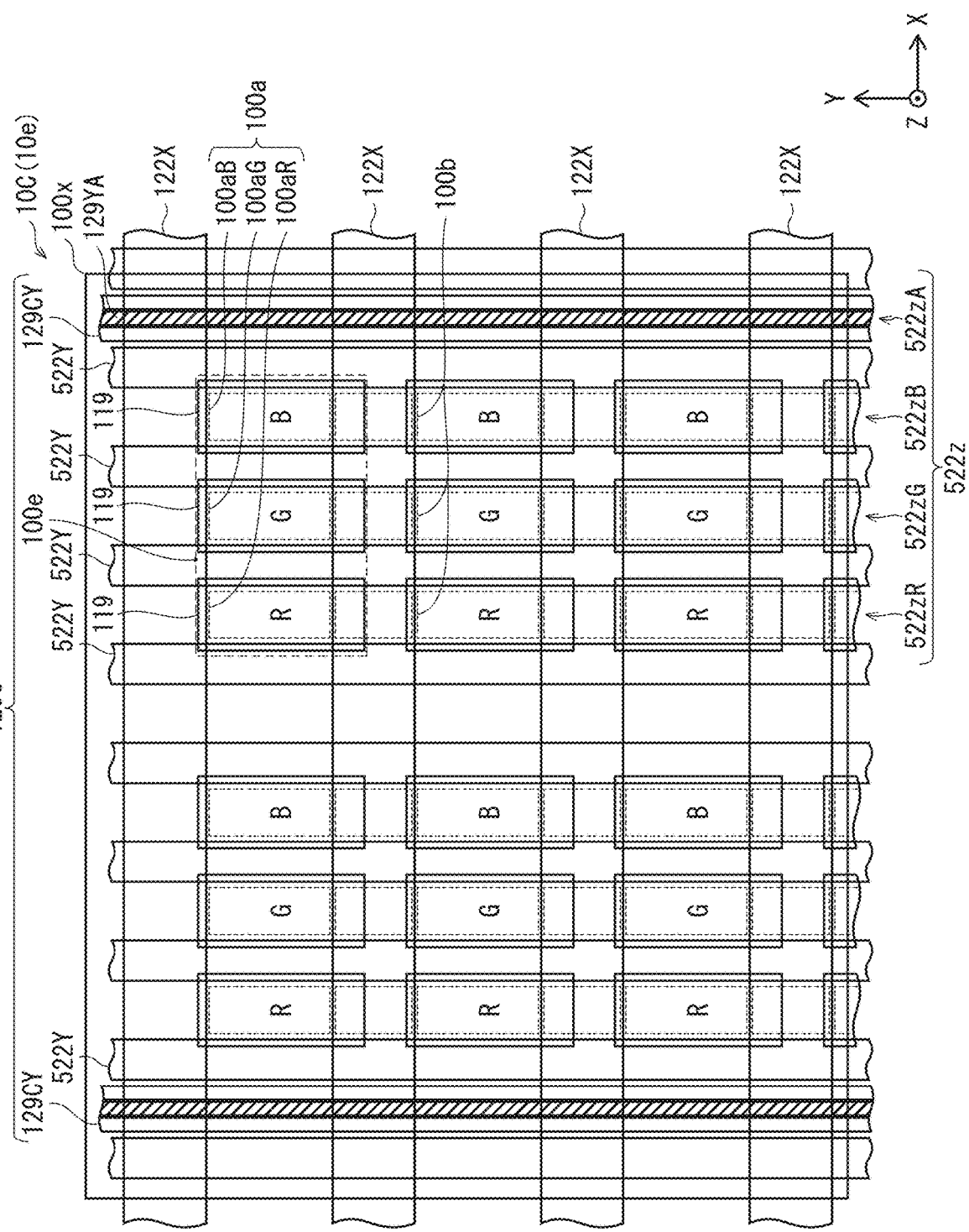
FIG. 44 is a schematic plan view diagram illustrating a portion of an organic EL display panel pertaining to Modification 3 of Embodiment 5.

Further, as illustrated in the schematic plan view of FIG. 44, illustrating a portion of an organic EL panel 10C pertaining to Modification 3 of Embodiment 5, in a method of manufacturing the organic EL panel 10C pertaining to Modification 3 of Embodiment 5, in forming of auxiliary electrodes 129C, auxiliary electrodes 129CY and the contact portions 129YA extending in the longitudinal direction of the auxiliary electrodes 129CY may be disposed in only a portion of the auxiliary gaps 522zA between the pixel electrode groups, or only a portion of the auxiliary gaps 122zA between the pixel electrode groups. When compared to a structure in which the auxiliary electrodes 129 are in all gaps between pixel electrode groups in the row direction or the column direction, processing time can be shortened and usage of the laser beam source can be reduced.

(2) Other Modifications

According to the organic EL panel 10 pertaining to at least one embodiment, after forming the metal film 119x and the metal film 120A' for the hole injection layers 120A, patterning is performed to form the hole injection layers 120A on top surfaces of the pixel electrodes 119 and the auxiliary electrodes 129. However, an oxide layer including titanium oxide, ITO, or IZO above the pixel electrodes 119 and the auxiliary electrodes 129 may be patterned at the same time as the pixel electrodes 119 and the auxiliary electrodes 129, and then a portion of the oxide layer overlapping with a portion of the electron transport layer 124 may be removed at the same time as the electron transport layer 124 through irradiation using a laser beam with a wavelength from 200 nm to 380 nm. The oxide layer including titanium oxide, ITO, or IZO has a high light absorptivity in a range equal to or less than 400 nm, and by irradiating a defined portion on the auxiliary electrodes 129 with laser light, the portion of the oxide layer can be removed while preventing damage to the auxiliary electrodes 129, and the oxide layer on the pixel electrodes can function as an electrode protective layer.

Further, the pixel electrodes 129 are made of aluminum or aluminum alloy, and therefore an aluminum oxide layer is formed on surfaces thereof. However, for example, by irradiation with the fourth harmonic of a YAG laser, the aluminum oxide layer in an absorption region at a wavelength equal to or less than 300 nm can be removed at the same time as the electrode transport layer 124 to create contact between the auxiliary electrodes 129 and the common electrode 125.

According to the organic EL panel 10 pertaining to at least one embodiment, the auxiliary electrodes 129 are present in the auxiliary gaps 122zA and/or the auxiliary gaps 522zA, but the disposition of the auxiliary electrodes 129 is not limited to this. For example, the auxiliary electrodes 129 may be present on the banks 122X, 522Y. For example, the auxiliary electrodes 129Y may be present on the top surfaces 522Yb of the column banks 522Y.

According to the organic EL panel 10 pertaining to at least one embodiment, the colors of light emitted by the light emitting layers 123 of the sub pixels 100se in the gaps 522z between the column banks 522Y that are adjacent in the row direction are different from each other, and the colors of light emitted by the light emitting layers 123 of the sub pixels 100se in gaps between the row banks 122X that are adjacent in the column direction are the same. However, the colors of light emitted by the light emitting layers 123 of the sub pixels 100se that are adjacent in the row direction may be the same, and the colors of light emitted by the light emitting layers 123 of the sub pixels 100se that are adjacent in the column direction may be different from each other.

According to the organic EL panel 10 pertaining to at least one embodiment, there is a red subpixel, a green subpixel, and a blue subpixel in each of the unit pixels 100e, but the present disclosure is not limited to this example. As another example, the light emitting layers may all be of a single type, or there may be four types emitting colors of light such as red, green, blue, and white.

Further, according to at least one embodiment, the unit pixels 100e are arranged in a matrix, but the present disclosure is not limited in this way. For example, the effects of the present disclosure can be achieved even when spacing between pixel regions is at one pitch, and adjacent pixel regions similarly spaced are shifted by a half pitch in the column direction. For high resolution display panels, some shift in the column direction is hard to visually determine, and even if some film thickness variation is lined up on a straight line (or staggered line) of a certain width, it will appear as a band. Accordingly, even with such a structure, display quality of a display panel can be increased by suppressing lining up of luminance unevenness along a staggered line.

Further, according to at least one embodiment, the hole injection layers 120, the hole transport layers 121, the light emitting layers 123, and the electron transport layer 124 are present between the pixel electrodes 119 and the common electrode layer 125, but the present disclosure is not limited to this structure. For example, a structure is possible in which only the light emitting layers 123 are present between the pixel electrodes 119 and the common electrode layer 125, without use of the hole injection layers 120, the hole transport layers 121, and the electron transport layer 124. Further, for example, a structure is possible in which a layer or a plurality of layers selected from the group consisting of hole injection layers, hole transport layers, an electron transport layer, and an electron injection layer are present. Further, all the layers need not be made of organic compounds, and at least one layer may be made of an inorganic compound.

According to at least one embodiment, the light emitting layers 123 are formed by using a wet film forming process such as a printing method, a spin coating method, an inkjet method, or the like, but the present disclosure is not limited to this. For example, a dry process such as a vacuum deposition method, an electron beam deposition method, a sputtering method, a reactive sputtering method, an ion plating method, a vapor growth method, or the like can be used. Further, a publicly known material may be adopted as appropriate as a material of any component.

Further, according to at least one embodiment, a top-emission type of EL display panel is given as an example, but the present disclosure is not limited to this. For example, a bottom-emission type of the display panel or the like can be used. In such a case, each structure can be changed appropriately.

<<Supplement>>

The embodiments described above each indicate one beneficial specific example of the present disclosure. Numerical values, shapes, materials, constituent elements, arrangement positions and connections of constituent elements, steps, order of steps, and the like indicated as embodiments are merely examples and are not intended to limit the present disclosure. Further, among constituent elements in the embodiments, any elements not described in independent claims representing top level concepts of the present disclosure are described as constituent elements constituting a more beneficial embodiment.

Further, the order described above in which steps are executed is for illustrative purposes, and the steps may be in an order other than described above.

Further, a portion of the steps described above may be executed simultaneously (in parallel) with another step.

Further, in order to facilitate understanding of the disclosure, constituent elements in each drawing referenced by description of an embodiment are not necessarily drawn to scale. Further, the present disclosure is not limited to the description of the embodiments, and can be appropriately changed without departing from the scope of the present disclosure.

Further, at least a portion of functions of each embodiment and each modification may be combined.

Further, the present disclosure includes various modifications of the embodiments that are within the scope of ideas conceivable by a person skilled in the art.

It is also possible to achieve at least the following configurations from the foregoing example embodiments, the foregoing modification examples, and the foregoing application examples of the disclosure.

(1) A patterning device performing patterning in manufacture of a display panel in which thin films including an organic film are laminated above a substrate, the patterning device comprising: a chamber having a light transmissive window including a first light transmissive plate through which a laser beam is transmitted, the chamber accommodating a thin film laminated substrate on which a thin film is laminated; a second light transmissive plate through which the laser beam is transmitted, disposed in the chamber between the first light transmissive plate and the thin film laminated substrate at a position spaced away from the thin film laminated substrate; and a laser emitter disposed outside the chamber that emits the laser beam towards the thin film laminated substrate, through the first light transmissive plate and the second light transmissive plate, to irradiate and remove a portion of the thin film.

(2) The patterning device of (1), further comprising an environment adjuster that adjusts an environment in the chamber to a vacuum or inert gas environment.

(3) The patterning device of any one of (1) to (2), wherein the second light transmissive plate is replaceable.

(4) The patterning device of any one of (1) to (3), wherein sizes, shapes, and relative positions of the first light transmissive plate and the second light transmissive plate are set such that, in plan view, locations of the thin film laminated substrate to be laser processed are all included in an area overlapping with light transmissive regions of the first light transmissive plate and the second light transmissive plate.

(5) The patterning device of any one of (1) to (4), wherein both the first light transmissive plate and the second light transmissive plate are parallel to a main surface of the thin film laminated substrate, and the laser emitter emits the laser beam to be perpendicular to a main surface of the first light transmissive plate.

(6) The patterning device of any one of (1) to (5), wherein a distance between the second light transmissive plate and the thin film laminated substrate is set in a range such that a material of the thin film sublimated and scattered by the irradiation of the laser beam comes into contact with the second light transmissive plate, solidifying and adhering thereto, and does not adhere to the thin film laminated substrate.

(7) The patterning device of any of (1) to (6), wherein the thin film laminated substrate includes pixel electrodes and an auxiliary electrode including metal between a substrate and the thin film, the thin film is an organic film laminated on the pixel electrodes and the auxiliary electrode, and the laser emitter scans the laser beam to remove the organic film on the auxiliary electrode in a predefined pattern.

(8) The patterning device of any one of (1) to (7), wherein, between the first light transmissive plate and the second light transmissive plate, at least the first light transmissive plate includes quartz glass.

(9) A patterning method for patterning in manufacture of a display panel in which thin films including an organic film are laminated above a substrate, the patterning method comprising: accommodating a thin film laminated substrate within a chamber having a light transmissive window including a first light transmissive plate through which a laser beam is transmitted, such that a main surface of a side of the thin film laminated substrate on which a thin film is laminated faces the first light transmissive plate; adjusting an environment in the chamber to be a vacuum or inert gas environment; and emitting the laser beam towards the thin film laminated substrate, through the first light transmissive plate, to irradiate and remove a portion of the thin film, wherein in the chamber, between the first light transmissive plate and the thin film laminated substrate, a second light transmissive plate through which the laser beam is transmitted is disposed at a position spaced away from the thin film laminated substrate.

(10) A patterning device performing patterning in manufacture of a display panel in which thin films including an organic film are laminated above a substrate, the patterning device comprising: a chamber having a light transmissive window including a light transmissive plate through which a laser beam is transmitted, the chamber accommodating a thin film laminated substrate such that a main surface of the thin film laminated substrate on which a thin film is laminated faces the light transmissive plate; a laser emitter disposed outside the chamber that emits the laser beam towards the thin film laminated substrate, through the light transmissive plate, to irradiate and remove a portion of the thin film; and a substrate mover that moves the thin film laminated substrate in the chamber, wherein an area of the light transmissive window is smaller than a processing target range of the thin film laminated substrate that undergoes removal processing by the laser beam irradiation, and the substrate mover moves the thin film laminated substrate such that the processing target range can be irradiated by the laser beam via the light transmissive window.

(11) The patterning device of (10), further comprising an environment adjuster that adjusts an environment in the chamber to a vacuum or inert gas environment.

(12) The patterning device of any one of (10) to (11), wherein the light transmissive plate is parallel to the main surface of the thin film laminated substrate, and the laser emitter emits the laser beam to be perpendicular to a main surface of the light transmissive plate.

(13) The patterning device of any one of (10) to (12), wherein the thin film laminated substrate includes pixel electrodes and an auxiliary electrode including metal between a substrate and the thin film, the thin film is an organic film laminated on the pixel electrodes and the auxiliary electrode, and the laser emitter scans the laser beam to remove the organic film on the auxiliary electrode in a predefined pattern.

(14) The patterning device of any one of (10) to (13), wherein the light transmissive plate has a strip shape elongated in a first direction parallel to the main surface of the thin film laminated substrate and the substrate mover moves the thin film laminated substrate in a second direction parallel to the main surface of the thin film laminated substrate and perpendicular to the first direction.

(15) The patterning device of any one of (10) to (14), wherein the light transmissive plate includes quartz glass.

(16) A patterning method for patterning in manufacture of a display panel in which thin films including an organic film are laminated above a substrate, the patterning method comprising: accommodating a thin film laminated substrate within a chamber having a light transmissive window including a light transmissive plate through which a laser beam is transmitted, such that a main surface of a side of the thin film laminated substrate on which a thin film is laminated faces the light transmissive plate; adjusting an environment in the chamber to be a vacuum or inert gas environment; and emitting the laser beam towards the thin film laminated substrate, through the light transmissive plate, to irradiate and remove a portion of the thin film, wherein an area of the light transmissive window is smaller than a processing target range of the thin film laminated substrate that undergoes removal processing by the laser beam irradiation, and in the emitting, the thin film laminated substrate is moved such that the processing target range can be irradiated by the laser beam via the light transmissive plate.

(17) A patterning device performing patterning in manufacture of a display panel in which thin films including an organic film are laminated above a substrate, the patterning device comprising: a chamber having a light transmissive window including a light transmissive plate through which a laser beam is transmitted, the chamber accommodating a thin film laminated substrate on which a thin film is laminated; an environment adjuster that adjusts an environment in the chamber to a vacuum or inert gas environment; a patterning mask disposed in the chamber between the light transmissive plate and the thin film laminated substrate; and a laser emitter disposed outside the chamber that emits the laser beam towards the thin film laminated substrate, through the light transmissive plate and the patterning mask, to irradiate and remove a portion of the thin film.

(18) The patterning device of (17), wherein, in a mask region of the patterning mask, a light shielding thin film is laminated on a light transmissive flat plate substrate that transmits laser light, and a light transmission pattern through which the laser beam is transmitted is formed in the light shielding thin film.

(19) The patterning device of any one of (17) to (18), wherein a distance between the thin film laminated substrate and the patterning mask is from 1 mm to 10 mm

(20) The patterning device of any one of (17) to (19), further comprising a substrate mover that moves the thin film laminated substrate, wherein the light transmissive plate has a strip shape elongated in a first direction parallel to a main surface of the thin film laminated substrate, and the substrate mover moves the thin film laminated substrate in the chamber in a second direction parallel to the main surface of the thin film laminated substrate and perpendicular to the first direction.

(21) The patterning device of (20), wherein, in plan view, all processing target regions of the thin film laminated substrate are included in the mask region of the patterning mask, and the substrate mover moves the thin film laminated substrate and the patterning mask in the second direction while maintaining positions of the thin film laminated substrate and the patterning mask relative to each other.

(22) The patterning device of any one of (20) to (21), wherein the patterning mask is fixed relative to the chamber and the substrate mover moves only the thin film laminated substrate in the second direction.

(23) The patterning device of (22), wherein width of the mask region of the patterning mask in the second direction is smaller than width of the processing region of the thin film laminated substrate in the second direction.

(24) The patterning device of any one of (17) to (23), wherein the laser emitter includes a yttrium aluminum garnet (YAG) laser oscillator.

(25) The patterning device of any one of (17) to (23), wherein the laser emitter includes an excimer laser oscillator.

(26) The patterning device of any one of (17) to (25), wherein the laser emitter includes a galvanoscanner mechanism that deflects the laser beam by a galvanomirror to scan the laser beam at least in the first direction.

(27) The patterning device of any one of (17) to (26), wherein the laser emitter includes a laser head that emits the laser beam and a laser scanner that scans the laser beam by moving the laser head in at least the first direction.

(28) The patterning device of any one of (17) to (27), wherein the light transmissive plate and the patterning mask are parallel to a main surface of the thin film laminated substrate, and the laser emitter emits the laser beam to be perpendicular to a main surface of the light transmissive plate.

(29) The patterning device of any one of (17) to (28), wherein the thin film laminated substrate includes pixel electrodes and an auxiliary electrode including metal between a substrate and the thin film, the thin film is an organic film laminated on the pixel electrodes and the auxiliary electrode, and the laser emitter in cooperation with the patterning mask scans the laser beam relative to the organic film to remove the organic film on the auxiliary electrode in a predefined pattern.

(30) The patterning device of any one of (17) to (29), wherein the light transmissive plate includes quartz glass.

(31) A patterning method for patterning in manufacture of a display panel in which thin films including an organic film are laminated above a substrate, the patterning method comprising: accommodating a thin film laminated substrate within a chamber having a light transmissive window including a light transmissive plate through which a laser beam is transmitted, such that a main surface of a side of the thin film laminated substrate on which a thin film is laminated faces the light transmissive plate; adjusting an environment in the chamber to be a vacuum or inert gas environment; and emitting the laser beam from outside the chamber towards the thin film laminated substrate, through the light transmissive plate and a patterning mask disposed between the light transmissive plate and the thin film laminated substrate, to irradiate and remove a portion of the thin film.

32. A patterning device performing patterning in manufacture of a display panel in which thin films including an organic film are laminated above a substrate, the patterning device comprising: a chamber having a light transmissive window including a light transmissive plate through which a plurality of laser beams are transmitted, the chamber accommodating a thin film laminated substrate such that a main surface of the thin film laminated substrate on which a thin film is laminated faces the light transmissive plate; an environment adjuster that adjusts an environment in the chamber to a vacuum or inert gas environment; and a laser emitter disposed outside the chamber that emits the plurality of laser beams towards the thin film laminated substrate, through the light transmissive plate, to remove a portion of the thin film, wherein the laser emitter comprises: a laser beam source that generates an excimer laser beam; and a mask disposed in a path of the excimer laser beam emitted from the laser beam source, the mask having a plurality of light transmissive portions, wherein transmittance of the excimer laser beam through the plurality of light transmissive portions of the mask results in the plurality of laser beams being emitted from the mask.

(33) The patterning device of (32), wherein the light transmissive plate is parallel to the main surface of the thin film laminated substrate, and the laser emitter emits the plurality of laser beams to be perpendicular to a main surface of the light transmissive plate.

(34) The patterning device of any one of (32) to (33), wherein the thin film laminated substrate includes pixel electrodes and an auxiliary electrode including metal between a substrate and the thin film, the thin film is an organic film laminated on the pixel electrodes and the auxiliary electrode, and the laser emitter scans the plurality of laser beams to remove the organic film on the auxiliary electrode in a predefined pattern.

(35) The patterning device of any one of (32) to (34), further comprising a substrate mover that moves the thin film laminated substrate, wherein the light transmissive plate has a strip shape elongated in a first direction parallel to a main surface of the thin film laminated substrate, and the substrate mover moves the thin film laminated substrate in the chamber in a second direction parallel to the main surface of the thin film laminated substrate and perpendicular to the first direction.

(36) The patterning device of any one of (32) to (35), wherein the light transmissive plate includes quartz glass.

(37) A patterning method for patterning in manufacture of a display panel in which thin films including an organic film are laminated above a substrate, the patterning method comprising: accommodating a thin film laminated substrate within a chamber having a light transmissive window including a light transmissive plate through which a plurality of laser beams are transmitted, such that a main surface of a side of the thin film laminated substrate on which a thin film is laminated faces the light transmissive plate; adjusting an environment in the chamber to be a vacuum or inert gas environment; and emitting, through the light transmissive plate towards the thin film laminated substrate, the plurality of laser beams formed by transmitting an excimer laser beam generated by a laser beam source disposed outside the chamber through a mask having a plurality of light transmitting portions, to remove a portion of the thin film.

(38) A method of manufacturing an organic electroluminescence (EL) display panel, the method comprising: preparing a substrate; forming pixel electrodes and an auxiliary electrode above the substrate, the auxiliary electrode comprising aluminum or aluminum alloy and extending in a row and/or column direction in plan view; forming light emitting layers above the pixel electrodes; forming an organic functional layer above the pixel electrodes and the auxiliary electrode; irradiating the organic functional layer with a laser beam of wavelength from 200 nm to 380 nm to remove a portion of the organic functional layer above the auxiliary electrode to expose a portion of the auxiliary electrode; and forming a common electrode to be continuous above the pixel electrodes and the auxiliary electrode and in contact with the portion of the auxiliary electrode.

(39) The method of (38), wherein, in the forming of the light emitting layers, the light emitting layers are not formed above the auxiliary electrode.

(40) The method of any one of (38) to (39), wherein the laser beam includes third or fourth harmonic of a yttrium aluminum garnet (YAG) laser.

(41) The method of any one of (38) to (40), further comprising forming hole injection layers above the pixel electrodes and the auxiliary electrode and patterning the hole injection layers at the same time as the pixel electrodes and the auxiliary electrode, wherein a portion of the hole injection layer overlapping the portion of the organic functional layer in plan view is removed by irradiation by the laser beam.

(42) The method of any one of (38) to (41), further comprising forming an oxide layer including titanium oxide, indium tin oxide, or indium zinc oxide above the pixel electrodes and the auxiliary electrode and patterning the oxide layer at the same time as the pixel electrodes and the auxiliary electrode, wherein a portion of the oxide layer overlapping the portion of the organic functional layer in plan view is removed by irradiation by the laser beam.

(43) The method of any one of (38) to (42), wherein the irradiating of the organic functional layer is performed in a vacuum environment.

(44) The method of any one of (38) to (43), wherein the pixel electrodes are formed in a matrix of rows and columns, and when each set of three consecutive pixel electrodes in a row direction is referred to as a pixel electrode group, in the forming of the light emitting layers, the light emitting layers are formed such that the light emitting layers above each pixel electrode group each emit a different color of light selected from red, blue, and green, and in the forming of the auxiliary electrode, the auxiliary electrode is formed extending between pixel electrode groups that are adjacent to each other in the row direction.

(45) The method of any one of (38) to (44), wherein, in the forming of the auxiliary electrode, the auxiliary electrode is formed also extending between pixel electrode groups that are adjacent to each other in a column direction.

(46) The method of any one of (44) to (45), wherein, in the irradiating of the portion of the organic functional layer, the portion is a portion of the organic functional layer above the auxiliary electrode and extending to be continuous in a column direction.

(47) The method of any one of (44) to (46), wherein, in the irradiating of the portion of the organic functional layer, the portion is a portion of the organic functional layer above the auxiliary electrode, extending in a column direction, and separated in the column direction from each other portion of the organic functional layer removed by laser beam irradiation.

The invention claimed is:

1. A patterning device performing patterning in manufacture of a display panel in which thin films including an organic film are laminated above a substrate, the patterning device comprising:
a chamber having a light transmissive window including a first light transmissive plate through which a laser beam is transmitted, the chamber accommodating a thin film laminated substrate on which a thin film is laminated;
a second light transmissive plate through which the laser beam is transmitted, disposed in the chamber between the first light transmissive plate and the thin film laminated substrate at a position spaced away from the thin film laminated substrate; and
a laser emitter disposed outside the chamber that emits the laser beam towards the thin film laminated substrate, through the first light transmissive plate and the second light transmissive plate, to irradiate and remove a portion of the thin film, wherein the second light transmissive plate is replaceable.

2. The patterning device of claim 1, further comprising an environment adjuster that adjusts an environment in the chamber to a vacuum or inert gas environment.

3. The patterning device of claim 1, wherein sizes, shapes, and relative positions of the first light transmissive plate and the second light transmissive plate are set such that, in plan view, locations of the thin film laminated substrate to be laser processed are all included in an area overlapping with light transmissive regions of the first light transmissive plate and the second light transmissive plate.

4. The patterning device of claim 1, wherein both the first light transmissive plate and the second light transmissive plate are parallel to a main surface of the thin film laminated substrate, and the laser emitter emits the laser beam to be perpendicular to a main surface of the first light transmissive plate.

5. The patterning device of claim 1, wherein a distance between the second light transmissive plate and the thin film laminated substrate is set in a range such that a material of the thin film sublimated and scattered by the irradiation of the laser beam comes into contact with the second light transmissive plate, solidifying and adhering thereto, and does not adhere to the thin film laminated substrate.

6. The patterning device of claim 1, wherein
the thin film laminated substrate includes pixel electrodes and an auxiliary electrode including metal between a substrate and the thin film,
the thin film is an organic film laminated on the pixel electrodes and the auxiliary electrode, and
the laser emitter scans the laser beam to remove the organic film on the auxiliary electrode in a predefined pattern.

7. The patterning device of claim 1, wherein the first light transmissive plate includes quartz glass.

8. A patterning device performing patterning in manufacture of a display panel in which thin films including an organic film are laminated above a substrate, the patterning device comprising:
a chamber having a plurality of light transmissive windows including a light transmissive plate through which a laser beam is transmitted, the chamber accommodating a thin film laminated substrate such that a main surface of the thin film laminated substrate on which a thin film is laminated faces the light transmissive plate, and the light transmissive plate includes quartz glass;
a laser emitter disposed outside the chamber that emits the laser beam towards the thin film laminated substrate, through the light transmissive plate, to irradiate and remove a portion of the thin film; and
a substrate mover that moves the thin film laminated substrate in the chamber, wherein
an area of each of the plurality of light transmissive windows is smaller than a processing target range of the thin film laminated substrate that undergoes removal processing by the laser beam irradiation, and
the substrate mover moves the thin film laminated substrate such that the processing target range can be irradiated by the laser beam via the light transmissive windows.

9. The patterning device of claim 8, further comprising an environment adjuster that adjusts an environment in the chamber to a vacuum or inert gas environment.

10. The patterning device of claim 8, wherein the light transmissive plate is parallel to the main surface of the thin film laminated substrate, and the laser emitter emits the laser beam to be perpendicular to a main surface of the light transmissive plate.

11. The patterning device of claim 8, wherein
the thin film laminated substrate includes pixel electrodes and an auxiliary electrode including metal between a substrate and the thin film,
the thin film is an organic film laminated on the pixel electrodes and the auxiliary electrode, and
the laser emitter scans the laser beam to remove the organic film on the auxiliary electrode in a predefined pattern.

12. The patterning device of claim 8, wherein the light transmissive plate has a strip shape elongated in a first direction parallel to the main surface of the thin film laminated substrate and the substrate mover moves the thin film laminated substrate in a second direction parallel to the main surface of the thin film laminated substrate and perpendicular to the first direction.

13. A patterning device performing patterning in manufacture of a display panel in which thin films including an organic film are laminated above a substrate, the patterning device comprising:
a chamber having a light transmissive window including a light transmissive plate through which a laser beam is transmitted, the chamber accommodating a thin film laminated substrate on which a thin film is laminated;
an environment adjuster that adjusts an environment in the chamber to a vacuum or inert gas environment;
a patterning mask disposed in the chamber between the light transmissive plate and the thin film laminated substrate; and
a laser emitter disposed outside the chamber that emits the laser beam towards the thin film laminated substrate, through the light transmissive plate and the patterning mask, to irradiate and remove a portion of the thin film, wherein, in a mask region of the patterning mask, a light shielding thin film is laminated on a light transmissive flat plate substrate that transmits laser light, and a light transmission pattern through which the laser beam is transmitted is formed in the light shielding thin film.

14. The patterning device of claim 13, wherein a distance between the thin film laminated substrate and the patterning mask is from 1 mm to 10 mm.

15. The patterning device of claim 13, further comprising
a substrate mover that moves the thin film laminated substrate, wherein
the light transmissive plate has a strip shape elongated in a first direction parallel to a main surface of the thin film laminated substrate, and
the substrate mover moves the thin film laminated substrate in the chamber in a second direction parallel to the main surface of the thin film laminated substrate and perpendicular to the first direction.

16. The patterning device of claim 15, wherein, in plan view, all processing target regions of the thin film laminated substrate are included in the mask region of the patterning mask, and the substrate mover moves the thin film laminated substrate and the patterning mask in the second direction while maintaining positions of the thin film laminated substrate and the patterning mask relative to each other.

17. The patterning device of claim 15, wherein the patterning mask is fixed relative to the chamber and the substrate mover moves only the thin film laminated substrate in the second direction.

18. The patterning device of claim 17, wherein width of the mask region of the patterning mask in the second direction is smaller than width of the processing region of the thin film laminated substrate in the second direction.

19. The patterning device of claim 13 wherein the laser emitter includes a yttrium aluminum garnet (YAG) laser oscillator.

20. The patterning device of claim 13, wherein the laser emitter includes an excimer laser oscillator.

21. The patterning device of claim 13, wherein the laser emitter includes a galvanoscanner mechanism that deflects the laser beam by a galvanomirror to scan the laser beam at least in the first direction.

22. The patterning device of claim 13, wherein the laser emitter includes a laser head that emits the laser beam and a laser scanner that scans the laser beam by moving the laser head in at least the first direction.

23. The patterning device of claim 22, wherein the light transmissive plate and the patterning mask are parallel to a main surface of the thin film laminated substrate, and the laser emitter emits the laser beam to be perpendicular to a main surface of the light transmissive plate.

24. The patterning device of claim 13, wherein
the thin film laminated substrate includes pixel electrodes and an auxiliary electrode including metal between a substrate and the thin film,
the thin film is an organic film laminated on the pixel electrodes and the auxiliary electrode, and
the laser emitter in cooperation with the patterning mask scans the laser beam relative to the organic film to remove the organic film on the auxiliary electrode in a predefined pattern.

25. The patterning device of claim 13, wherein the light transmissive plate includes quartz glass.

26. A patterning device performing patterning in manufacture of a display panel in which thin films including an organic film are laminated above a substrate, the patterning device comprising:
a chamber having a light transmissive window including a light transmissive plate through which a plurality of laser beams are transmitted, the chamber accommodating a thin film laminated substrate such that a main surface of the thin film laminated substrate on which a thin film is laminated faces the light transmissive plate;
an environment adjuster that adjusts an environment in the chamber to a vacuum or inert gas environment; and
a laser emitter disposed outside the chamber that emits the plurality of laser beams towards the thin film laminated substrate, through the light transmissive plate, to remove a portion of the thin film, wherein
the laser emitter comprises:
a laser beam source that generates an excimer laser beam; and
a mask disposed in a path of the excimer laser beam emitted from the laser beam source, the mask having a plurality of light transmissive portions, wherein
transmittance of the excimer laser beam through the plurality of light transmissive portions of the mask results in the plurality of laser beams being emitted from the mask.

27. The patterning device of claim 26, wherein the light transmissive plate is parallel to the main surface of the thin film laminated substrate, and the laser emitter emits the plurality of laser beams to be perpendicular to a main surface of the light transmissive plate.

28. The patterning device of claim 26, wherein
the thin film laminated substrate includes pixel electrodes and an auxiliary electrode including metal between a substrate and the thin film,
the thin film is an organic film laminated on the pixel electrodes and the auxiliary electrode, and
the laser emitter scans the plurality of laser beams to remove the organic film on the auxiliary electrode in a predefined pattern.

29. The patterning device of claim 26, further comprising a substrate mover that moves the thin film laminated substrate, wherein
the light transmissive plate has a strip shape elongated in a first direction parallel to a main surface of the thin film laminated substrate, and
the substrate mover moves the thin film laminated substrate in the chamber in a second direction parallel to the main surface of the thin film laminated substrate and perpendicular to the first direction.

30. The patterning device of claim 26, wherein the light transmissive plate includes quartz glass.

\* \* \* \* \*